United States Patent [19]

Robinson et al.

[11] Patent Number: 5,524,244

[45] Date of Patent: Jun. 4, 1996

[54] SYSTEM FOR DIVIDING PROCESSING TASKS INTO SIGNAL PROCESSOR AND DECISION-MAKING MICROPROCESSOR INTERFACING THEREWITH

[75] Inventors: Jeffrey I. Robinson, New Fairfield; Keith Rouse, New Milford, both of Conn.; Andrew J. Krassowski, San Jose, Calif.; Terry F. Montlick, Bethlehem, Conn.

[73] Assignee: Logic Devices, Inc., Sunnyvale, Calif.

[21] Appl. No.: 196,389

[22] Filed: Feb. 15, 1994

Related U.S. Application Data

[63] Continuation of Ser. No. 776,161, Oct. 15, 1991, Pat. No. 5,287,511, and a continuation-in-part of Ser. No. 217,616, Jul. 11, 1988, Ser. No. 474,742, Jul. 10, 1989, Ser. No. 525,977, May 18, 1990, Ser. No. 583,508, Sep. 17, 1990, and Ser. No. 663,395, Mar. 1, 1991.

[51] Int. Cl.$^6$ ........................................................ G06F 9/44
[52] U.S. Cl. .................................... 395/700; 364/DIG. 1; 364/280; 364/280.4
[58] Field of Search ..................................... 395/700, 650; 364/DIG. 1, 280.4

[56] References Cited

U.S. PATENT DOCUMENTS

| | | | |
|---|---|---|---|
| 4,724,521 | 2/1988 | Carron et al. | 364/300 |
| 4,750,116 | 6/1988 | Pham et al. | 364/200 |
| 4,972,314 | 11/1990 | Getzinger et al. | 364/200 |
| 5,151,984 | 9/1992 | Newman et al. | 395/500 |
| 5,287,511 | 2/1994 | Robinson et al. | 395/700 |

*Primary Examiner*—Kevin A. Kriess
*Attorney, Agent, or Firm*—David P. Gordon

[57] ABSTRACT

Architectures and methods are provided for efficiently dividing a processing task into tasks for a programmable real time signal processor (SPROC) and tasks for a decision-making microprocessor. The SPROC is provided with a non-interrupt structure where data flow is through a multiported central memory. The SPROC is also programmed in an environment which requires nothing more than graphic entry of a block diagram of the user's design. In automatically implementing the block diagram into silicon, the SPROC programming/development environment accounts for and provides software connection and interfaces with a host microprocessor. The programming environment preferably includes: a high-level computer screen entry system which permits choosing, entry, parameterization, and connection of a plurality of functional blocks; a functional block cell library which provides source code representing the functional blocks; and a signal processor scheduler/compiler which uses the functional block cell library and the information entered into the high-level entry system to compile a program and to output source program code for a program memory and source data code for the data memory of the (SPROC), as well as a symbol table which provides a memory map which maps SPROC addresses to variable names which the microprocessor will refer to in separately compiling its program.

8 Claims, 13 Drawing Sheets

FIG. 2

| 50 MHz | | | | | | |
|---|---|---|---|---|---|---|
| CYCLE | | 1 | 2 | 3 | 4 | 5 |
| gsp 1 | | p-rd | | d-rd/wr (p-wr) BOOT MODE | | |
| gsp 2 | | | p-rd | | d-rd/wr | |
| gsp 3 | | | | p-rd | | d-rd/wr |
| gsp 4 | | d-rd/wr | | | p-rd | |
| HOST/ ACCESSPORT/ SERIAL INPUTS/ SERIAL OUTPUTS/ da INPUT/ da OUTPUT | | | d-rd/wr d-rd/wr d-wr d-rd d-wr d-rd | | | p-rd/wr p-rd/wr |

SYSTEM FOR DIVIDING PROCESSING TASKS INTO SIGNAL PROCESSOR AND DECISION-MAKING MICROPROCESSOR INTERFACING THEREWITH

RELATED PATENT APPLICATIONS

This application is a continuation of application Ser. No. 07/776,161 filed on Oct. 15, 1991, and issued as U.S. Pat. No. 5,287,511 on Feb. 15, 1994, the complete disclosure of which is incorporated herein by reference.

This is a continuation-in-part of Ser. No. 07/217,616 filed Jul. 11, 1988 which is hereby incorporated by reference in its entirety herein.

This is a continuation-in-part of Ser. No. 07/474,742 (also PCT/US89/02986) filed Jul. 10, 1989 which is hereby incorporated by reference in its entirety herein.

This is a continuation-in-part of Ser. No. 07/525,977 filed May 18, 1990 which is hereby incorporated by reference in its entirety herein.

This is a continuation-in-part of Ser. No. 07/583,508 filed Sep. 17, 1990 which is hereby incorporated by reference in its entirety herein.

This is a continuation-in-part of Ser. No. 07/663,395 filed Mar. 1, 1991 which is hereby incorporated by reference in its entirety herein.

Index of Contents
Related Patent Applications
Background of the Invention
1. Field of the Invention
2. State of the Art
Summary of the Invention
Brief Description of the Drawings Detailed Description of the Preferred Embodiments
 A. The Signal Processor (SPROC)
 A.1 Functional description of The Parallel Port
 A.2 Master SPROC Chip Read from Slave SPROC Chip or Peripheral
 A.3 Master SPROC Chip Write to Slave SPROC Chip or Peripheral
 A.4 Read from Slave SPROC Chip by an External Controller
 A.5 Write to Slave SPROC Chip by an External Controller
 A.6 Data Transfer Modes
 A.7 Boot Mode
 A.8 Watchdog Timer
 A.9 Multiple I/O Lockout
 A.10 Input/Output Flags and Lines
 A.11 Parallel Port Registers
 B. SPROC Development and Software
 B.1 Overview
 B.1.1 The SPROCcells Function Library
 B.2 Entering a Diagram
 B.3 Defining a Filter
 B.4 Defining a Transfer Function
 B.5 Convening a Block Diagram
 B.6 The MakeSDL Module
 B.7 The Schedule Module
 B.8 The MakeLoad Module
 B.9 Loading and Running a Design
 B.10 Using the Micro Keyword
 B.11 Using a Listing File
 B.12 Using Subroutines
 B.13 Using Time Zones
 B.14 Summary
 C. SPROC Description Language
 C.1 Overview of SDL
 C.2 Compiling SDL Files
 C.3 Concepts and Definitions
 C.4 Rules for Creating Asmblocks
 C.5 Asmblock Structure
 C.6 SPROC Chip Architecture, Instructions and Registers
 D. The SPROC Compiler
 E. The Microprocessor
 E.1 SPROClink Microprocessor Interface
 E.2 SMI Components
 E.3 The Development Process
 E.4 Input Requirements
 E.5 Signal Processing Design Considerations
 E.6 Embedded System Development Considerations
 E.7 Using the SPROC Configuration File
 E.8 Using the Symbol Translator
 E.9 Using the SPROC C Function Library
 E.10 Accessing SPROC Chip Memory Values
 F. Low Frequency Impedance Analyzer Example
Claims
Abstract of the Disclosure

BACKGROUND OF THE INVENTION

1. Field of the Invention

The present invention generally relates to programmable real time signal processor devices and methods utilizing such devices. More particularly, the present invention relates to architectures and methods for efficiently dividing a processing task into tasks for a real time signal processor and tasks for a decision-making microprocessor, wherein the real time signal processor is programmable in an environment which accounts for and provides software connection and interfaces with a host microprocessor.

2. State of the Art

Digital signal processing has evolved from being an expensive, esoteric science used primarily in military applications such as radar systems, image recognition, and the like, to a high growth technology which is used in consumer products such as digital audio and the compact disk. Single chip digital signal processors (SCDSPs) were introduced in the early 1980's to specifically address these markets. However, SCDSPs are complex to design and use, and have significant performance limitations. In particular, SCDSPs are limited to a frequency spectrum from DC to the low tens of KHz. Moreover, most SCDSPs have other development environment and hardware performance problems which stem from their Von Neuman, microprocessor origins. In an attempt to overcome these limitations, attempts have been made to use parallel processors and math coprocessors. However, these "solutions" have required considerable expertise on the part of the software engineer and have typically yielded minimal gain; particularly in the real-time environment.

Generic signal processing based products can be segmented as shown in FIG. 1 and described as follows: analog input/output (I/O), and A/D and/or D/A conversion; signal conditioning and processing; sample rate decision processing; and logic, decision, and control processing. The analog interface (I/O) typically performs preamplification and anti-alias filtering prior to A/D conversion in the input direction, as well as D/A conversion, reconstitution filtering, and power amplification in the output direction. The signal conditioning and processing circuitry conducts precision signal processing functions such as filtering, amplification, rectification, etc., as well as fast Fourier transforms and the like. The sample rate decision circuitry includes window comparators, quantizers, companders, expanders, etc. which make simple logic decisions on each and every sample forwarded to it. Finally, the logic, decision, and control processing circuitry in the incoming direction uses the signals emerging from the signal conditioning and processing and the sample rate decision processing circuitry, and makes decisions to control external equipment in some useful manner. In order to control the external equipment, in the outgoing direction, the logic, decision, and control processing circuitry generates signals which require further signal processing to drive or interact with some analog device or equipment. In making decisions, the logic, decision, and control processing circuitry typically utilizes highly data dependent code which runs asynchronously from the signals it utilizes. Examples of such circuitry include speech and image recognition algorithms, disk drive controllers, speech generation algorithms, numerically controlled machine tool controllers, etc.

Based on the above break-down of tasks it can be seen that SCDSPs are called upon to do both of what may be termed "signal processing" and "logic processing". Signal processing is typically computationally intensive, requires low latency and low parasitic overhead for real time I/O, must efficiently execute multiple asynchronous deterministic processes, and be controllable. Real time signal processors are typically controllable processors which have very large I/O bandwidths, are required to conduct many millions of computations per second, and can conduct several processing functions in parallel. In contrast to signal processing, logic processing is usually memory intensive (as opposed to computationally intensive), must efficiently handle multiple interrupts (particularly in a multiprocessor system), and acts as a controller (as opposed to being controllable). A common type of logic processor is the microprocessor which relies on extensive decision oriented software to conduct its processes. This software is typically written in a high level language such as "C". The code often contains numerous "if ... then ... else" like constructs which can result in highly variable execution times which are readily dealt with in non-real time applications, but present highly problematical scheduling problems for efficient real time systems.

Comparing the signal and logic processing requirements, it is seen that they are far from similar. Nevertheless, depending upon the circumstances, it is common for logic processors to be called upon to do signal processing, and vice versa. Since the microprocessor an is the older and more developed art, it is not surprising that the architectures of many DSPs have broadly borrowed from the architectures of the microprocessors. Thus, DSPs are often constructed as controllers having an interrupt structure. This type of architecture, however, is not properly suited for the primary functions of digital signal processing.

SUMMARY OF THE INVENTION

It is therefore the primary object of the invention to provide architectures and methods for efficiently dividing a processing task into tasks for a real time signal processor and tasks for a decision-making host microprocessor, wherein the real time signal processor is programmable in an environment which accounts for and provides connection and interfaces with the host microprocessor.

It is another object of the invention to provide a programmable, configurable, real time signal processor which is particularly suited to the requirements of signal processing and which conducts deterministic real time signal processing and interfaces with a microprocessor which conducts logic processing.

It is a further object of the invention to provide a graphic user interface system for a real time signal processor interfacing with a host microprocessor where the real time signal processor program is compiled separately from the program of the microprocessor but, as part of the compiling procedure provides a microprocessor-related file to the microprocessor which then translates the file and incorporates the translated file into its compilation, and thereby automatically provides for the signal processor—microprocessor interface.

Yet another object of the invention is to provide a user interface system incorporating a real time signal processor and a microprocessor which automatically share processing tasks in an efficient manner and which automatically compile and interface to accomplish the desired processing task.

In accord with the objects of the invention a development system for the microprocessor-interfacing signal processor is provided. For purposes of clarity and simplicity, the signal processor which interfaces with the microprocessor is referred to hereinafter as a SPROC (a trademark of the assignee hereof). Details of the SPROC are set forth in parent application 07/525,977. The development system (hereinafter referred to as SPROClab—a trademark of the assignee hereof) which is provided to permit a user to simply program and use the SPROC generally includes:

a high-level computer screen entry system (graphic user interface) which permits choosing, entry, parameterization, and connection of a plurality of functional blocks;

a functional block library which provides source code representing the functional blocks; and a signal processor compiler for incorporating the parameters of the functional blocks as variables into the functional block library code and for compiling the library code as well as other code which accounts for scheduling and functional block connection matters, etc., whereby the signal processor compiler outputs source program code for a program memory of the signal processor (SPROC), source data code for the data memory of the SPROC, and a symbol table which provides a memory map which maps variable names which the microprocessor will refer to in separately compiling its program to SPROC addresses.

Besides the symbol table which is used by the microprocessor for interfacing with the SPROC, the SPROClab preferably provides means for generating a boot file which is compatible for storage in the microprocessor and which is provided by the microprocessor to the SPROC in order to boot up the SPROC. In this manner, the microprocessor can act as the host for the SPROC.

With the signal processing and logic processing aspects of tasks being divided (with the SPROC handling the signal processing, and the microprocessor handling the logic processing), the compiling of the SPROC and the microprocessor are handled separately. In order to accomplish the separate handling while still providing the graphic entry system, at least two schemes are provided. A first scheme effectively provides graphic entry for the signal processing circuit only. If desired, in the first scheme limited graphic entry for the microprocessor can be used to provide SPROC interfaces with the microprocessor (as shown in FIG. 10). With the first scheme, the user must provide suitable code for the microprocessor separately, and the symbol table generated by the SPROClab compiler is provided together with the code hand-generated by the user for microprocessor compiling. A second scheme permits graphic entry for both the signal processing and logic processing (microprocessor) circuits, and uses any of several methods for distinguishing between the two. Among the methods for distinguishing between which portion of the circuit is intended for signal processing and which for logic processing are: user entry (e.g., defining a block as block.spr or block.mic); hierarchical block entry which is programmed to allow entry of both logic processing and signal processing blocks; and the sample rate of the block (with slow sampling rates being handled by the microprocessor). Of course, if all blocks are predefined (i.e., are contained in a library), the precoded library code divides the code into code intended for the SPROC and code intended for the microprocessor. Regardless, where graphic entry for both signal processing and logic processing is permitted, the graphic entry eventually results in separate automatic compilation for both the SPROC and the microprocessor, with the SPROClab compiler again providing the necessary symbol table for incorporation during compilation of the microprocessor code.

Additional objects and advantages of the invention will become apparent to those skilled in the art upon reference to the detailed description taken in conjunction with the provided figures.

BRIEF DESCRIPTION OF THE DRAWINGS

FIG. 2 is a timing diagram of the access of the various components and ports of the SPROC to the data RAM of the SPROC;

DETAILED DESCRIPTION OF THE PREFERRED EMBODIMENTS

A. The Signal Processor (SPROC)

Figure 1:
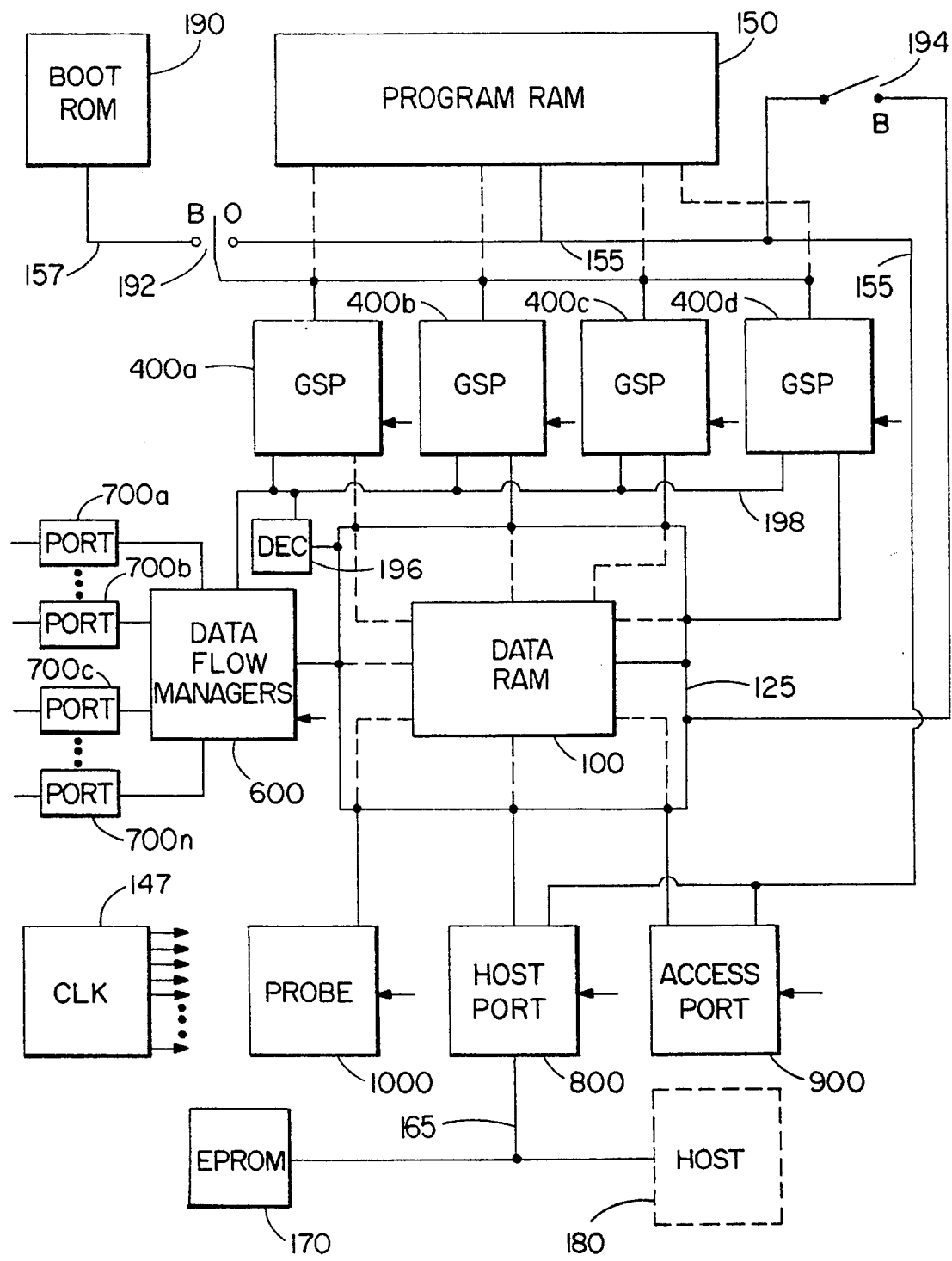
FIG. 1 is a high level block diagram of the SPROC device of the invention, and its connection to an external host or memory.

A high level block diagram of the preferred SPROC subsystem 10 of the invention is seen in FIG. 1. The preferred SPROC 10 preferably includes: a central "multiported" (as broadly understood) data RAM 100 accessed via data RAM bus 125; a multiported program RAM 150 accessed via program RAM bus 155; a plurality of internal processors (GSP) 400 coupled to the data RAM bus 125 and the program RAM bus 155 and which perform general processing functions; a data flow manager (DFM) 600 which is coupled to the data RAM bus 125 and which generally controls the flow of data into and out of the SPROC and relieves the GSPs from dealing with that data flow; a plurality of serial data ports 700 coupled to the DFM 600; a host port 800 coupled to both the data RAM bus 125 and the program RAM bus 155, the host port serving to couple the SPROC via the host bus 165 to either an EPROM 170 in stand-alone mode or to a host processor 180 in host mode; an access port 900 coupled to both the data RAM bus 125 and the program RAM bus 155; a probe 1000 coupled to the data RAM bus 125; and an internal boot ROM 190 with boot ROM bus 157 coupled via switch 192 to a GSP 400, the boot ROM 190 being used to control a master SPROC 10 in start-up mode, as well as to control the GSPs 400 of a SPROC 10 when the GSPs are in break mode; and a flag generating decoder 196 coupled via flag bus 198 to the DFM 600 and the GSPs 400 for flagging the DFM and GSPs when particular addresses of the data RAM 100 are being addressed (as determined by values on the data RAM bus 125).

The SPROC 10 of the invention can function in several different modes, some of which are determined by externally set pins (not shown). In particular, the SPROC 10 has a boot mode, an operational mode, and a development mode which includes a "break" mode. In addition, the SPROC may be a master SPROC or a slave SPROC which is either coupled to a master SPROC (see FIG. 9) or a host 180 such as a microprocessor. In the boot mode (powering up), where the SPROC 10 is a master, the SPROC 10 is required to program both itself and any other slave SPROCs which might be part of the system. To do that, upon power up, switches 192 and 194 are toggled to connect to the B (boot) nodes. With switches 192 and 194 so set, the boot ROM is coupled to a GSP 400 such as GSP 400a, and the program RAM 150 is coupled to the data RAM bus 125. As boot ROM 190 is coupled to the GSP 400a, the GSP 400a is able to read the boot code in boot ROM 190. The code is arranged to cause the GSP to seize control of the host port 800 and to load information into the SPROC from EPROM 170 via the host port 800. The information contained in EPROM 170 includes the program code for the program RAM 150 (which is sent via data RAM bus 125), configuration information for the DFM 600 and the serial, host, and access ports 700, 800, 900, and parameter information including initialization information for the data RAM 100. This information, which was compiled by the development system of the invention (as discussed in more detail hereinafter) and stored in the EPROM, causes the SPROC to perform the desired functions on data typically received via serial ports 700.

In boot mode, after the master SPROC is programmed, the remaining (slave) SPROCs of the system (see FIG. 9) are programmed by having the master SPROC 10 read the EPROM 170 and forward the information via the common host bus 165 to the other SPROCs which reside in different address spaces. The slave SPROCs do not require a boot ROM for boot mode purposes, although the boot ROM 190 is also used to control the break mode operation of the SPROC (as described with reference to FIG. 4).

After initialization is completed, boot mode is exited by the writing of a predetermined value (f0H) to a predetermined memory address (0401H) which causes switch 192 to toggle to node O (operation), and switch 194 to toggle to an open position. Then the SPROC is ready to operate for its intended signal processing purposes.

Although slave SPROCs may be programmed in boot mode by a master SPROC, a slave SPROC may also be programmed by a microprocessor host such as host 180 of FIG. 1. In slave mode where a host such as host 180 is coupled to the host bus 165, the internal boot ROM 190 is not active. In fact, switches 192 and 194 are set in the operating mode position. In order to program the SPROC, the host 180 preferably utilizes the host bus 165 and sends program data via host port 800, and program RAM bus 155 to the program RAM, and data RAM data via host port 800 and the data RAM bus 125 to the data RAM. Configuration information for the serial ports 700 and data flow manager 600, is sent by the host 180 via host port 800 and the data RAM bus 125 as hereinafter described. As will be described hereinafter with reference to the development system (SPROClab), where a microprocessor is the host for a SPROC, the program, data, and configuration information is typically generated by SPROClab in a microprocessor readable and storable format.

In operational mode, serial data flow into and out of the SPROC 10 is primarily through the serial ports 700, while parallel data flows through the host port 800. Serial data which is to be processed is sent into an input port 700 which is coupled to the data flow manager 600, which in turn forwards the data to appropriate locations (buffers) in the data RAM 100. In certain circumstances, described below, the DFM 600 will also write additional information to particular data RAM locations which are monitored by flag generating decoder 196. Decoder 196, in turn, causes the flags to be triggered over trigger or flag bus 198 as described in detail in previously incorporated U.S. Ser. No. 07/583,508. Other flags are triggered by pulsing hardware pins (not shown) via lines called "compute lines". The hardware pins are particularly useful in providing external timing information to the GSPs 400 and the DFM 600 of the SPROC.

Once the data has been sent to the data RAM 100, and typically after the GSPs 400 have been apprised via the flag bus 198 of the arrival of the information, the GSPs 400 can process the data. The processing of the data is conducted in accord with one or more programs stored in the multiported program RAM 150 which in turn represents the functions, topology, and parameters of a schematic diagram generated by the user of the development system. In processing the data, the GSPs 400 can read from and write to the data RAM 100. However, in order to shield the GSPs from I/O functions which would interrupt and burden the GSPs, the GSPs do not address each other directly, and do not read from or write to the DFM 600 or the input or output serial ports 700. Similarly, the GSPs do not have direct access to the host port 800 or the access port 900. Thus, in order for the processed data to be output from the SPROC 10, the processed data must be sent by the GSP 400 to the data RAM 100. The data in the data RAM is then either read by the DFM 600 and sent out serially via an output port 700, or is sent out over the host bus 165 in a parallel form via the host port 800.

The development mode of the SPROC device (which will be discussed in more detail hereinafter with reference to the development system) is used prior to the final programming of the EPROM 170 and is basically utilized in conjunction with a host 180. The development mode permits a user to easily and advantageously develop an integrated circuit signal processor by permitting the user access to the internals of the SPROC device. For example, if during a test operational mode it is desirable to obtain a data "dump" of the registers of the GSPs, the GSPs 400 can be put into break mode by causing a GSP to write to memory address 406H. As a result of writing to that address, a decoder (not shown) causes switch 192 to toggle, and instructions from the break section of the boot ROM 190 are used by the GSP 400 via bus 157. While boot ROM 190 is coupled to the GSP 400 in this manner, the GSP runs a routine which causes each register of the GSP to dump its contents to predetermined locations in the data RAM 100. That data may then be accessed by the user and changed if desired via the access port 900 or host port 800. Then, the break section of boot ROM 190 reloads the data into the GSP, writes to memory address 407H, and another decoder (not shown) causes switch 192 to toggle again such that the program RAM 150 is coupled to GSP 400, and the program continues.

Other tools useful in the development mode of the SPROC device are the access port 900 and the probe 1000. The access port permits the user to make changes to the program held in program RAM 150, and/or changes to parameters stored in the program RAM 150 or the data RAM 100 while the SPROC is operating. The probe 1000, which is described in greater detail in previously incorporated U.S. Ser. No. 07/663,395 permits the user to see internal signals generated by the SPROC in analog or digital form by monitoring the values of data written to any particular data RAM location. By using the access port 900 and the probe 1000 together, the effect of a change of a parameter value entered via the access port 900 may be immediately monitored by probe 1000.

Before turning to the details of each of the blocks which comprise FIG. 1, it should be appreciated that central to functioning of the SPROC is a multiported data RAM 100 and a multiported program RAM 150. As aforementioned, the RAMs may either be multiported by time division multiplexing a single access to the RAMs (as seen by the solid lines of FIG. 1) or by providing true multiported RAMs (as suggested by the dashed lines of FIG. 1). As indicated in FIG. 2, in the preferred embodiment hereof, access to the program RAM 150 by the GSPs 400 and the host port 800 and access port 900 is via time division multiplexing of a single input. Similarly, access to the data RAM 100 by the GSPs 400, the DFM 600, the host port 800, the access port 900, and the probe 1000 is also via time division multiplexing of a single input.

As seen in FIG. 2, in the preferred embodiment of the invention, there are five principle time slots of the basic 50 MHz SPROC clock 147 (shown in FIG. 1): one for each GSP; and one shared by all of the other blocks of the SPROC. Each GSP 400 is able to read from the program RAM (p-rd) once over five clock cycles, effectively providing each GSP with a 10 MHz access to the program RAM 150. In the fifth clock cycle, the host is given preferred access to either read from or write to the program RAM. If the host does not need to read or write to the program RAM, the access port is given access. Alternatively, the host and access ports can be given 50/50 access to the fifth time slot by additional time division multiplexing.

In the boot mode, only one GSP of the SPROC (e.g. GSP 400a) accesses the boot ROM 190. Because boot mode is used to program the program RAM 150 with program data from EPROM 170, the program RAM bus 155 must be used by the GSP 400a for writing to the program RAM 150 (via data RAM bus 125 and switch 194). Thus, a program RAM write (p-wr) is provided as shown in FIG. 2 to allow for this situation (as previously discussed with reference to FIG. 1).

The data RAM 100 is similarly multiported via time division multiplexing. As indicated in FIG. 2, each GSP 400 is given a single time slot to either read or write from the data RAM 100. The fifth time slot (time slot 2) is subdivided in time as follows: 50% for the host interface; and the remaining fifty percent equally divided among the access port 900, each of eight sections of the DFM 600 relating to eight serial ports 700, and the probe 1000.

The RAMs 100 and 150 of the invention are preferably separate RAM devices and do not share memory space. For example, the program RAM 150 is preferably a 1K by 24 bit RAM which is assigned address locations 0000 to 03ff Hex. The data RAM 100, on the other hand is preferably a 3K by 24 bit data RAM with primary data RAM space of 2K assigned address 0800 to 0fff Hex, and auxiliary register based space of 1K assigned addresses 0400 to 07ff Hex. Of the primary data RAM addresses, addresses 0800 through 0813 Hex relate to the trigger bus flags as is discussed hereinafter, while addresses 0814 through 0fff are used as data buffers, scratch pad locations, etc. Of the auxiliary space, certain addresses are used as follows:

| | |
|---|---|
| 0401H | Exit boot mode (write f0H) (generate GSP hard reset) |
| 0405H | Serial port reset (write) |
| 0406H | Global break entry (write) (generate GSP soft reset) |
| 0407H | Global break exit (write) (generate GSP soft reset) |
| 0408H | GSP1 break entry (write) (generate GSP soft reset) |
| 0409H | GSP2 break entry (write) (generate GSP soft reset) |
| 040aH | GSP3 break entry (write) (generate GSP soft reset) |
| 040bH | GSP4 break entry (write) (generate GSP soft reset) |
| 040cH | GSP1 break exit (write) (generate GSP soft reset) |
| 040dH | GSP2 break exit (write) (generate GSP soft reset) |
| 040eH | GSP3 break exit (write) (generate GSP soft reset) |
| 040fH | GSP4 break exit (write) (generate GSP soft reset) |
| 0410H | Serial Port 1 internal clock rate select (write 00 = CK/2048) (write 01 = CK/1024) (write 02 = CK/512) (write 03 = CK/256) (write 04 = CK/128) (write 05 = CK/64) (write 06 = CK/32) (write 07 = CK/16) where CK is the SPROC clock (50 MHz) |
| 0411H | Serial Port 2 internal clock rate select |
| 0412H | Serial Port 3 internal clock rate select |
| 0413H | Serial Port 4 internal clock rate select |
| 0414H | Serial Port 5 internal clock rate select |
| 0415H | Serial Port 6 internal clock rate select |
| 0416H | Serial Port 7 internal clock rate select |
| 0417H | Serial Port 8 internal clock rate select |
| 0440H to 0447H | Serial Port 1 (pradd = 0800H) |
| 0448H to 044fH | Serial Port 2 (pradd = 0801H) |
| 0450H to 0457H | Serial Port 3 (pradd = 0802H) |
| 0458H to 045fH | Serial Port 4 (pradd = 0803H) |
| 0460H to 0467H | Serial Port 5 (pradd = 0804H) |
| 0468H to 046fH | Serial Port 6 (pradd = 0805H) |
| 0470H to 0477H | Serial Port 7 (pradd = 0806H) |
| 0478H to 047fH | Serial Port 8 (pradd = 0807H) |
| 0480H to 0487H | DAC (probe) input port (pradd = 0808H) |
| 0488H to 048fH | DAC (probe) serial output port |
| 04fcH to 04ffH | Host interface registers |

Memory locations 1000 to ffff Hex refers to external address space (e.g. slave SPROCs, other devices, or memory).

Of the auxiliary memory locations in the data RAM 100, it should be noted that each GSP is given a break entry and break exit data address. While the embodiment of FIG. 1 causes bus 155 to be connected to the boot/break ROM 190 when a break is implemented such that all GSPs must break together, different circuitry would allow for individual GSP breaks.

The eight twenty-four bit locations provided for each serial port are used to configure the serial ports as well as the DFM section associated with each serial port as hereinafter described. Similarly, the eight words of memory assigned the input and output ports of the probe are used to configure the probe, while the eight words of memory assigned the host port are used to configure the host port as described hereinafter.

Further, with regard to the memory locations, it is noted that when information is written to any of the serial port locations indicated, another address (pradd), which turns out to be a trigger flag address is generated by the DFM 600 (as discussed in more detail hereinafter) and written to the data RAM bus 125. The writing of particular addresses to the data RAM bus 125 is monitored by decoder 196 which is discussed in more detail in Ser. No. 07/583,508.

Figure 3A:
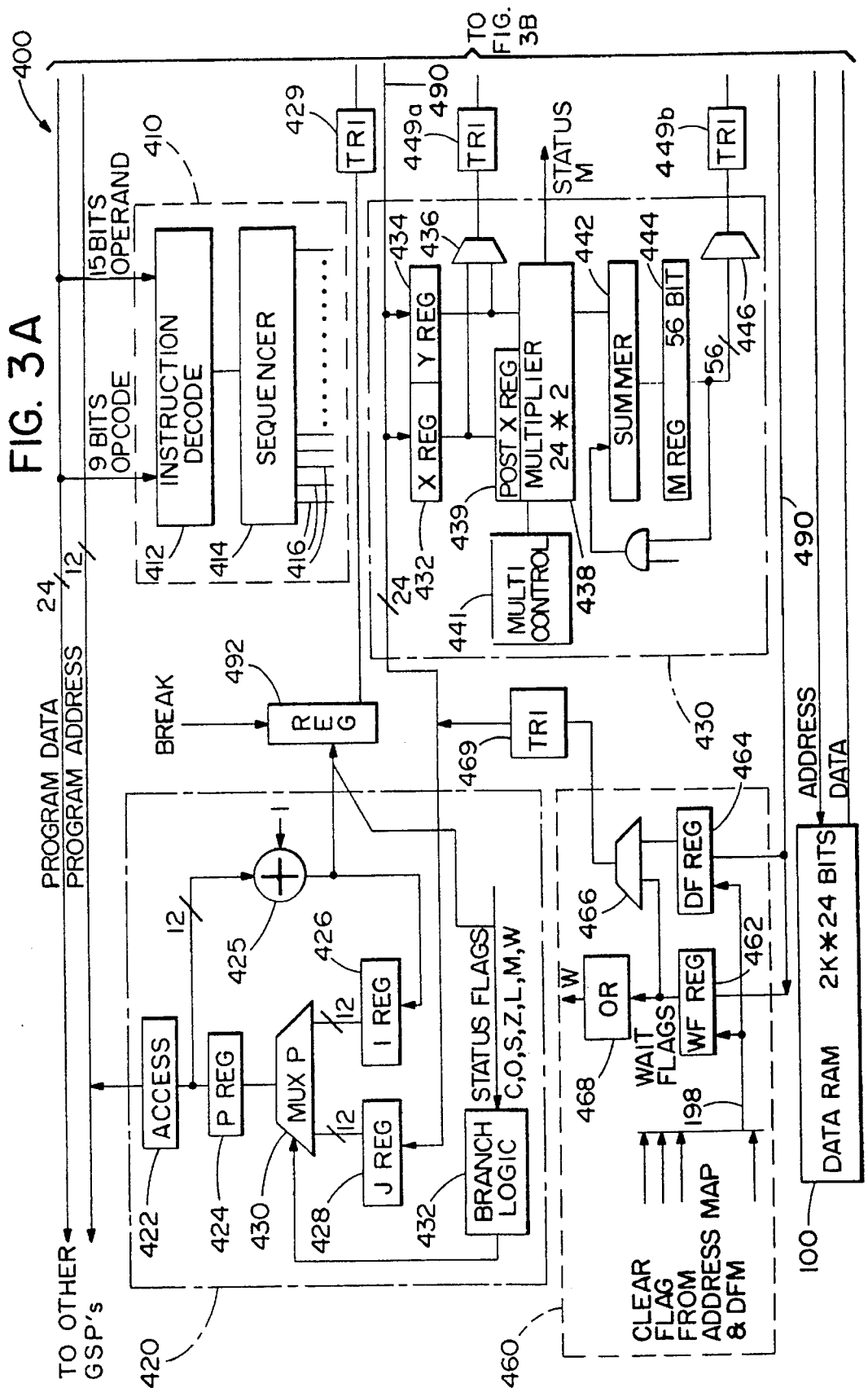
FIGS. 3a and 3b together comprise a block diagram of the internal processors of the SPROC device of the invention.
Figure 3B:
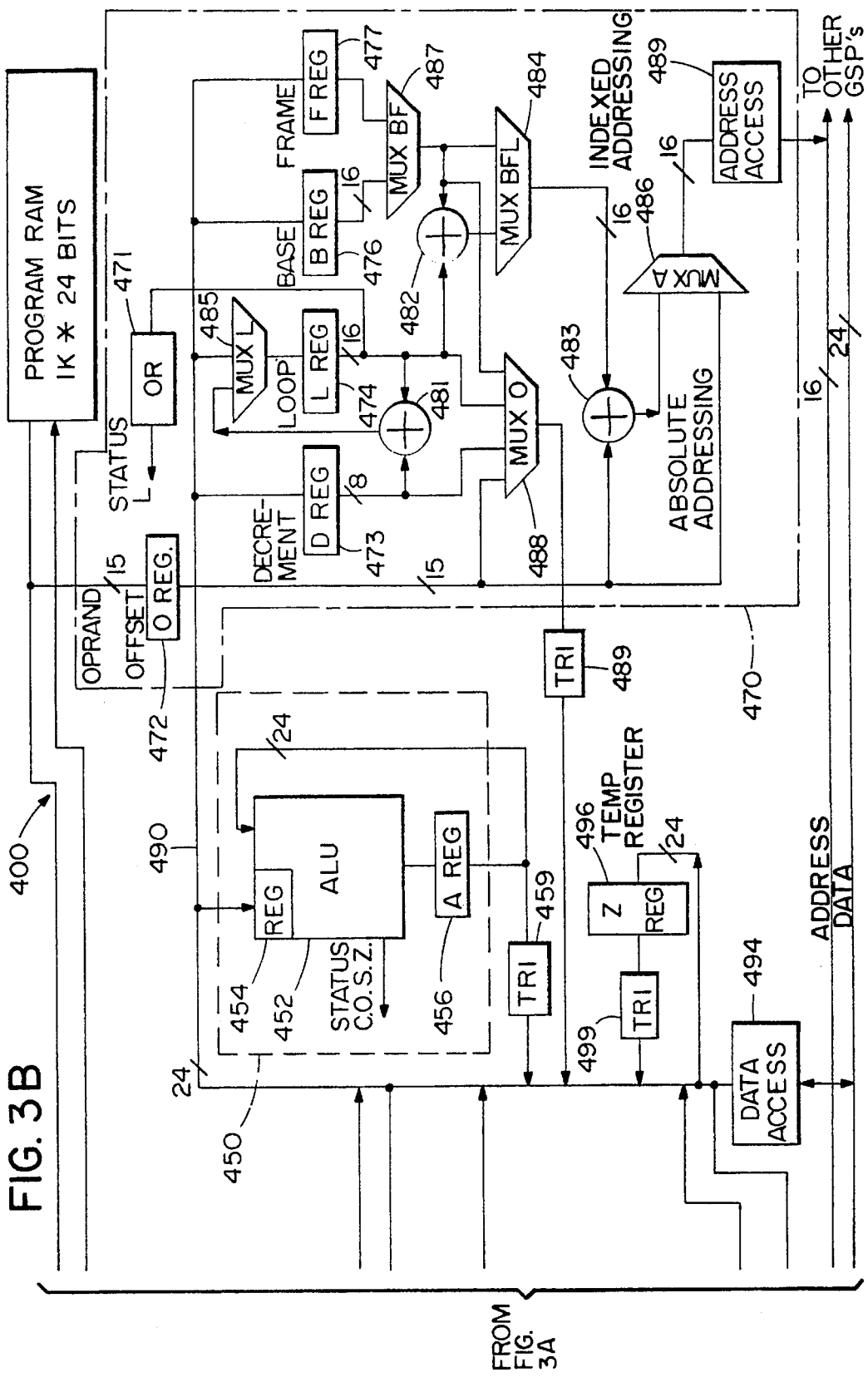

Turning to FIGS. 3a and 3b, a block diagram of the preferred general signal processor (GSP) 400 of the invention is seen. The GSP is coupled to a program RAM 150 via program RAM bus 155. Because the program RAM 150 is preferably shared by a plurality of GSPs 400, access to the program RAM bus is time division multiplexed as indicated in FIG. 2. The program RAM bus 155 is comprised of a data bus of width twenty-four bits, and an address bus of ten bit width where a 1K program RAM is utilized. Of course, if a larger program RAM is desired, additional bits are required to address the same, and the program RAM bus would be wider. As indicated in FIGS. 3a and 3b, the GSP 400 writes to the address section of the program RAM bus to indicate which instruction (RAM location) is desired. However, under ordinary operating conditions the GSP 400 is not capable of writing data to the program RAM 150. Under ordinary operating conditions, data is written into the program RAM 150 only via the host or access ports shown in FIG. 1 which are also coupled to the program RAM bus 155 in a time division multiplexed manner.

The GSP 400 is also coupled to the multiported data RAM 100 via a data RAM bus 125. Because the data RAM 100 is central to the processor architecture, and because non-arbitrated access to the data RAM 100 is desired, the data RAM 100 must either be a true multiported data RAM, or access to the data RAM 100 via the data RAM bus 125 must be time division multiplexed so as to effectively create a multiported RAM. The data RAM bus preferably comprises a data RAM address bus of sixteen bit width, an a data RAM data bus of twenty-four bit width. As indicated in FIGS. 3a, 3b and 4, the GSP may write to the address section of the program RAM 100. Also, the GSP may both read and write to the data section of the data RAM bus.

The GSP is substantially described by the details and functioning of six sections: a block controller 410; a program control logic block 420; a multiplier block 430; an ALU block 450; a flag block 460; and a data RAM address generator block 470. Coupling all six sections, as well as a break register 492, a data access register 494, and a temporary register 496 is an internal twenty-four bit bus 490. All access from any of the sections or from the registers 492, 494, or 496 onto the internal bus 490 is via tristate drivers 429, 449a, 449b, 459, 469, 489, and 499.

Block controller 410 is comprised of instruction decoder 412, and sequencer 414. The instruction decoder 412, when enabled, takes fourteen bits (nine bits of opcode, and five bits of operand) off of the data portion of the program RAM bus. Six of the nine opcode bits are used to indicate the operation (instruction) which the GSP is to perform (e.g. add, shift, jump, etc.), with up to sixty-four instructions being accommodated. In the preferred embodiment an additional three bits of opcode are utilized to specify the addressing mode the GSP is to use. In particular, in the "absolute" mode (code 000), the fifteen bits in the O register 472 of the address generator block 470 are used to select an address in the data RAM 100, and the data in that address of data RAM is used for the operation. In the "register" mode (code 001), the five operand bits obtained by the instruction decoder 412 are used to specify which register of the numerous registers of the GSP is to place its contents onto the internal bus 490. In the "immediate left" mode (code 010), the fifteen bits of data in the O register are to be put into the fifteen msb slots of the internal bus 490, while in the "immediate fight" mode (code 011), the fifteen bits are put into the fifteen lsb slots of the internal bus. In the remaining four modes, "BL indexed" (code 100), "B indexed" (code 101), "FL indexed" (code 110), and "F indexed" (code 111), as described in more detail hereinafter, values in base registers B or F are added to the value of the fifteen bit operand stored in the O register and, where appropriate, to the value in the L (loop) register, and are output onto the data RAM bus 125.

Instruction decoder 412 is not only coupled to the program RAM bus, but to the numerous multiplexers, tristate drivers, registers, etc. of the GSP via lines 416. Based on the instruction which is decoded by instruction decoder 412, various of those lines 416 are enabled in a sequence as determined by the sequencer 414. In effect, instruction decoder 412, and sequencer 414 are simply look-up charts, with instruction decoder 412 looking up which lines 416 must be enabled based on the code found in the nine bits of opcode, and sequencer 414 looking up the sequence to which the enabled lines must subscribe.

While instruction decoder 412 decodes whatever instruction is on the program RAM bus 155 when the GSP 400 is granted access to that bus, the instruction which is on the bus is generated and dictated by the program logic block 420. Program control logic block 420 is comprised of a tristate driver 422, a program address value register 424 (also called the "P" register), an incrementer 425, an increment (I) register 426, a jump (J) register 428, a multiplexer 430, and a branch logic block 432. The P register 424 contains the location of the program RAM 150 which contains the microinstructions which are to be used by the GSP 400. P register 424 writes that address onto the program RAM bus 155 by sending it to tristate driver 422 which acts as the bus interface.

Updating of the P register 424 is accomplished via muxP 430 which chooses one of the twelve bit addresses stored in the I register 426 or the J register 428 based on information from branch logic block 432. The address stored in the I register is simply the next numerical address after the address stored in the P register, as a value of one is added at incrementer 425 to the value stored in P register 424. In most situations, muxP 430 will permit the P register 424 to be updated by the I register, and the sequential addressing of the program RAM will continue. However, in some situations, such as where a jump in the routine is desired, the multiplexer 430 will permit the address in the J register 428 to be loaded into the P register 424. The decision to jump is made by the branch logic block 432 which reads the status of a plurality of status flags as is hereinafter discussed. The address to which the jump is made is obtained by the J reg 428 from the internal bus 490, which may obtain the address from any of the sections of the GSP 400 (or from the data RAM 100).

Coupled to the program control logic block 420 is a break register 492 in which upon the execution of a break instruction is loaded status flag information as well as the value of the P register plus one. The status flag and P register information is stored in the break register 492 which is coupled to internal bus 490 via tristate driver 429 because it is otherwise not available for placement on to the internal bus 490. A program break is typically executed when an information dump is desired by the system user, and is accomplished by putting an instruction in the program RAM 150 which causes the GSP 400 to write to a certain address (e.g. 0406H) of the data RAM 100. A decoder (not shown) on the data RAM bus 125 is used to determine that the program break is to be executed (based on the location to be written to), and a control signal is provided by the decoder to the break register 492. The program break instruction in the program RAM 150 causes instructions in a boot/break ROM 190 (shown in FIG. 1 ) which is coupled to the program RAM bus 155 to be accessed by the program control logic block 420. The instruction code in the boot/break ROM 190 in turn causes the values of each of the registers in the GSP 400 to be written into desired locations in the data RAM 100. Then the GSP 400 is kept waiting until the wait flag stored in its wait flag register (discussed below) is cleared. During the wait period, if desired, the user can change the values of data in the data RAM as described in more detail below with reference to the access port 900. Then, when the wait cycle is terminated, the instructions in the boot/break ROM 190 causes the values in the data RAM, including any new values, to be written back to their appropriate registers in the GSP. The location of the next desired microinstruction contained in a program RAM 150 location is loaded into the P register, so that the GSP can continue in its normal fashion.

The multiplier block 430 and the ALU block 450 of the GSP perform the numerical computations for the GSP. The multiplier block 430 is comprised of two input registers Xreg 432 and Yreg 434, a multiplexer 436 which is coupled to the internal bus 490 via tristate driver 449a, a multiplier 438 with a post Xreg 439, and a multiplier control 441, a summer 442, an output register Mreg 444, and a second multiplexer 446 which selects which of six words is to be output onto internal bus 490 via tristate driver 449b. Typically, the multiplicand is loaded into Xreg 432. Then the multiplier is loaded into Yreg 434 while the multiplicand is loaded into post Xreg 439. The multiplier control 441 permits the multiplier 438 to function over several machine clock cycles (e.g. three clock cycles totaling 300 nanoseconds=fifteen internal GSP cycles). If in multiplying, the multiplier overflows, a status flag M is set, and this information is conveyed to the branch logic block 432 of the program logic section 420. Regardless, the product of the multiplier and multipicand is forwarded to summer 442 which, in a multiply with accumulate mode, adds the new product to the sum of previous products and forwards the sum to the multiply register M 444. In a pure multiply mode, the contents of the summer are cleared so that the product is forwarded through the summer which adds zero and send the product to the M register.

The contents of the M register 444 are available to the internal bus 490. However, because the M register can accommodate a fifty-six bit word, and the internal bus 490 is a twenty-four bit bus, only a portion of the M register word may be placed on the bus at one time. Thus, multiplexer 446 is provided to either select the twenty-four least significant bits (lsb's) in the M register, the twenty-four next lsb's in the M register, or the eight most significant bits (msb's) in the M register. If the eight msb's are chosen, the eight msb's are placed in the eight lsb slots of the internal bus 490, and the msb of the eight bits is extended through to the msb slot on the bus (e.g. if the msb is a "1", the first seventeen msb's on the bus will be "1"). The multiplexer 446 is also capable of selecting a left shifted by two (zero filling the right) twenty-four or eight bit word. Thus, in all, multiplexer 446 can provide six different outputs based on the product in the M register 444.

The ALU block 450 of the processor is basically a standard ALU, having an arithmetic-logic unit 452 with input register 454, and an output accumulator register 456. The arithmetic-logic unit 452 is capable of the standard functions of similar units, such as adding, subtracting, etc., and produces values for Areg 456, as well as status flags including carry (C), overflow (O), sign bit (S), and zero (Z). The status flags are used by the branch logic block 432 of the program logic block 420 to determine whether a conditional jump in the microcode program should be executed. The Areg contents are output onto internal bus 490 via tristate driver 459.

Wait flag block 460 is comprised of two wait flag registers WFreg 462 and DFreg 464, a multiplexer 466, and OR gate 468. The bits of the wait flag registers may be set (i.e. written to) by data sent over the internal bus 490. Also, registers WFreg 462 and DFreg 464 are coupled to a flag bus 198 which is written to each time predetermined locations in the data RAM 125 are addressed as hereinbefore described with reference to FIGS. 2 and 13. In this manner, each bit of the wait flag registers 462 and 464 may be selectively cleared. When all of the bits in register WFreg 462 have been cleared due to the occurrences of specified events (e.g. the data RAM has received all the information which is required for another computation), OR gate 468 is used to provide a status flag W which indicates the same. Status flag W is read by the branch logic block 432. In this manner, "jump on wait flag" commands may be executed.

The DFreg 464 of the wait flag block 460 functions similarly to the the WFreg 462, except that no signals indicating the presence of all zeros (or ones) are output by the DFreg. In order to check the contents of the DFreg (or the WFreg, if all values in the WFreg are not zero), the register must be selected to put its contents on the internal bus 490. The selection of one of the registers is made by the instruction decode 412 and sequencer 414, and the contents are forwarded via multiplexer 466 and the tristate driver 469. An easy manner of determining whether the DFreg 464 has all zeros is to forward the contents of the DFreg 464 to the ALU 452, which will provide a status flag Z if the contents are zero.

The final large block of the general signal processor is the data RAM address generator block 470 which includes bus wide OR gate 471, registers Oreg 472, Dreg 473, Lreg 474, Breg 476, Freg 477, adders 481, 482, and 483, multiplexers muxBFL 484, muxL 485, muxA 486, muxBF 487, muxO 488, and an address access block 489. As previously indicated, the Oreg 472 obtains the fifteen least significant bits of the instruction on the program RAM bus. If "absolute" addressing is desired, i.e. the address to be written onto the data RAM bus is included in the program RAM microinstruction itself, the address is written into the Oreg 472, and then forwarded to the data RAM bus (a sixteenth bit having been added by a zero extender, not shown) via muxA 486 and the address access block 489. The sixteen bit address is then placed on the data RAM bus at the appropriate time. All other situations constitute "indexed" addressing, where the address to be put out on the data RAM bus is generated internally by the data RAM address generator block 470.

Addresses are generated by adding the values in the various registers. In particular, and as indicated in FIG. 4, the Oreg 472 is the offset register, the Dreg 473 is a decrement register, the Lreg 474 is a loop register which sets the length of a loop, the Breg 476 is a base address register, and the Freg 477 is a frame address register which acts as a second base address register. The O register obtains its data off of the program RAM bus, while registers D, L, B and F obtain their data from the internal bus 490. If it is desired to add some offset value to the value in the base or frame register (i.e. the "B indexed mode" or "F indexed mode") in order to generate an address, muxBF 487 selects appropriately the Breg 476 or the Freg 477, muxBFL 484 selects the value coming from muxBF 487, and the Breg or Freg value is added to the offset value of the Oreg by the adder 483. That value is then selected by muxA 486 for output over the data RAM bus via the address access block 489. Similarly, if it is desired to add some offset value and some loop value to the value in the base or frame register (i.e. the "BL indexed mode" or the "FL indexed mode "), the value in the L register is added to the value in the B or F registers at adder 482, and the sum is passed via muxBFL 484 to adder 483 which adds the value to the value in the O register.

By providing adder 481, and by coupling the decrement register Dreg and the loop register Lreg to the adder 481, registers an address loop is effectuated. In particular, the Lreg sets the length of the loop, while the Dreg sets the value by which the loop is decremented. Each time the Dreg is subtracted from the Lreg 475 at adder 481, the new value is fed back into the Lreg 475 via muxL 485. Thus, each time a DJNE instruction is executed (as discussed below), the resulting value in the Lreg is decreased by the value of the Dreg. If added to the Breg or Freg, by adder 482, the address generated is a sequentially decrementing address where the value in the Dreg is positive, and a sequentially incrementing address where the value in the Dreg is negative.

The ability to loop is utilized not only to provide a decrementing (or incrementing) address for the data RAM bus, but is also utilized to effect changes in the program RAM address generation by providing a "decrement and jump on not equal" (DJNE) ability. The output from the adder 481 is read by OR gate 471 which provides a status flag L (loop) to branch logic block 432. The status flag L maintains its value until the L register has looped around enough times to be decremented to the value zero. Before that point, when the Lreg is not zero, the next instruction of the GSP is dictated by the instruction indicated by the Jreg 428. In other words, the program jumps to the location of the Jreg instruction instead of continuing with the next instruction located in the I register. However, when the Lreg does decrement to the value zero, the OR gate 471 goes low and toggles flag L. On the next DJNE instruction, since the "not equal" state does not exist (i.e. the Lreg is zero), branch logic 432 causes muxP 430 of the program logic block 420 to return to obtaining values from the Ireg 426 instead of from the Jreg 428, and the program continues.

The values of any of the O, D, L, B, or F registers may be placed on the internal bus 490, by having muxO 488 (and where appropriate mux BF 487) select the appropriate register and forward its contents via tristate driver 489 to the internal bus.

Coupled to the internal bus 490, and interfacing the internal bus 490 with the data slots on the data RAM bus is the data access port 494. The data access port 494 is capable of reading data from and writing data to the data RAM and is given access to the data RAM in a time division multiplexed manner as previously described. In writing to the data RAM, the data access port 494 and the address access port 489 are activated simultaneously. In reading data from the RAM, the address access port 489 first places on the data RAM bus the data RAM address in which the desired data is stored. The data is then placed on the data RAM bus by the data RAM, and the data access port 494 which is essentially a dual tri-state driver, receives the data and passes it onto the internal bus 490 for storage in the desired GSP register.

If desired, additional registers such as Z register 496 may also be coupled to the internal bus 490, and may be used as temporary storage. The contents of Zreg 496 are output onto the internal bus 490 via tristate driver 499.

Details of the functioning of the GSP as well as example microcode may be seen with reference to previously incorporated U.S. Ser. No. 07/525,977.

Figure 4A:
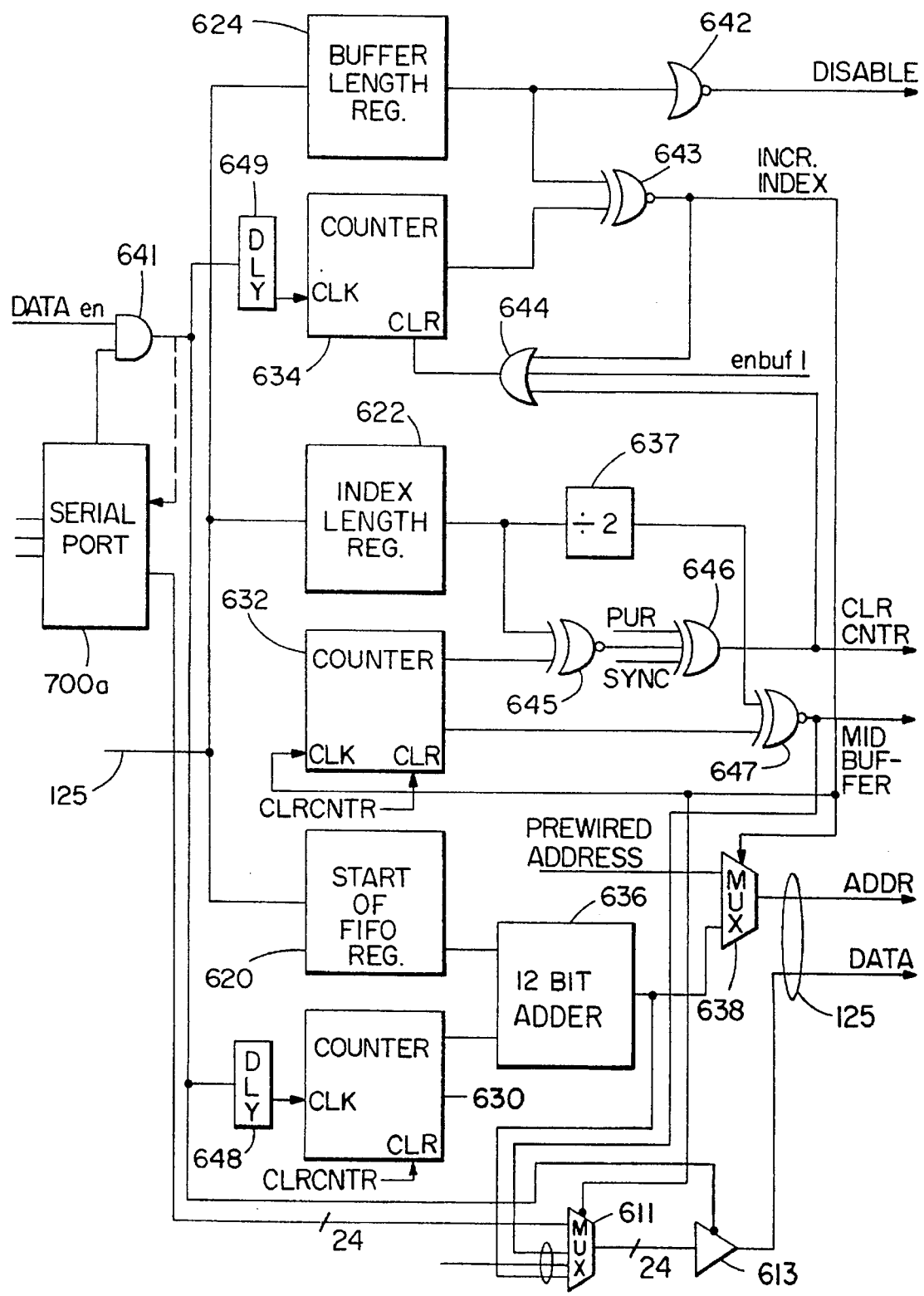
FIGS. 4a and 4b are block diagrams of the input and output sides of the data flow manager of the invention.
Figure 4B:
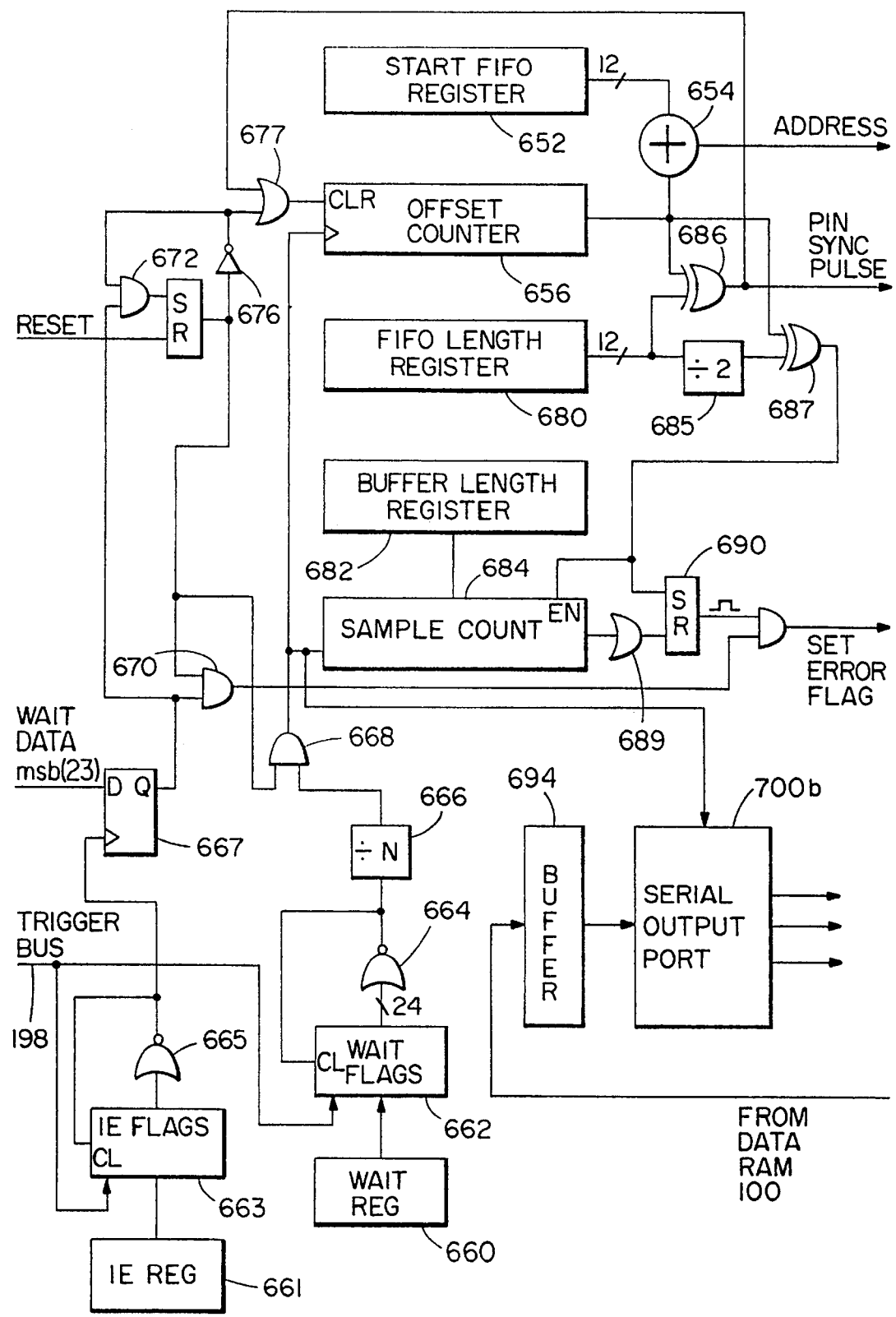
Figure 4C:
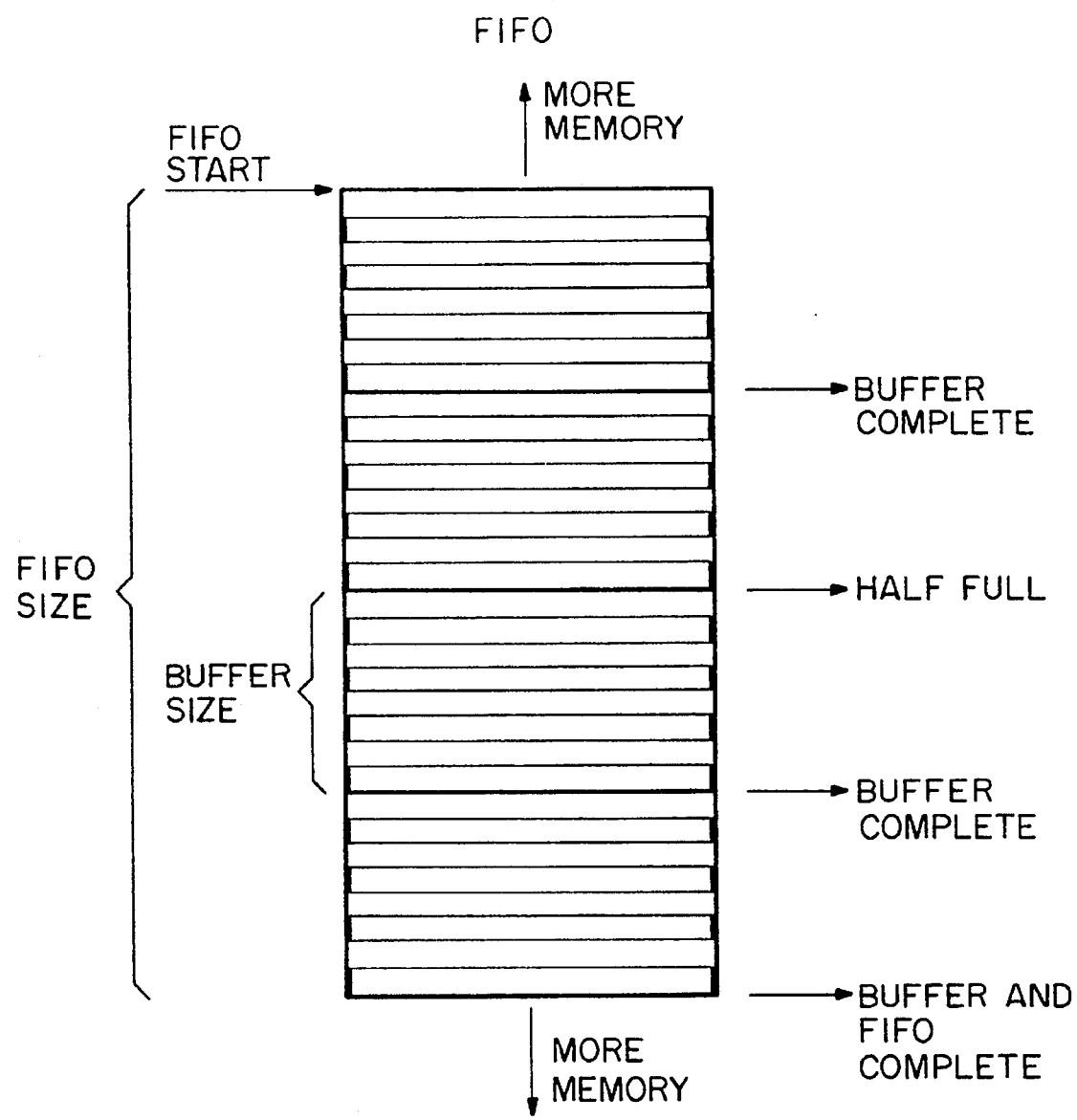
FIG. 4c is a representation of a FIFO which is implemented in the multiported data RAM, and which is utilized by the data flow manager of the invention.

Turning to FIGS. 4a, 4b, and 4c, block diagrams of the input and output circuitry of the data flow manager (DFM) 600 of the invention, and an example FIFO related to the DFM are seen. As previously described, the DFM serves the important function of handling the flow of data into and out of the processor apparatus so that GSPs of the processor apparatus need not be interrupted in their processing tasks. In accomplishing this function, the DFM takes data received by the serial port from the "world" outside of the particular processor apparatus and organizes it inside a FIFO such as the FIFO of FIG. 4c which is implemented in desired locations of the data RAM 100 of the SPROC apparatus 10. Also, the DFM 600 takes data in a FIFO, and organizes it for output to a serial output port of the SPROC apparatus. The DFM is also capable of directing data into a FIFO and drawing data from a FIFO at desired speeds so as to accommodate a decimation operation performed by the SPROC. Further, the DFM causes decoder 196 to write flags to the flag bus 198 (and hence to the GSPs 400) of the SPROC apparatus 10 regarding the status of the buffers.

The DFM 600 of the SPROC apparatus may either be central to the apparatus, or distributed among the serial input and output ports 700 of the apparatus, with a single DFM serving each port 700. Where distributed, the circuitry seen in block diagram form in FIGS. 4a and 4b is duplicated for each serial input and output port 700 of the SPROC apparatus, although certain circuitry could be common if desired.

The circuitry for receiving data from a serial port and organizing it for storage in a FIFO of the data RAM 100 is seen in FIG. 4a. The data flow itself is simple, with the data being sent from the serial port 700, via multiplexer 611 and tri-state driver 613 to the data slots of the data RAM bus 125. Multiplexer 611 permits either data coming from serial port 700a or data generated as hereinafter described to be forwarded to driver 613. Driver 613 is controlled as indicated such that data is only output on the data RAM bus 125 when the DFM 600 is enabled by the system-wide multiplexer clock scheme. The organization of the data for output onto the data RAM bus as a twenty-four bit word is conducted by the serial port 700, as hereinafter described.

Besides the data flow circuitry, each DFM is arranged with buffers, counters, gates, etc. to generate data RAM FIFO addresses for the incoming data. As shown in FIG. 4a, the DFM 600 has three registers 620, 622, 624, three counters 630, 632, and 634 associated with the three registers, an adder 636, a divide by two block 637, a multiplexer 638, seven logic gates 641, 642, 643, 644, 645, 646, and 647 (gates 642, 643, 645, and 647 being bus wide gates), and two delay blocks 648 and 649. The three registers are respectively: the start of FIFO register 620 which stores the start location in the data RAM for the FIFO to be addressed by the particular serial port coupled to the particular part of the DFM; the index length register 622 which stores the number of buffers which comprise the FIFO (for the FIFO of FIG. 4c, the index length register would be set at four), and the buffer length register 624 which stores the length of each buffer, i.e. the number of words that may be stored in each buffer (for the FIFO of FIG. 4c, the buffer length register would be set at eight). When a data word (twenty-four bits) is ready for sending to the data RAM for storage in a FIFO, the serial port 700a provides a ready signal which is used as a first input to AND gate 641. The second input to AND gate 641 is a data enable signal which is the time division multiplexed signal which permits the DFM to place a word on the data RAM bus. With the data enable and ready signals high, a high signal is output from the AND gate which causes driver 613 to output the data on the data RAM bus along with an address. The address is that which is computed by the twelve bit adder 636, or a prewired address, as will be described hereinafter.

When AND gate 641 provides a high output, the high output is delayed by delay blocks 648 and 649 before being input into clock counters 630 and 634. As a result, counters 630 and 634 increase their counts after an address has been output on the data RAM bus. When counter 630 increases its count, its count is added by the twelve bit adder 636 to the FIFO start location stored in register 620. If selected by multiplexer 638, the generated address will be the next address output in the address slots of the data RAM bus in conjunction with the data provided by driver 613. Thus, as data words continue to be sent by the serial port for storing in the data RAM FIFO, they are sent to incremental addresses of the data RAM, as the counter 630 increasingly sends a higher value which is being added to the FIFO start location. As is hereinafter discussed, the counter 630 continues to increase its count until a clear counter signal is received from circuitry associated with the index length register 622. When the clear counter signal is received, the counter starts counting again from zero.

As aforementioned, each time the AND gate 641 provides a high output, the counter 634 associated with the buffer length register 624 is also incremented (after delay). The outputs of the buffer length register 624 and its associated counter 634 are provided to bus wide XNOR gate 643 which compares the values. When the counter 634 reaches the value stored in the buffer length register 624, a buffer in the data RAM FIFO has been filed. As a result, the output of XNOR gate 643 goes high, causing three input OR gate 644 to pass a high signal to the reset of counter 634. The high signal from bus wide XNOR gate 643 is also fed to the counter 632 associated with the index length register 622, to the multiplexer 638, and to the multiplexer 611. As a result of the buffer being filled, multiplexer 638 enables the prewired address to be placed in the address slots of the data RAM bus 125, along with one of two predetermined (or generated) data words which are generated as discussed below. The placement of the prewired address and a data word on the bus at the end of buffer signal occurs upon the next data enable signal received by the DFM, which is before another word is assembled by the serial port 700a for sending to the data RAM 100. Also, the placement of the prewired address and data word is used for signalling purposes, as a decoder 196 (seen in FIG. 1) monitors the data RAM bus 125 for the particular prewired addresses of the DFMs; the triggering of these addresses occurring because of conditions in the DFM, i.e. the filling of buffers. The decoder 196 in turn, can set a flag (the setting of the flag can be dependent on the value of the data accompanying the prewired address) on the trigger bus 198 which signals the GSPs 400 of the SPROC of the occurrence. In this manner, the GSPs 400 can determine that the data required to conduct an operation is available to the GSP, thereby causing the GSP to exit a wait loop.

The predetermined or generated data word placed on the bus after a FIFO buffer has been filled preferably uses a "1" as the msb of the data word if the FIFO buffer that has been filled causes the FIFO to be half filled (as described hereinafter), or a "0" as the msb otherwise. The remainder of the data word may be null information. Or, if desired, the data word may include the next location to which the DFM will write (i.e. the location computed by the twelve bit adder 636) which is inserted in appropriate locations of the data word. This predetermined or generated data word is then passed via multiplier 611 to driver 613 which places the data word on the bus at the same time the prewired address is placed on the data RAM bus 125.

As aforementioned, when an indication of a full buffer is output by bus wide XNOR gate 643, counter 632 is incremented. Counter 632 therefore tracks the number of the buffer in the FIFO that is being filled. When the number of the FIFO buffer being addressed (as determined by counter 632) is half of the FIFO length (as determined by the length stored in register 622, divided by divide by two block 637), a flag is raised by the DFM via the bus wide XNOR gate 647. The "mid buffer" flag indicates that the buffer in the FIFO being written to is halfway through the FIFO. Hence, if all previous buffers in the FIFO are still full with data, the FIFO is half full. In addition, the mid buffer flag causes the generated data input to multiplexer 611 to be changed, such that the msb of the data is a "1" instead of a zero. Thus, upon filling the buffer which causes the FIFO to be half filled, a slightly differently coded data word is placed in the data slots of the data RAM bus.

When the value of counter 632 is incremented to the value stored in the index length register 622, the last location in the FIFO has been addressed. Accordingly, it is desirable to recirculate; i.e. to continue by addressing the first location in the FIFO. With the value of counter 632 equal to the value of register 622, bus wide XNOR gate 645 provides a high signal which is passed through three input OR gate 646. As a result, counters 630, 632, and 634 are reset. As indicated in FIG. 4a, a "clear counter" signal may also be generated by a power up reset (PUR) signal which is generated by applying a signal to a predetermined pin (not shown) of the SPROC, and by a SYNC signal which is generated by writing to address 0405H of the data RAM 100. The SYNC signal permits different DFMs to be synchronized to each other.

If desired, the input section of one DFM can be synchronized to the output section of the same or another DFM. This synchronization is accomplished via a pin (not shown) on the SPROC which generates the "en buf" input into OR gate 644. In turn, OR gate 644 provides a high signal which resets counter 634 in synchronization with the resetting of a similar counter in a DFM output section such as described with reference to FIG. 4b.

Turning to FIG. 4b, the serial output section of the DFM 600 is seen. The function of the output section of the DFM is to take data in the FIFO, and organize it for output to a serial output port 700b of the SPROC apparatus.

The output section of the DFM is preferably comprised of several registers and counters, logic elements including AND gates, comparators, and inverters, divide and add blocks, flip-flops, a buffer and a parallel to serial converter. Basically, the data flow through the serial output section of the DFM is simple. An address generated by the the start address register 652 is added by adder 654 to the value in the offset counter 656, and that address is output onto the address section of the data RAM bus. The data RAM receives the address information and then places the data located at that data RAM address on the data RAM bus. That data is received by the DFM and latched and stored in buffer 694 prior to being forwarded to the serial output port 700b.

The remaining circuitry of FIG. 4b serves the functions of not permitting the data to be forwarded to the serial output port 700b unless certain conditions (i.e. triggers) are met, as well as generating synch pulses and error flags depending on internal logic and received signals. In particular, each DFM has a wait register 660 which holds flag information which must be cleared in the wait flag register 662 before a signal will be generated. The bits in the wait flag register are only cleared upon receipt of appropriate trigger bits received from the trigger bus 198. When the appropriate flags are cleared, bus wide NOR gate 664 resets the wait flag register 662 by permitting it to be reloaded from wait register 660. The NOR gate 664 also passes the signal on to divide by N (N=0, 1, . . . , n) block. Upon the divide by N block 666 receiving N pulses from NOR gate 664, it outputs a pulse to AND gate 668. If N is one, no clock decimation occurs. However, if N is greater than one, decimation is effected; i.e. the clock is reduced to match the decimation of data which occurred in the GSP. If the other input to AND gate 668, is also high (which occurs when the DFM is running as hereinafter described), a pulse is sent to offset counter 656 which increases its count. In this manner the address output by adder 654 is changed to the next address. Likewise, when the output of AND gate 668 is high, a pulse is sent to the serial output port 700b which outputs a data signal from the DFM, and to the sample counter 684 which increases its count.

The DFM also includes a IE (initiation/error) register 661 which supplies the flag data which must be cleared by the trigger bits to the LF flag register 663. The outputs from IE flag register 663 are fed to bus wide NOR gate 665 which is used in a feedback manner to reset the IE flag register 663 so that it can be reloaded by IE register 661. The output from bus wide NOR gate 665 is also sent as the clock input into a D type flip-flop 667. The data (D) input into the D type flip-flop 667 should be the msb (bit twenty-three) of the data word being input into the DFM's data RAM buffer by the input side of the DFM, which is arranged to be a value "1" only when the word is being taken from the half-full location of the data RAM buffer. The value of the msb input to the D input, is then clocked over to the Q output of the flip-flop which is forwarded as the first of two inputs to each of two AND gates 670 and 672. As will be discussed hereinafter, AND gate 670 is used to set an error flag. AND gate 672, on the other hand, is used to set block 675 which is used to indicate the state of the DFM (i.e. is it presently running). If the DFM is presently causing data to be read from the data RAM and output via the DFM to a serial port, the DFM is in the running mode, and the output from block 675 is already high. As a result, inverter 676 provides a low signal to AND gate 672 which is not affected by the output from flip-flop 667. On the other hand, if the DFM is not running, the output from block 675 is low, and inverter 676 provides a high value to AND gate 672. Thus, if flip-flop 667 provides a low signal (which will happen until the buffer in the data RAM for the DFM has received enough data to be half full), the DFM will not start running. On the other hand, if flip-flop 667 provides a high signal indicating that the data RAM has now been filled halfway, block 675 changes its output and the DFM starts running.

It should be noted that when the DFM is not running, the high output from inverter 676 is forwarded via OR gate 677 to the clearing input of offset counter 656, thereby causing the address count to be generated by adder 654 to be initialized upon start-up of the DFM.

As aforementioned, AND gate 670 is used to set an error flag. Thus, if D type flip-flop 667 provides a high output while the DFM is running (as indicated by the output from block 675), AND gate 670 passes a high value to AND gate 698, which in turn will generate an error flag if other criteria are met, as hereinafter described.

The remaining blocks of the DFM output section include a FIFO length register 680, a buffer length register 682, a sample counter 684, a divide by two block 685, comparators 686 and 687, a bus wide OR gate 689, and a set/reset block 690. The FIFO length register 682 stores the full length of the FIFO. When the value of the offset counter 656 is equal to the FIFO length stored in buffer 680, a sync pulse is generated by bus wide XNOR gate 686 which is used to synchronize the incoming data signal into an input section of a DFM with the outgoing data signal from the described output DFM. The sync pulse generated is received by the input section of the DFM (seen in FIG. 4a) as the signal enbuf1, previously described. In addition the sync pulse may be used to reinitialize the DFM by clearing the offset counter 656 and reloading the registers. When the value in the offset counter 656 is equal to one-half the value of the FIFO length register 680 (as determined by divide by two block 685), comparator 687 provides a pulse to set/reset block 690 which is indicative of the fact that the address placed on the data RAM bus is the address half-way through the data RAM buffer associated with the particular DFM. When the data RAM address is the half-full address, the data being written into the data RAM buffer should not be written into the half-full address (i.e. there should never exist a situation where the address is being written to and read from at the same time). Thus, if D type flip-flop 667 provides a high signal to AND gate 670 while the DFM is running, and the output from set/reset block 690 is also, high, AND gate 698 provides a high output which sets an error flag for the DFM.

Finally, with respect to the output side of the DFM, the buffer length register 682 stores a value equal to the length of each buffer in the data RAM FIFO associated with the DFM. The sample counter 684 is a down counter which is preloaded with the buffer length stored in register 682. When a high pulse is received from XNOR gate 687 (i.e. the offset counter is half of the FIFO length), RS flip-flop 690 is set and the down counter of sample counter 684 is enabled. Each time sample counter 684 receives a pulse from AND gate 668, the count is decremented. When the sample count goes to zero, the RS flip-flop 690 is reset. However, while the RS flip-flop 690 is set and outputs a high pulse to AND gate 698, the DFM is looking for an error. If before being reset a high msb value is seen by flip-flop 667, the DFM is apparently attempting to read and write to the same buffer location at the same time. As a result, AND gate 698 provides a high signal which sets an error flag for the DFM.

Turning to FIG. 4c, an example of a FIFO associated with the DFM is seen. The FIFOs associated with DFMs are contained in a preferably predetermined portion of the data RAM of the processor apparatus. The FIFO of FIG. 4c, as shown contains four buffers. Also as shown, each buffer contains storage for eight data samples. Thus, as shown, the FIFO of FIG. 4c has storage for thirty-two data samples. Of course, a FIFO can contain a different number of buffers, and the buffers can store different numbers of data samples. The size of the each FIFO associated with a DFM and the size of its buffers is either set automatically by intelligent software which calculates the requirements of the particular DFM, or by the user of the processor system during initial programming of the processor system.

Figure 5A:
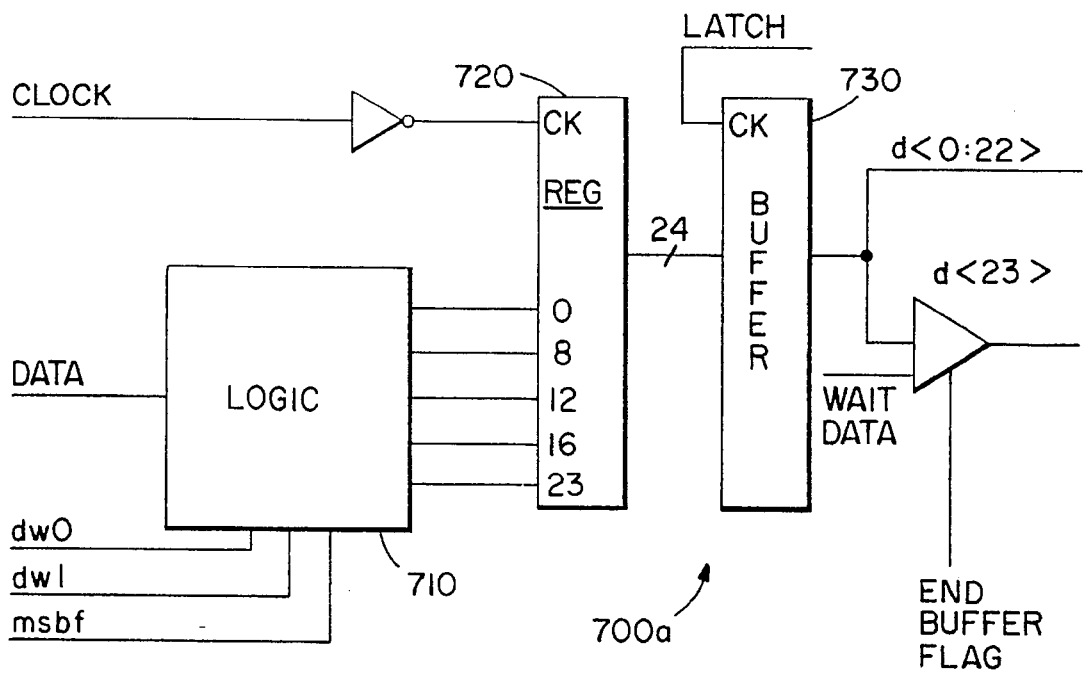
FIGS. 5a and 5b are block diagrams of the serial input and serial output ports of the invention.

Turning to FIG. 5a, a block diagram of the serial input port 700a of the invention is seen. The basic function of the serial input port is to receive any of many forms of serial data and to convert the received serial data into parallel data synchronous with the internals of the SPROC and suitable for receipt by the DFM 600 and for transfer onto the data RAM bus 125. To accomplish the basic function, the serial input port has a logic block 710, a data accumulation register 720, and a latched buffer 730. The logic block 710 and the data register 720 are governed by seven bits of information programmed into the serial input port 700a upon configuration during boot-up of the SPROC 10. The seven bits are defined as follows:

|   | dw1 | dw0 |   |                     |                     |
|---|-----|-----|---|---------------------|---------------------|
| 0 | dw0 | 0   | 0 | 24 bits data width  |                     |
| 1 | dw1 | 0   | 1 | 16 bits data width  |                     |
|   |     | 1   | 0 | 12 bits data width  |                     |
|   |     | 1   | 1 | 8 bits data width   |                     |
| 2 |     |     |   | High: msb first     | Low: lsb first      |
| 3 |     |     |   | High: short strobe  | Low: long strobe    |
| 4 |     |     |   | High: gated clock   | Low: continuous clock |
| 5 |     |     |   | High: internal clock | Low: external clock |
| 6 |     |     |   | High: output port   | Low: input port     |

Bits 0, 1, and 2 are used to govern the logic block 710. If the incoming data is a twenty-four bit word, the logic block takes the bits in a bit by bit fashion and forwards them to the data accumulation register 720. If the incoming data is a sixteen bit, twelve bit, or eight bit word, the logic block takes the bits of the word in a bit by bit fashion and zero fills them to extend them into a twenty-four bit word. Which bit of the received serial data is forwarded into the msb slot of the register 720 is governed by control bit 2.

Once the data is properly accumulated in register 720, it is latched into buffer 730 where it is held until it can be forwarded through the input section of the DFM 600 for storage in the multiported RAM 100. The holding of the data in the buffer 730 until the appropriate signal is received effectively causes data which is asynchronous with the SPROC 10 to become synchronized within the SPROC system.

Bits 3, 4, and 5 governing logic block 710 are respectively used to control the type of strobe, the type of clock, and the location of clock control for the input port 700, all of which are necessary for the proper communication between the SPROC and an external device. Because port 700 preferably includes the circuitry of both an input port 700a and an output port 700b (described in more detail hereinafter), an extra bit (bit 6) is used to control the functioning of port 700 as one or the other.

Figure 5B:
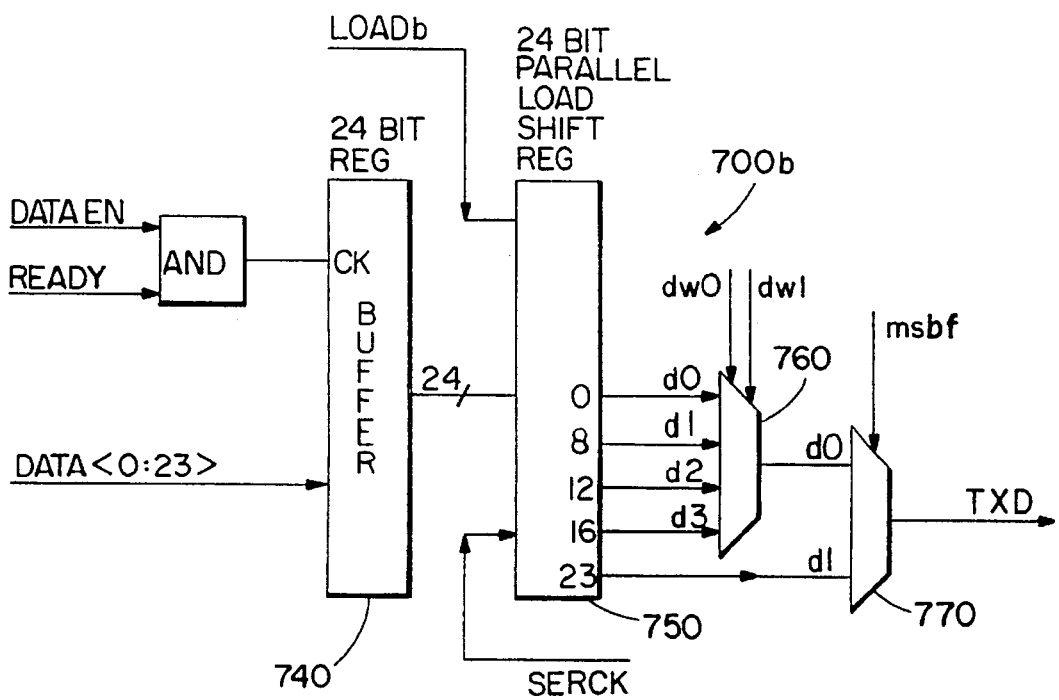

The serial data output port 700b seen in FIG. 5b is similar to the data input port 700a in many ways, except that its function is the converse. The serial output port 700b includes a buffer 740, an parallel load shift register 750, and controlled multiplexers 760 and 770. The data to be written from the SPROC via the output port 700b is received by the buffer 740 from buffer 694 of the DFM 600. The twenty-four bits received are then loaded in parallel into the parallel load shift register 750 which functions as a parallel to serial converter. The twenty-four bits are then forwarded in a bit serial fashion via multiplexer 760 which receives the control signals dw0 and dw1, and via multiplexer 770 which receives the msb control signal to the transmit data line. Multiplexers 760 and 770 effectively transform the twenty-four bit word received by the parallel load shift register into the desired format for communication with a desired device external the SPROC. The twenty-four bits may be transformed into an eight bit word (e.g. the eight msb's), a twelve bit word, or a sixteen bit word (the eight lsb's being truncated), with either the lsb or the msb being transmitted first. A twenty-four bit word may similarly be sent lsb or msb first. Where the SPROC is communicating with another SPROC (i.e. output port 700b of one SPROC is communicating with the input port 700a of another SPROC), multiplexers 760 and 770 are preferably controlled to send a twenty-four bit word, msb first.

Figure 6:
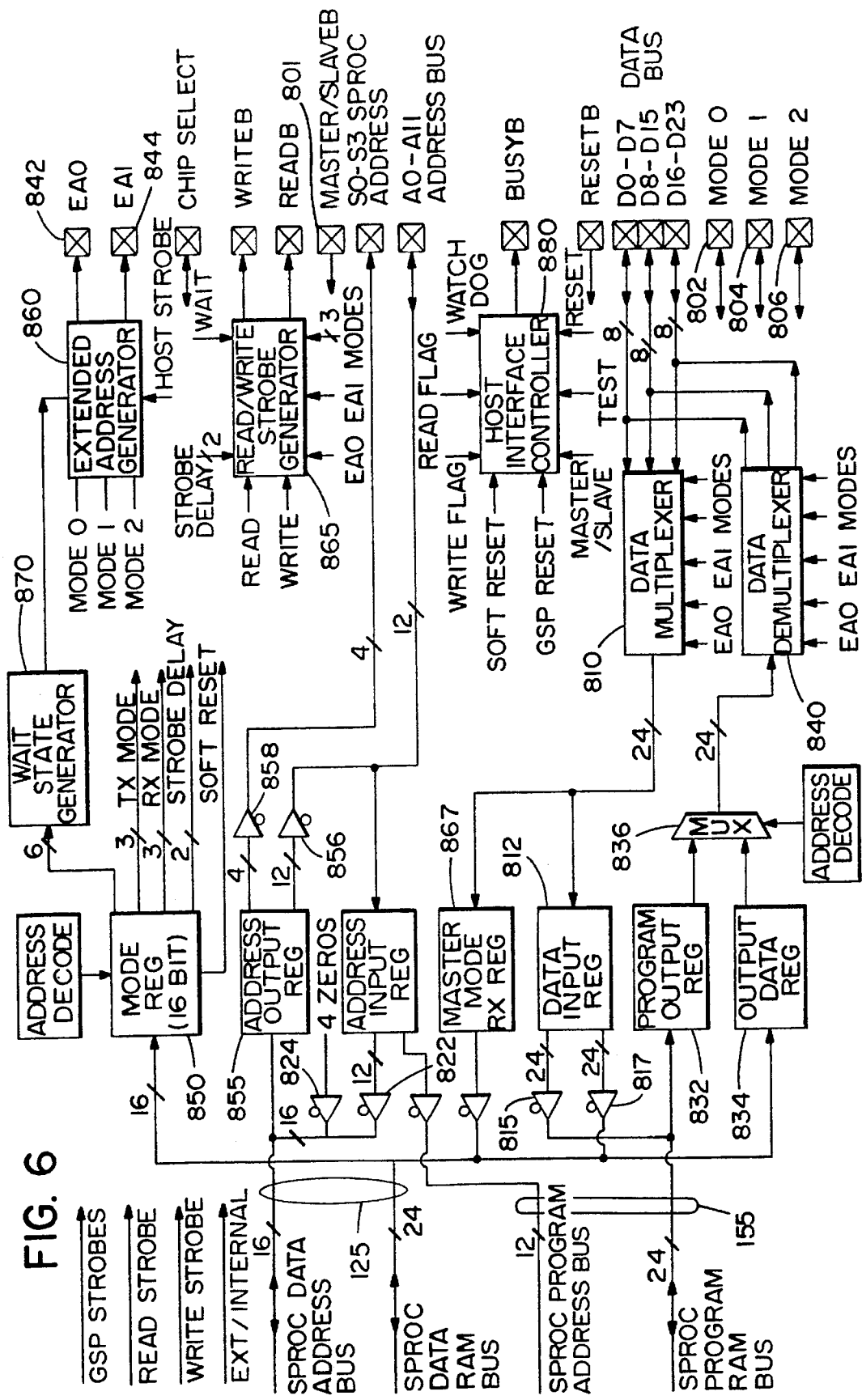
FIG. 6 is a simplified block diagram of the host port of the invention.
Figure 7:
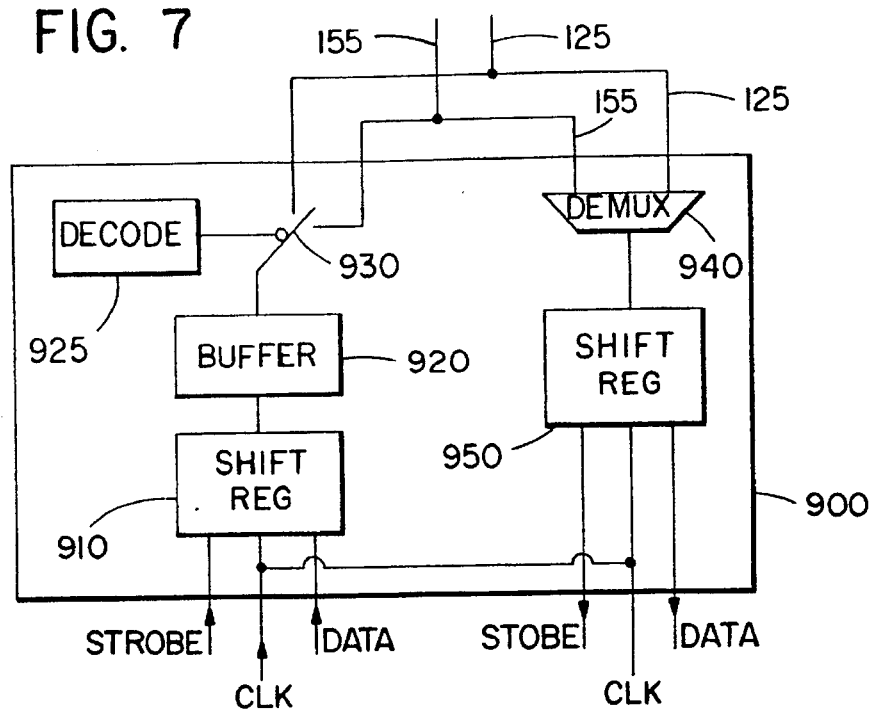
FIG. 7 is a block diagram of the access port of the invention.
Figure 8:
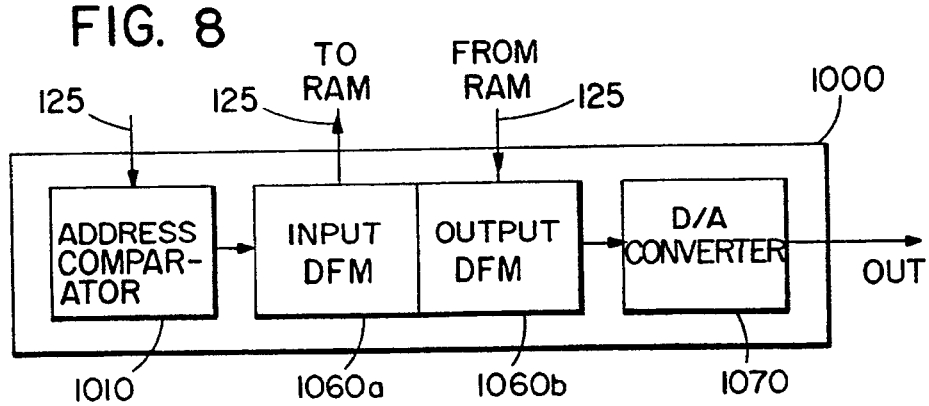
FIG. 8 is a block diagram of the probe of the invention.

Turning to FIG. 6, details of the host port 800 are seen. Under most circumstances the host port 800 serves to interface the SPROC 10 with a host 180 (see FIG. 2), although where the SPROC 10 is a master SPROC which is in boot mode, host port 800 serves to interface the SPROC 10 with an EPROM and with any slave SPROCs which are part of the system. As indicated in FIG. 8, the host port 800 is coupled to the data RAM bus 125 as well as to the program RAM bus 155 on the SPROC side, while on the host side, the host port 800 is coupled to the host bus. The host bus includes three data sections D0–D7, D8–D15, and D16–D23, and three address sections A0–A11, S0–S3, and EA0–EA1. The remaining interfaces shown on the host side are pins (e.g. master/slave, reset, mode) which control the functioning of the SPROC 10 and the host port 800, and the read/write strobes for the host bus 165.

In slave mode (master/slave pin 801 set to slave mode), the SPROC 10 appears to other apparatus, including host microprocessors or DSPs as a RAM. Because it is desirable that the SPROC interface with as many different types processors as possible, the host port 800 is a bit parallel port and is arranged to interface with eight, sixteen, twenty-four, and thirty-two bit microprocessors and DSPs. The mode pins 802, 804, and 806 are used to inform the host port 800 as to whether the host processor is an eight, sixteen, twenty-four bit, or thirty-two bit processor, and whether the word being sent first is the most or least significant word.

For sending data from the host processor to the SPROC in slave mode, a data multiplexer 810, a data input register 812, and two drivers 815 and 817 are provided. The data multiplexer 810 receives three eight bit data inputs (D0–D7, D8–D15, and D16–D23) from the data bus section of host bus 165 and causes the data to be properly arranged in the data input register 812 according to the control of mode pins 802, 804, and 806. If the host processor is a thirty-two bit processor, the host port 800 of the SPROC takes two sixteen bit words and processes them in a manner described below with reference to a sixteen bit processor. Where the host processor is a twenty-four bit processor as indicated by mode pins 802 and 804, data is passed directly to the data input register 812 without adding bits or dividing bytes into segments. Where the host processor is a sixteen bit processor as indicated by mode pins 802 and 804, the host port takes sequentially takes two sixteen bits from two of the three eight bit data input lines (D0–D7, D8–D15, D16–D23), discards the eight lsb's of the least significant word, and uses the remaining bits to provide a twenty-four bit word to the data RAM bus 125 or the program RAM bus 155 of the SPROC. Where the host processor is an eight bit processor as indicated by mode pins 802 and 804, three eight bit bytes are received over the D0–D7 data input line and are concatenated in the data input register 812 in order to provide the SPROC with a twenty-four bit signal.

Regardless of how the data input register 812 is filled, after the data is assembled, the host port 800 awaits an enabling signal from the SPROC timing so that it can write its twenty-four bit word to the data RAM bus 125 via driver 817 or the program RAM bus 155 via driver 815. In this manner, the host port 800 synchronizes data to the SPROC 10 which was received in a manner asynchronous to the SPROC 10. The address to which the data is written is obtained from the twelve bit address section A0–A11 of the host bus 165. The twelve bit address is forwarded from host bus 165 to the address input register 820. When the host port 800 is enabled, if the address contained in the address input register 820 is indicative of a data RAM location, the address is placed via driver 822 on the sixteen bit address section of the data RAM bus 125. Because the address bus is a sixteen bit bus, while the address in address input register 820 is a twelve bit address, four zeros are added as the msbs of the address via driver 824 when the address and data are put on the data RAM bus. If the address contained in the address input register 820 is indicative of a program RAM location (address location 1K and below), the address is placed via driver 826 on the twelve bit address section of the program RAM bus 155.

In the slave mode, when the host processor wishes to read information from the SPROC, the host processor causes the read strobe to go low. The address received by the host port over address lines A0–A11 is read by the host port 800 and latched into the address input register 820. When the host port 800 is allowed access to the data or program RAM buses, the address is placed on the appropriate bus, and the twenty-four bit data word located at the data or program RAM address which was placed on the appropriate bus is read and latched either into the program data output register 832 or the output data register 834. That information is then forwarded via multiplexer 836 to data demultiplexer 840 arranges the twenty-four bits of information onto locations D0–D23 of the host bus 165. Demultiplexer 840 serves the opposite function of multiplexer 810. When sending data to the twenty-four bit host processor, the demultiplexer 840 simply takes its twenty-four bits and passes them unchanged. When sending data to a sixteen bit host processor, the SPROC 10 divides its twenty-four bit word into two sixteen bit words (with zero filling as appropriate). Similarly, when sending data to an eight bit host processor, the SPROC 10 divides its twenty-four bit word into three eight bit bytes.

In the master mode, on the "host" side of the host port 800 is located either an EPROM or one or more slave SPROCs. In the boot mode of master mode, data from the internal boot ROM 190 of the SPROC is written into the sixteen bit mode register 850 which is used to configure the internals of the host port 800. Then the GSP of the SPROC, which executes the program in the internal boot ROM, writes the sixteen bit addresses of the EPROM it wants to read in order to initialize the SPROC. Each address is received by the address output register 855 of the host port. The host port then sends a read strobe onto the host bus 165 and places via drivers 856 and 858 the address of the EPROM address it wishes to read. If the EPROM is an eight bit EPROM, the desired address is extended by extended address generator 860, and three read strobes are generated by the strobe generator 865 so that three eight bit bytes of the EPROM can be accessed. When the EPROM places its data onto the data locations of the host bus 165, that data is forwarded through data multiplexer 810, and is placed in a master mode receive register 867. The assembled twenty-four bit data word may then be read by the controlling GSP of the SPROC. After the word is read, the entire sequence repeats until all of the desired information stored in the EPROM is read into the SPROC.

Where the master SPROC is acting to boot up slave SPROCs as well as itself, the master SPROC follows the same boot-up procedure just described. However, upon the host port 800 receiving information in the master mode receive register 867 which is bound for a slave SPROC as determined from information previously obtained from the EPROM, the master SPROC causes that data to be written to the host bus 165 (via bus 125, GSP 400, bus 125 again, register 834 . . . as previously described) along with a sixteen bit address generated by the GSP 400 and sent to address output register 855 and then onto lines A0–A11, and S0–S3. In this manner, the data is forwarded to the appropriate SPROC so that it may be booted in a slave mode. It will be appreciated by those skilled in the art, that if the EPROM is wide enough to contain data and address information, that information can be written to host bus 165 and read directly by a slave SPROC or other device outside the memory space of the master SPROC.

Because external memories vary in speed, the host port 800 is provided with a wait state generator 870 which can lengthen the read or write strobe generated by strobe generator 865. The host port 800 is also provided with a host interface controller 880 which is essentially distributed circuitry which controls the internal timing of the host port 800.

A.1 Functional description of The Parallel Port

The parallel port (PPORT0) is a 24-bit asynchronous, bidirectional port with a 16-bit (64K) address bus. The port allows for 8-, 16-, or 24-bit parallel data transfers between the SPROC chip and an external controller, memory-mapped peripheral, or external memory. The port has programmable WAIT states to allow for slow memory access. A data acknowledge signal is also generated for this interface.

Two operating modes—master and slave—allow the SPROC chip to operate either as a system controller (master mode), or as a memory-mapped peripheral to an external controller (slave mode). An input pin, MASTER, is dedicated to setting master or slave mode operation. In master mode, the SPROC chip automatically up-loads its configuration program from an external 8-bit PROM into internal RAM, at the initiation of boot. In slave mode, the chip relies on an external controller for its configuration.

A system using multiple SPROC chips should have a single bus controller. This may be an external controller or a master SPROC chip. All other SPROC chips in the system should be configured in slave mode. The bus controller should individually enable the chip select input, $\overline{CS}$, of each slave SPROC chip while the slave chip is being configured.

The 16-bit address field (ADDRESS[15:0]) supports up to 16 SPROC chips interconnected in the same system.

The external controller, memory-mapped peripheral, or memory may communicate with a SPROC chip in 8-, 16-, or 24-bit format. Format selection is accomplished with the MODE[2:0] pins. In 8- or 16-bit formats, the data may be most significant (msb) or least significant (lsb) byte or word first. In 16- and 24-bit modes, data is preferably always msb-justified within the word being transferred, and the lsb byte is zero-filled for 32-bit data transfer (i.e., in the second 16-bit word). To accommodate 8- and 16-bit modes, two extended address bits are included. These bits (EADDRESS [1:0]) are located at the lsb-end of the address bus. In master mode, these are driven output lines. In slave mode, they are configured as inputs and are driven by the external controller.

The following subsections describe data transfers via the parallel port for different sources and destinations. In all types of parallel port data transfers, signal values at the slave SPROC chip's mode (MODE[2:0]) and address (ADDRESS [15:0]) inputs must be stable before the chip select ($\overline{CS}$) and read ($\overline{RD}$), or chip select and write ($\overline{WR}$) request goes LOW. At that time, the address is latched into the slave SPROC chip. Subsequently, after values on the data bus (DATA [23:0]) become valid, data is latched at the destination on the rising edge of the request.

To allow asynchronous communication with slow peripherals in master mode, the parallel port supports programmable WAIT states. In a preferred embodiment, a maximum of seven WAIT states are possible, where each state corresponds to one SPROC chip machine cycle, or five master clock pulses.

The parallel port also generates a handshaking signal, $\overline{DTACK}$ (data transfer acknowledge) in slave mode. This normally-HIGH signal goes LOW when the SPROC chip presents valid data in a read operation, or is ready to accept data in a write operation. $\overline{DTACK}$ is cleared when the external $\overline{RD}$ or $\overline{WR}$ strobe goes HIGH.

If enabled, a watchdog timer monitors all data transfers, and resets the parallel port if the transaction time is greater than 256 machine cycles.

A.2 Master SPROC Chip Read from Slave SPROC Chip or Peripheral

A master SPROC chip initiates a read operation from a memory-mapped peripheral or external memory by reading an off-chip memory location. Prior to initiating the READ, the master SPROC chip should set up the communication mode. This includes 8-, 16-, or 24-bit data select, msb/lsb byte order, and number of WAIT states required for the peripheral. The master's internal parallel port mode register controls these options, and therefore should have been previously written to. In master mode, three bits of the parallel port mode register determine number and order of bytes transferred and are output at pins MODE[2:0]. These pins should be connected to the corresponding slave SPROC chip pins, which function as inputs in slave mode, to ensure the slave's communication mode matches the master's.

After a read cycle is initiated by the master SPROC chip, no further read or write requests to the parallel port are possible until the current read cycle has been completed. The parallel port will set up a stable address and then drive the $\overline{RD}$ strobe LOW. The strobe will remain LOW for the number of WAIT states configured in the master's parallel port mode register, and will then be driven HIGH. The data resident on the data bus will be latched into the master SPROC chip on the rising edge of the $\overline{RD}$ strobe.

If the transmission mode is 8- or 16-bit format, the read cycle will be repeated with the next extended address output, as determined by the state of EADDRESS[1:0], until 24 bits of data have been received. The master's parallel port input register is then updated, and the read cycle is complete. The GSP in the master that initiated the read operation must then read the contents of the parallel port input register. With the read cycle completed, the data bus I/O drivers will be reconfigured as output drivers to prevent the data bus from floating. The address bus will be driven with the last address.

A.3 Master SPROC Chip Write to Slave SPROC Chip or Peripheral

A master SPROC chip initiates a write operation to a memory-mapped peripheral or external memory by writing to an off-chip memory location. Prior to initiating the WRITE, the master SPROC chip should set up the communication mode. This includes 8-, 16-, or 24-bit data select, msb/lsb byte order, and number of WAIT states required for the peripheral. The master's internal parallel port mode register controls these options, and therefore should have been previously written to. In master mode, three bits of the parallel port mode register determine number and order of bytes transferred and are output at pins MODE[2:0]. These pins should be connected to the corresponding slave SPROC chip pins, which function as inputs in this mode, to make the slave's communication mode match the master's.

After a write cycle is initiated by the master SPROC chip, in the preferred embodiment no further read or write requests to the parallel port are possible until the current write cycle is complete. The parallel port will output a stable address and then drive the $\overline{WR}$ strobe LOW. The strobe will remain LOW for the number of WAIT states configured in the master's parallel port mode register. Valid data will be setup on the data bus, and the $\overline{WR}$ strobe will be driven HIGH after the WAIT interval, latching the data into the slave SPROC chip or peripheral. If the interface is configured in 8- or 16-bit mode, the cycle will be repeated until all bytes have been output. After transmission of the last byte or word, the address bus and data bus will remain driven.

A.4 Read from Slave SPROC Chip by an External Controller

The external controller will set up address, extended address, and mode inputs, and drive the SPROC chip's chip select input LOW. (If the communication mode will never change, the SPROC chip's MODE[2:0] inputs could be tied to the appropriate logic levels.) The external controller will then drive $\overline{RD}$ LOW, which will latch the address, extended address (EADDRESS[1:0]), and mode inputs into the slave SPROC chip. The SPROC chip will asynchronously fetch data from the requested internal RAM location. Data will be latched into the external controller when it drives the $\overline{RD}$ line HIGH again. The controller must ensure that enough time has been given to the slave SPROC chip to fetch the data, given the asynchronous nature of the interface. Alternatively, the SPROC chip drives its normally-high $\overline{DTACK}$ (data transfer acknowledge) LOW after it has completed the READ, and the controller need only wait for this event before raising \X\XTO(RD). At that time, the SPROC chip would correspondingly raise $\overline{DTACK}$.

If the interface is configured for 8- or 16-bit communication, the external controller must set up multiple extended addresses and $\overline{RD}$ strobes.

A.5 Write to Slave SPROC Chip by an External Controller

The external controller will set up address, extended address, and mode inputs, and drive the SPROC chip's chip select input LOW. (If the communication mode will never change, the SPROC chip's MODE[2:0] inputs could be tied to the appropriate logic levels.) The external controller will then drive $\overline{WR}$ LOW, which will latch the address, extended address, and mode inputs into the slave SPROC chip. When the controller returns $\overline{WR}$ to HIGH, the data present on the data bus will be latched into the SPROC chip.

If the interface is configured for 8- or 16-bit communication, the external controller must set up multiple extended addresses and $\overline{WR}$ strobes.

After the final byte or word has been transferred, the data will be asynchronously written to the requested address in SPROC chip RAM.

A.6 Data Transfer Modes

MODE[0] and MODE[1] determine the number of bytes transferred per $\overline{RD}/\overline{WR}$ strobe. MODE[0] distinguishes between a partial word of 8- or 16-bits, and a full 24-bit word. MODE[1] distinguishes between the partial transfers of 8- and 16-bits. All data transfers are aligned with the least significant byte of the data bus. For 16- and 24-bit modes, the most significant byte is left-justified within the data word, with descending order of significance in lower order data bus bytes.

| MODE[1] | MODE[0] | DATA |
|---------|---------|--------|
| 0 | 0 | 8-bit |
| 1 | 0 | 16-bit |
| X | 1 | 24-bit |

| MODE[2] | BYTE/WORD ORDER |
|---------|-----------------|
| 0 | msb first |
| 1 | lsb first |

EADDRESS[1,0], the extended address, specifies which portion of the full 24-bit word is currently being output on the data bus for 8- and 16-bit modes:

| EADDRESS[1] | EADDRESS[0] | BYTE |
|-------------|-------------|------|
| 8-BIT MODE, MODE[2]=0 | | |
| 0 | 0 | msb |
| 0 | 1 | mid |
| 1 | 0 | lsb |
| 1 | 1 | unused (write) 0 byte (read) |
| 8 BIT MODE, MODE[2]=1 | | |
| 0 | 0 | unused (write) 0 byte(read) |
| 0 | 1 | lsb |
| 1 | 0 | mid |
| 1 | 1 | msb |

In receive data mode, the lower byte of the lsb 16-bit word is unused by the SPROC chip. Similarly, in transmit mode, the lower byte of the lsb 16-bit word is filled with zeros. All data is msb-justified. The word ordering for 16-bit data is determined by EADDRESS[1]:

| EADDRESS[1] | EADDRESS[0] | WORD |
|---|---|---|
| 16 BIT MODE, MODE[2]=0 | | |
| 0 | X | msb |
| 1 | X | lsb |
| 16 BIT MODE, MODE[21]=1 | | |
| 0 | X | lsb |
| 1 | X | msb |

Data transfer in 8- and 16-bit modes is completed when the EADDRESS lines designate the final byte or word, namely, the lsb when MODE[2] is LOW, or the msb when MODE[2] is HIGH.

A.7 Boot Mode

A SPROC chip enters boot mode when it is configured as a master SPROC chip (its MASTER input is HIGH) and the reset input (RESET) executes a LOW to HIGH transition. During boot, the parallel port is set for 8-bit mode with the maximum number of WAIT states (seven). The master SPROC chip runs an internal program, stored in its control ROM, to upload its configuration from an external 8-bit EPROM into internal RAM. The master SPROC chip will then configure any slave SPROC chips present in the system. The EPROM will be selected by a HIGH on the master SPROC chip's chip select (CS) pin, which is an output in master mode. Slave SPROC chips or memory-mapped peripherals will be selected by a LOW at this signal. In master mode, the value of the CS output is controlled by a bit set in the transmit mode register, which is the second byte of the parallel port mode register.

A.8 Watchdog Timer

The parallel port incorporates a simple watchdog timer circuit to prevent any undesirable lockup states in the interface. In both master and slave modes, a read or a write flag is set (in the parallel port status register) on the initiation of a read or write operation. This flag is reset on a successful completion of the operation. If, for some reason, the host controller hangs-up in slave mode, or an invalid condition occurs in master mode, the watchdog timer will detect the situation and clear the interface flags, allowing the next operation to be accepted and executed. The watchdog timer is fixed at 256 machine cycles (1280 master clock cycles).

The watchdog timer is enabled by setting bit 16 of the parallel port mode register. SPROC reset will disable the watchdog timer. If the watchdog timer is triggered, a flag is set in the parallel port status register.

A.9 Multiple I/O Lockout

If the parallel port is performing a read or write operation in master mode, and a second write or read operation is initiated before the first I/O operation is completed, the second I/O request is locked out. A lockout flag is set in the parallel port status register.

A.10 Input/Output Flags and Lines

The RTS and GPIO signals can be used for communication protocols between master and slave SPROC chips. These signals could be used as data-ready signals, requests for data, or microprocessor interrupt requests.

RTS[3:0] (request to send) are four pins that function as inputs for a master SPROC chip and as outputs for a slave SPROC chip. The RTS signals of a slave SPROC can be individually set or cleared via the parallel port, as described below.

GP[3:0] are four general purpose pins that are individually configurable as either inputs or outputs. During reset, when RESET is LOW, all GPIO signals are set up as inputs. In addition to being subject to internal program control, the configuration of each GP pin, and the value of each GPIO signal configured as an output, are also individually controllable via the parallel pore A.11 Parallel Port Registers The parallel port utilizes five memory-mapped registers for status and control functions. The tables below list the registers and their bit definitions.

| Parallel Port Registers | | |
|---|---|---|
| REGISTER ADDRESS | REGISTER NAME | READ/WRITE |
| 4FB | Lockout and watchdog flag clear | write |
| 4FC | Parallel port status register | read |
| 4FD | Parallel port input register | read |
| 4FE | Parallel port GPIO/RTS control register | write |
| 4FF | Parallel port mode register | write |

| Parallel Port Register Bit Definitions | | | |
|---|---|---|---|
| BIT | REGISTER 4FC | REGISTER 4FE | REGISTER 4FF |
| 0 | GP[0] INPUT | SETRTS[0]; | RX MODE[0] |
| 1 | GP[1] INPUT | SET RTS[1] | RX MODE[1] |
| 2 | GP[2] INPUT | SET RTS[2] | RX MODE[2] |
| 3 | GP[3] INPUT | SET RTS[3] | RX WAIT STATES [0] |
| 4 | MODE[0] | CLEAR RTS [0] | RX WAIT STATES [1] |
| 5 | MODE[1] | CLEAR RTS [1] | RX WAIT STATES [2] |
| 6 | MODE[2] | CLEAR RTS [2] | RX STROBE DELAY |
| 7 | PARALLEL PORT BUSY FLAG | CLEAR RTS[3] | PARALLEL PORT SOFT RESET |
| 8 | LOCK OUT FLAG | SET GPIO[0] | CS (master mode only) |
| 9 | WATCHDOG FLAG | SET GPIO[1] | TX MODE[0] |
| 10 | READ FLAG | SET GPIO[2] | TX MODE[1] |
| 11 | WRITE FLAG | SET GPIO[3] | TX MODE[2] |
| 12 | RTS[0] INPUT | CLEAR GPIO[0] | TX WAIT STATES [0] |
| 13 | RTS[1] INPUT | CLEAR GPIO[1] | TX WAIT STATES [1] |
| 14 | RTS[2] INPUT | CLEAR GPIO[2] | TX WAIT STATES [2] |
| 15 | RTS[3] INPUT | CLEAR GPIO[3] | TX STROBE DELAY |
| 16 | N/A | OUTPUT GPIO[0] | WATCHDOG ENABLE |
| 17 | N/A | OUTPUT GPIO[1] | N/A |
| 18 | N/A | OUTPUT GPIO[2] | N/A |
| 19 | N/A | OUTPUT GPIO[3] | N/A |
| 20 | NA/ | INPUT GPIO[0] | N/A |
| 21 | N/A | INPUT GPIO[1] | N/A |
| 22 | N/A | INPUT GPIO[2] | N/A |
| 23 | N/A | INPUT GPIO[3] | N/A |

The parallel port status register, a 16-bit register, contains signal values of selected SPROC chip pins and I/O status flags. This register is updated every machine cycle (5 master clock cycles). Bits 0 through 3 contain the current signal values at the GP pins, which could individually be configured either as inputs or outputs. Similarly, bits 12 through 15 contain the current values at the RTS pins, which are inputs for a master SPROC chip and outputs for a slave. Bits 4 through 6 contain the current value of the MODE configuration.

Parallel port status register bit 10 contains the read flag, which is set while the parallel port is performing a read operation. Similarly, bit 11 contains the write flag, which is set during a write operation. (For 8- and 16-bit modes, these flags remain set until the entire 24-bit data word has been transferred.)

Bit 7 is set while the parallel port is busy servicing an I/O transaction. Bit 8 is set if the parallel port is busy in master mode and another read or write request is received. The second request will be locked out and the lockout flag set. Bit 9 is set if the watchdog timer is enabled and it detects a timeout out condition. Bits 8 and 9 can only be cleared by a SPROC reset or any write to the lockout and watchdog flag clear register.

Any write to the Watchdog/Lockout Flag Clear Register clears watchdog and/or lockout flags set in the parallel port status register.

The parallel port input register, a 24-bit register, holds the data word received during a read operation for subsequent storage at the destination address. This register also buffers and assembles the incoming data for 8- and 16-bit modes. This register must be read by a GSP or the access port.

The parallel port GPIO/RTS Control register, a 24-bit register, is used to independently configure each GP pin as either an input or an output. It is also used to individually set and clear GP pins that are outputs, and slave SPROC chip RTS pins.

Each RTS or GPIO signal has a dedicated 15air of SET and CLEAR bits in the parallel port GPIO/RTS control register. SET and CLEAR bits for RTS signals are in the low byte; SET and CLEAR bits for GPIO signals are in the mid byte. LOW values written to both SET and CLEAR bits results in no change to the associated signal. A HIGH value at the SET bit sets the associated signal HIGH. A HIGH value at the CLEAR bit sets the associated signal LOW. If a HIGH value is written to both SET and CLEAR bits, the CLEAR dominates.

Each GPIO signal additionally has a dedicated pair of OUTPUT and INPUT bits in the high byte of the parallel port GPIO/RTS control register to configure the signal as either an output or an input. LOW values written to both OUTPUT and INPUT bits results in no change to the associated signal. A HIGH value at the OUTPUT bit configures the associated GPIO signal as an output. A HIGH value at the INPUT bit configures the associated GPIO signal as an input. If a HIGH value is written to both OUTPUT and INPUT bits, the INPUT dominates.

The master SPROC chip's parallel port mode register, a 16-bit register, controls the parallel port mode and timing.

When the master SPROC chip is reading from a slave SPROC chip or peripheral, bits 0 through 2 of the parallel port mode register (the RX MODE bits) are output at the master SPROC chip's MODE pins. Register bits 3 through 5 contain the number of WAIT states programmed for the read operation (i.e., they determine the duration of the read strobe LOW level generated by the master SPROC chip). The HIGH level between read strobes is 2 master clock cycles; this duration can be stretched to 5 master clock cycles for slower peripherals by setting bit 6 of the mode register (the RX strobe delay bit).

Similarly, when the master SPROC chip is writing to a slave SPROC chip or peripheral, bits 9 through 11 of the parallel port mode register (the TX MODE bits) are output at the master SPROC chip's MODE pins. Register bits 12 through 14 contain the number of WAIT states programmed for the write operation. The HIGH level between write strobes can be stretched for slower peripherals by setting bit 15 of the mode register (the TX strobe delay bit).

Bit 8 of the mode register is output at the master SPROC chip's $\overline{CS}$ pin. A soft reset of the parallel port, which resets the interface flags and RTS lines (but not the GPIO or MODE signals), can be initiated by setting bit 7 of this register.

| | Parallel Port Signal Definitions | |
|---|---|---|
| SIGNAL | TYPE* | DESCRIPTION |
| ADDRESS[15:0] | O(M) I(S) | ADDRESS BUS |
| BUSGRANT | I | BUS GRANT causes the SPROC chip to three-state the address and data buses, and MODE pins, when LOW. |
| BUSY | O | PARALLEL PORT BUSY is set LOW when an I/O operation is occurring, set HIGH when completed. Also reset HIGH by watchdog timer if a timeout occurs. |
| CRESET | | Tied LOW. |
| $\overline{CS}$ | O(M) I(S) | CHIP SELECT signal. A slave SPROC chip is selected by setting its $\overline{CS}$ input LOW. A master SPROC chip generates this signal as an output, expecting to select a slave SPROC chip by setting $\overline{CS}$ LOW, and an external ROM (containing every slave SPROC chip's configuration) by setting it HIGH. |
| DATA[23:0] | I/O | PARALLEL PORT DATA BUS—24-bit input/output/three-statable bidirectional bus. |
| $\overline{DTACK}$ | O | DATA TRANSFER ACKNOWLEDGE. In slave mode, set LOW by SPROC chip after $\overline{RD}$ or $\overline{WR}$ has gone LOW and the SPROC chip has completed the data transfer, set HIGH after $\overline{RD}$ or $\overline{WR}$ line goes HIGH. This output is always HIGH for a master SPROC chip. |
| EADDRESS[1:0] | O(M) I(S) | EXTENDED ADDRESS specifies which portion of the full 24-bit word is currently being transferred in 8- and 16-bit modes. |
| GP[3:0] | I/O | GENERAL PURPOSE I/O lines, individually |

| Parallel Port Signal Definitions | | |
|---|---|---|
| SIGNAL | TYPE* | DESCRIPTION |
| | | configurable as either input or output. Can be used to interface SPROC chips with each other or with an external controller as data-ready, microprocessor interrupt requests, etc. Controlled and configured by a write to parallel port GPIO/RTS control register. |
| MASTER | I | MASTER causes SPROC chip to operate in master mode when HIGH, and in slave mode when LOW. |
| MODE[2:0] | O(M) I(S) | MODE[0] differentiates between full 24-bit mode (HIGH) and partial (8- or 16-bit) modes (LOW). MODE[1] differentiates between 8-bit mode (HIGH) and 16-bit mode (LOW) for partial data transfers. MODE[2] specifies whether the first 8- or 16-bit transmission contains the lsb (HIGH) or the msb (LOW). |
| $\overline{RED}$ | | Tied LOW. |
| $\overline{RD}$ | O(M) I(S) | READ strobe generated by master SPROC chip or external controller. A LOW value on $\overline{RD}$ initiates a READ operation. $\overline{RD}$ must remain LOW long enough to successfully complete the READ; programmed WAIT states or $\overline{DTACK}$ handshaking may be utilized for this purpose. Data latches at the destination when $\overline{RD}$ returns HIGH. |
| $\overline{RESET}$ | I | RESET must be held LOW for a minimum of 25 master clock cycles. after power and clock have stabilized. This input is a Schmitt trigger type which is suitable for use with an RC time constant to provide power-on reset. While $\overline{RESET}$ is LOW, a master mode SPROC chip will force address, extended address, and SPROC select address LOW, while driving $\overline{CS}$, $\overline{RD}$, and $\overline{WR}$ HIGH. Slave SPROC chips connected to the bus will then be deselected and have driven inputs. MODE[2:0] will be configured for 8-bit boot mode with msb byte first and zero WAIT states. The data bus will be driven. |
| RTS[3:0] | I(M) O(S) | REQUEST TO SEND flags. These pins are outputs for slave SPROC chips and inputs for master SPROC chips. Can be used to interface slave with master or external controller as data-ready, microprocessor interrupt requests, etc. Controlled and configured by write to parallel port GPIO/RTS control register. |
| $\overline{WR}$ | O(M) I(S) | WRITE strobe generated by master SPROC chip or external controller. A LOW value on $\overline{WR}$ initiates a WRITE operation. $\overline{WR}$ must remain LOW long enough to successfully complete the WRITE; programmed WAIT states or $\overline{DTACK}$ handshaking may be utilized for this purpose. Data latches at the destination when $\overline{WR}$ returns HIGH. |

*(M) = master mode, (S) = slave mode, I = input, O = output

While the SPROC 10 aforedescribed with a data RAM 100, a program RAM 150, a boot ROM 190, GSPs 400, DFMs 600, serial ports 700, and a host port 800, is a powerful programmable signal processor in its own right, it is preferable that the SPROC be able to be programmed in a "user friendly" manner. Toward that end, a compiler system which permits a sketch and realize function is provided, as described more particularly with reference to FIG. 12. In addition, an access port 900 and a probe 1000 are provided as tools useful in the development mode of the SPROC device.

Figure 9:
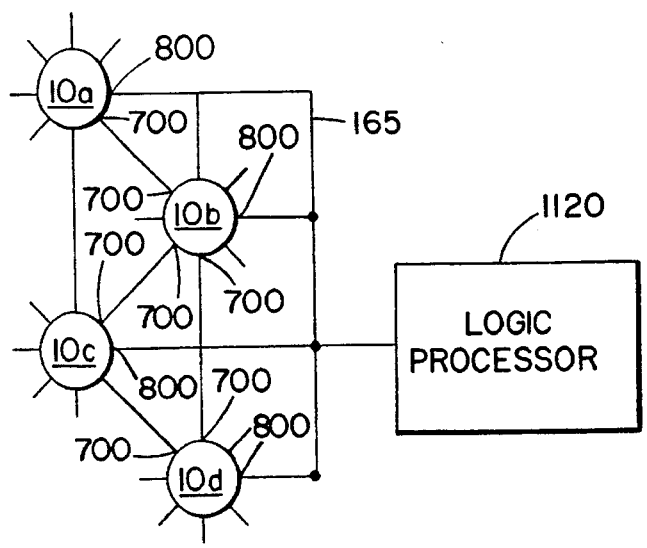
FIG. 9 is a simplified diagram illustrating the coupling of a plurality of SPROC devices of the invention into a system acting as the front end to a logic processor.

As aforementioned, the access port 900 permits the user to make changes to the program data stored in RAM 150, and/or changes to other data stored in data RAM 100 while the SPROC is operating. In other words, the access port 900 permits memory contents to be modified while the SPROC is running. In its preferred form, and as seen in FIG. 9, the access port 900 is comprised of a shift register 910, a buffer 920, a decoder 925, and a switch 930 on its input side, and a multiplexer 940 and a parallel load shift register 950 on its output side. On its input side, the access port 900 receives serial data as well as a clock and strobe signal from the development host computer. The data is arranged by the shift register 910 and stored in buffer 920 until the access port is granted time division access to the data RAM bus 125 or the program RAM bus 155. A determination as to which bus the data is to be written is made by decode block 925 which decodes the msbs of the address data stored in buffer 920. The decode block 925 in turn controls switch 930 which connects the buffer 920 to the appropriate bus. The msbs of the address data in the buffer 920 are indicative of which RAM for which the data is destined, as the data RAM and program RAM are given distinct address spaces, as previously described.

On the output side, data received via the program RAM bus 155 or the data RAM bus 125 is forwarded via demultiplexer 940 to a shift register 950. The shift register 950 effects a parallel to serial conversion of the data so that serial data may be output together with an appropriate strobe and according to an external clock to a development host computer or the like.

By providing the ability to write and read data to the program and data RAMs, the access port 900 has several uses. First, by writing to a particular location (e.g. 406, or 408-40*b* Hex) in the data RAM, a program break can be initiated. The contents of the various registers of the GSPs which are written into data RAM as a result of the break can than be read. This information is particularly important in the debugging process. Second, if desired, the contents of the registers of the GSPs (as stored in the data RAM) can be modified prior to exiting the break mode by writing data to desired data RAM locations, thus providing an additional tool in the debugging process. Third, if desired, the program (including microinstructions and/or parameters stored as part of microinstructions) stored in the program RAM itself can be altered "on the fly", and can provide the developer with the ability to monitor (in conjunction with the probe 1000 hereinafter described) how a change in a parameter(s) or a change in the program could effect the functioning of the SPROC.

The probe 1000 seen in FIG. 8 permits the user to see internal signals generated by the SPROC by monitoring the data RAM bus 125 and capturing the values of data written to one or more data RAM locations. The probe 1000 is generally comprised or a comparator 1010, a DFM 1060 with an input section 1060a and an output section 1060b, and a digital to analog converter 1070. The comparator 1010 is programmable such that any data RAM address may be monitored. The data RAM address is monitored by coupling the comparator 1010 to the data RAM bus 125 and comparing via XNOR gates (not shown) the programmed address to the addresses placed on the bus. When the addresses match, and it is determined that data is being written to the data RAM as opposed to being read from the data RAM, the data is read into the input DFM section 1060a which stores the data until the probe is granted access for writing data to the data RAM 100. At that time, the probe 1000 writes the data to its own buffer in the data RAM. When the probe 1000 is granted access for reading data from the data RAM 100, the output DFM section 1060b of the data probe 1000 pulls the data from its data RAM buffer at the speed set by the output DFM section's divide by N block. The data is then forwarded to the D/A converter 1070 where it is converted into analog format so that it can be viewed on an oscilloscope. In this manner, signals which are being written to any data RAM location may be monitored in real time as desired. By using the access port 900 and the probe 1000 together, the affect of a change of a parameter value entered via the access port 900 may be immediately viewed as an analog signal via probe 1000. Additional details of the probe may be seen with reference to previously incorporated Ser. No. 07/663,395.

As seen in FIG. 9, a plurality of SPROC devices 10a, 10b, 10c, . . . may be coupled to together as desired to provide a system of increased signal processing capabilities. Typically, the SPROC devices are coupled and communicate with each other via their serial ports 700, although it is possible for the SPROCs to communicate via their parallel host ports 800. The system of SPROCs can act as a powerful signal processing front end to a logic processor (e.g., microprocessor) 1120, or if desired, can interface directly with electromechanical or electronic components.

B. SPROC Development System and Software

The above-disclosed SPROC devices 10 are preferably programmed via a development system (SPROClab). The SPROClab development system is a complete set of hardware and software tools for use with a PC to create, test, and debug digital signal processing designs. It was created as a design tool to support the development of code for the SPROC signal processing chip.

B.1 Overview

The development system provides an interactive design environment to create processing subsystems in graphical form, as signal flow diagrams, and implement those subsystems easily and efficiently on the SPROC chip. Using the system, one can develop efficient signal processing subsystems without having to manually write code or lay out and tune analog circuits.

Together with a PC and oscilloscope or other verification equipment, the development system supports the entire development process, including interactive debugging and design verification. Once the designer completes design development, the designer can easily include the signal processing subsystem in the actual application using a SPROC chip and the code generated by the development system.

The preferred process of programming a SPROC is as follows. The designer must first define the signal processing application and determine design requirements. The design is then preferably placed by the designer in a signal flow diagram (using a graphic user interface). Parameters for the various blocks of the design are defined by the designer, including parameters of filters (e.g., low-pass or high pass, and cut-off frequency) and, if desired, transfer functions. Once the signal flow diagram and parameters of the blocks in the signal flow diagram are set, the diagram and parameters are automatically converted into code by the software.

The development system's SPROCview graphical design interface enables a simple graphical approach to design capture. Capturing the design consists of entering the design as a signal flow diagram. To enter the diagram, the designer arranges and connects icons that represent processing functions into a schematic diagram defining the signal flow of the system. As the designer selects and places the icons, certain variables and parameters must also be entered that define how the functions represented by the icons will operate. For example, if a design includes an amplifier function, its gain value must be specified.

Some functions, like filters and transfer functions, are too complex to be defined using simple parameters. For these functions, one must create a separate data file that includes the detailed definition of the function. When using a filter or a transfer function in a diagram, one must enter a parameter to identify the data file that contains the definition of the function.

The schematic diagram and its associated definition data files are the representation of the design upon which all other steps of the process build. The designer should consider them the base record of the design, and always make sure they are current.

In designs that include filters or transfer functions, the designer must create the data files that specify the definition of the functions. The SPROCfil filter design interface provides an interactive environment for designing filters. The designer must define transfer functions using a text editor.

After the designer captures the design and defines any necessary filters or transfer functions, the diagram and definition data files must be convened into code and a configuration file must be generated to run on the chip. The SPROCbuild utility completes this for the designer by automatically convening the diagram and data files into code, scheduling and linking the code, and generating a configuration file for the chip.

Each time the designer modifies the diagram or the definition data files, the files must be converted again to produce an up-to-date configuration file.

To debug a design, the designer must transfer the configuration file onto the chip and run the design. The SPROCdrive interface (SDI) allows one to write the configuration to the chip and begin design execution. Using SDI, the designer can evaluate design performance by accessing the value of data in chip memory. If the development system is connected to an oscilloscope, one can view the waveforms represented by this data. If the development system is connected to a target analog subsystem, one can see how the design performs in the actual application.

To optimize the design, the designer can modify the values of data and observe the corresponding changes in design performance. If the development system is connected to a signal generator, one can simulate various input signals and evaluate how the design reacts.

Changes made to design parameters using SDI are temporary. The designer must modify the schematic diagram and/or definition data files, then convert the files again and generate a new configuration file to make design modifications permanent.

Once the designer has debugged and optimized the design, modified the diagram, and generated the final configuration fie, the signal processing design can be ported for use in the end application.

If the application is to run from a self-booting chip, the configuration file can be used to burn an EPROM, and the chip and its EPROM can be placed on a specific printed circuit board.

If the application is to run from a microprocessor, the SPROClink microprocessor interface (SMI) helps the designer develop a microprocessor application that can use the signal processing design. The designer must generate a special version of the configuration file, create the microprocessor application, and memory map the chip into the microprocessor configuration.

The development system comprises both hardware and software tools designed to help the designer complete the development process. The tools are designed in parallel with the SPROC chip to extract maximum efficiency and performance from the chip without compromising ease-of-use.

The development system includes hardware and software. The hardware components are described as follows:

The SPROCboard evaluation board is a printed circuit board with one SPROC chip, digital-to-analog and analog-to-digital converters, and various communications interfaces and additional components and circuitry necessary to evaluate signal processing design performance during development. The designer can connect an oscilloscope, signal generator, or analog subsystem to the evaluation board to verify and evaluate the design. The SPROCbox interface unit provides an I/O connection between the SPROCboard evaluation board and the PC. It also connects the evaluation board to the power supply unit. The power supply unit converts AC power from a standard wall outlet to 5 VDC and 12 VDC power for use by the interface unit and evaluation board. An RS-232 cable connects the PC serial I/O port to the SPROCbox serial I/O port. A special access port cable connects the SPROCbox interface unit to the SPROCboard evaluation board. A security key connects to the PC parallel port. It enables use of the development system software. An integral power cord connects the power supply unit to the AC outlet. A positive-locking DC power cable connects the power supply to the SPROCbox interface unit. An auxiliary DC power cable daisy chains power from the interface unit to the SPROCboard evaluation board.

The software components of the development system are described as follows:

The SPROClab development system shell executes under MS-DOS and provides access to all development system software components from a selection menu. The shell controls function calls among development system software components and provides a means for the designer to change certain system defaults. The SPROCview graphical design interface provides for easy creation of signal flow block diagrams by supporting the import of designs created using several common schematic capture packages. The basic development system configuration supports version 4.04 of OrCAD software and its schematic capture tool, Draft.

The graphical design interface includes the library structure required to use the SPROCcells function library with OrCAD software. The SPROCcells function library includes cells containing DSP and analog signal processing functions for use in diagram creation. A cell is a design primitive that includes an icon required to place a function in a signal flow diagram, the code required to execute the function, and specifications for the parameters required to define the cell. The SPROCfil filter design interface supports the definition and analysis of custom digital filters. The filter design interface creates the custom code and definition data for filter cells placed in designs during diagram entry. The SPROCbuild utility converts signal flow block diagrams and their associated data files into the configuration file necessary to run on the chip. The utility interprets the output from schematic entry and incorporates associated code blocks and parameter data for cells, filter design definitions, and transfer function definitions, then schedules and links the instructions to best utilize resources on the chip. It automatically generates efficient code based on the designer's signal flow block diagram.

The SPROCdrive interface (SDI) loads the configuration file onto the chip and starts execution. SDI commands give the designer access, through the SPROCbox interface unit, to interactively test and debug the design while it runs on the chip. One can probe and modify signal values and design parameters to tune and optimize the processing subsystem.

B.1.1 The SPROCcells Function Library

The SPROCcells function library contains over fifty predefined functions which can be used through the graphical interface of the SPROClab development system. Some cells have predefined trigger keys that aid in defining cell parameters for designs captured using OrCAD® software. Most cells include code for both inline and subroutine forms. The subroutine form of a cell performs a function identical to the corresponding inline form but includes overhead instructions that make the code in the subroutine body block re-entrant. Other subroutine versions of the cell do not include the code in their body blocks, but call the code in the body block of the first subroutine version of the cell.

Several cells, including those used for microprocessor access, are described in detail below with reference to function, algorithm, terminals, parameters, macro keys, execution rime, resource usage, and icon. The function provides a brief description of the operations or calculations performed by the cell. The algorithm (where applicable) details the methodology used to implement the cell function. Terminals are the inputs and outputs for a cell. Each terminal is associated with a pin number on the cell's icon. The variable type, range of legal values, and default value are provided for each terminal. Parameters are specifications that define the function of a particular instance of a cell. Parameter names and default values (where applicable) are provided for each cell. Parameter descriptions use the exclusive OR character (I) in listings of legal parameter values. This character indicates that only one of the listed choices may be used. Execution time is the maximum number of instruction cycles required to complete the code for a cell instance. Execution time differs for the in-line form and subroutine form (where applicable) of each cell. Resource usage is the number of memory locations required by the cell. Resources include program memory allocations for instructions and data memory allocations for variables. Resource usage differs for the in-line form and subroutine form (where applicable) of each cell. Each cell is represented in the graphical display as an icon. Other examples of cell icons can be seen in FIG. 11 discussed in detail below. Source code for several of the cells described below is attached to disclosure of U.S. Pat. No. 5,287,511 as appendix B and incorporated herein by reference.

CMULT

Function: The complex multiplier cell performs multiplication of the form: $i+jq=(x+jy)^*(\cos +j\sin)=(x^*\cos-y^*\sin)+ j(x^*\sin+y^*\cos)$

| Terminals: | |
|---|---|
| pin 1: i | $-2.0 <=$ output $< 2.0$ (fixed point format) |
| pin 2: q | $-2.0 <=$ output $< 2.0$ (fixed point format) |
| pin 3: x | $-2.0 <=$ input $< 2.0$ (fixed point format) |
| pin 4: y | $-2.0 <=$ input $< 2.0$ (fixed point format) |
| pin 5: cos | $-2.0 <=$ input $< 2.0$ (fixed point format) |
| pin 6: sin | $-2.0 <=$ input $< 2.0$ (fixed point format) |
| Parameters: | |
| Required: | none |
| Optional: | subr = off I on (default is determined by the Schedule module) |
| OrCAD Macro Keys: None defined | |
| Execution Time: | |
| In line: | code duration is 16 cycles maximum |
| Subroutine: | code duration is 22 cycles maximum |
| Resource Usage: | |
| In line: | 16 program RAM locations |
| | 6 data RAM locations |
| Subroutine: | (5 * #_of_instances) + 17 progam RAM locations |
| | (11 * #_of_instances) data RAM locations |
| Icon: | |

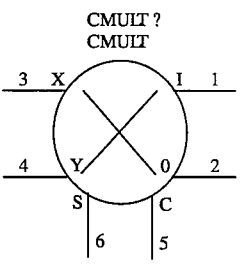

DSINK

Function: The dsink cell accumulates two series of input samples (each size determined by the length parameter) into two blocks of data RAM. The blocks are stored beginning at symbolic location 'instance_name.outvector1' and 'instance_name.outvector2'. Both blocks (vectors) are accessible from an external microprocessor.

| Terminals: | |
|---|---|
| pin 1: ina | $-2.0 <=$ input $< 2.0$ (fixed point format) |
| pin 2: inb | $-2.0 <=$ input $< 2.0$ (fixed point format) |
| Parameters: | |
| Required: | none |
| Optional: | length = 1 <= length <= 256 (default: length = 128) |
| | subr = off I on (default is determined by the Schedule module) |
| OrCAD Macro Keys: <ALT> K | |
| Execution Time: | |
| In line: | code duration is 10 cycles maximum |
| Subroutine: | code duration is 17 cycles maximum |
| Resource Usage: | |
| In line: | 10 program RAM locations |
| | 2*length + 3 data RAM locations |
| Subroutine: | (4* #_of_instances) + 13 program RAM locations |
| | ((2*length + 5) * #_of_instances) data RAM locations |
| Icon: | |

DSINKRD

Function: The dsinkrd cell accumulates two series of input samples (each size determined by the length parameter) into two blocks of data RAM. The blocks are stored beginning at symbolic location 'instance_name.outvector1' and 'instance_name.outvector2'. Both blocks (vectors) are accessible from an external microprocessor. A reset input is available: if >=0.5, the cell is held in reset, otherwise the cell can capture a series of input samples. The done output is zero if the cell is reset or capturing input samples, else the done output is one. The done output needs to be terminated, either by another block or by a dummy module. Reset is only effective when the sink block is full.

| Terminals: | |
|---|---|
| pin 1: done | 0 I 1.0 (fixed point format) |
| pin 2: ina | $-2.0 <=$ input $<2.0$ (fixed point format) |
| pin 3: inb | $-2.0 <=$ input $<2.0$ (fixed point format) |
| pin 4: reset | $-2.0 <=$ input $<2.0$ (fixed point format) |
| Parameters: | |
| Required: | none |
| Optional: | length = 1 <= length <= 256 (default: length = 128) |
| | subr = off I on (default is determined by the Schedule module) |
| OrCAD Macro Keys: <ALT> K | |
| Execution Time: | |
| In line: | code duration is 14 cycles maximum |
| Subroutine: | code duration is 22 cycles maximum |
| Resource Usage: | |
| In line: | 20 program RAM locations |
| | 2*length + 5 data RAM locations |
| Subroutine: | (6 * #_of_instances) + 23 program RAM locations |
| | ((2*length + 8) * #_of_instances) data RAM locations |
| Icon: | |

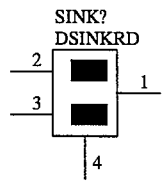

EXT_IN

Function: The ext_in cell provides an external (off chip) input into the SPROC device. Typically the external input cell is used in conjunction with an external microprocessor.

| | |
|---|---|
| Terminals: | |
| pin 1: out | −2.0 <= output <2.0 (fixed point format) |
| Parameters: | |
| Required: | trigger = SIPORT0 \| SIPORT1 \| c10 \| c11 \| c12 \| c13 rate = sample rate of trigger in Hz |
| Optional: | zone = alphanumeric name of timezone (default is null zone) |
| OrCAD Macro Keys: | None defined |
| Execution Time: | |
| In line: | code duration is 0 cycles |
| Resource Usage: | |
| In line: | 0 program RAM locations 0 data RAM locations |
| Icon: | IN? / uP / 1 / EXT_IN |

EXT_IN

Function: The ext_out cell provides an external (off chip) output. Typically the external output cell is used in conjunction with an external microprocessor.

| | |
|---|---|
| Terminals | |
| pin 1: in | −2.0 <= output <2.0 (fixed point format) |
| Parameters: | |
| Required: | none |
| Optional: | none |
| OrCAD Macro Keys: | None defined |
| Execution Time: | |
| In line: | code duration is 0 cycles |
| Resource Usage: | |
| In line: | 0 program RAM locations 0 data RAM locations |
| Icon: | OUT? / 1 / uP / EXT_OUT |

FILTER

Function: The filter cell is used for the implementation of filters designed with SPROCfil. For each instance of this cell there must be an associated filter data file produced by SPROCfil, an .fdf file. This is identified with the spec parameter. An optional type parameter allows filter type verification during the compilation process.

Algorithm: Each IIR filter cell in a SPROCfil design is implemented as a cascade of biquad cells, plus a bilinear cell for odd order filters. An FIR filter cell in a SPROCfil design is split into blocks, with a default of 30 coefficients; this is a scheduler parameter.

| | |
|---|---|
| Terminals: | |
| pin 1: out | −2.0 <= output <2.0 (fixed point format) |
| pin 2: in | −2.0 <= input <2.0 (fixed point format) |
| Parameters: | |
| Required: | spec = file name (file stored in working directory .fdf) |
| Optional: | type lowpass \| highpass \| bandpass \| bandstop (allows the Schedule module to check that the filter file chosen matches the filter desired) |
| OrCAD Macro Keys: | <ALT> F |
| Execution Time | |
| In line: | code duration is filter dependent |
| Resource Usage | |
| In line: | program RAM usage is filter dependent data RAM usage is filter dependent |
| Icon: | FILT? / 2 / 1 / FILTER |

LN

Function: The natural logarithm is calculated using an eight term truncated series: $\ln(in)=\ln(1+x) = x-x^2/2+x^3/3-x^4/4+x^5/5-x^6/6+x^7/7-x^8/8$. In order to increase accuracy at the ends of the range of the input the following compression approach is applied: if in >1.375, in =in/2 and out =ln(in)+ln(2); if 0.1353 <=in <0.6875, in =2*in and out =ln(in)−ln(2); if 0.6875 <=in <=1.375, out =ln(in). The percentage accuracy varies, with the highest error in the input range of 0.32 to <2.0 being 0.003%, and the highest error in the input range below 0.32 being 0.9%.

| | |
|---|---|
| Terminals | |
| pin 1: out | −2.0 <= output <= 0.6931 (fixed point format) |
| pin 2: in | 0.1353 <= input <2.0 (fixed point format) |
| Parameters: | |
| Required: | none |
| Optional: | none |
| OrCAD Macro Keys: | None defined |
| Execution Time: | |
| In line: | code duration is 47 cycles maximum |
| Subroutine: | code duration is 50 cycles maximum. |
| Resource Usage | |
| In line: | 52 program RAM locations 8 data RAM locations |
| Subroutine: | (4 * #_of_instances) + 50 program RAM locations (4 * #_of_instances) + 5 data RAM locations |
| Icon: | LN? / 2 / ln / 1 / LN |

SINK

Function: The sink cell accumulates a series of input samples (size determined by the length parameter) into a block of data RAM. The block is stored beginning at symbolic location 'instance_name.outvector'. This block (vector) is accessible from an external microprocessor.

| | |
|---|---|
| Terminals: | |
| pin 1: in | −2.0 <= input <2.0 (fixed point format) |
| Parameters: | |
| Required: | none |
| Optional: | length = 1 <= length <= 512 (default: length = 128) subr = off \| on (default is determined by the Schedule module) |
| OrCAD Macro Keys: | <ALT> K |
| Execution Time: | |

| | |
|---|---|
| In line: | code duration is 8 cycles maximum. |
| Subroutine: | code duration is 13 cycles maximum |
| Resource Usage: | |
| In line: | 8 program RAM locations<br>length + 2 data RAM locations |
| Subroutine: | (3 * #_of_instances) + 11 program RAM locations<br>((length + 4) * #_of_instances) data RAM locations. |
| Icon: | SINK?<br>—1— ■<br>SINK |

SINKRD

Function: The sinkrd cell accumulates a series of input samples (size determined by the length parameter) into a block of data RAM. The block is stored beginning at symbolic location 'instance_name.outvector'. This block (vector) is accessible from an external microprocessor. A reset input is available: if >=0.5, the cell is held in reset otherwise the cell can capture a series of input samples. The done output is zero if the cell is reset or capturing input samples, else the done output is one. Reset is only effective when the sink block is full.

| | |
|---|---|
| Terminals: | |
| pin 1: done | 0 \| 1.0 (fixed point format) |
| pin 2: in | −2.0 <= input <2.0 (fixed point format) |
| pin 3: reset | −2.0 <= input <2.0 (fixed point format) |
| Parameters: | |
| Required: | none |
| Optional: | length = 1 <= length <= 512<br>(default: length = 128)<br>subr = off \| on (default is determined<br>by the Schedule module) |
| OrCAD Macro Keys: | <ALT> K |
| Execution Time: | |
| In line: | code duration is 12 cycles maximum |
| Subroutine: | code duration is 18 cycles maximum |
| Resource Usage | |
| In line: | 18 program RAM locations<br>length + 4 data RAM locations |
| Subroutine: | (5 * #_of_instances) + 20 program RAM locations<br>((length + 6) * #_of_instances) data RAM locations |
| Icon | SINK?<br>SINKRD<br>—2— ■ —1—<br>R<br>\|3 |

SOURCE

Function: The source cell repetitively reads a block of user specified sample values. The samples must be contained in a file, one sample per line, within the working directory, before scheduling. Source reads the samples one at a time from the block in data RAM, and the number of samples is specified by the length parameter. The block's position in RAM begins at symbolic location 'instance_name.invector'. This block (vector) is accessible from an external microprocessor. Values of the sample data must be in the range from −2.0 to <2.0 fixed point, but values can also be represented in hexadecimal and signed integer notation.

| | |
|---|---|
| Terminals | |
| pin 1: out | −2.0 <= out <2.0 (fixed point format) |
| Parameters: | |
| Required: | file = a file of data samples, e.g.<br>"filblock.dat"<br>trigger =<br>SIPORT0 \| SIPORT1 \| c10 \| c11 \| c12 \| c13<br>rate = sample rate of trigger in Hz |
| Optional: | length = 1 <= length <= 512<br>(default: length = 128)<br>zone = alphanumeric name of time zone<br>(default is null zone)<br>subr = off \| on (default is determined<br>by the Schedule module) |
| OrCAD Macro Keys: | <ALT> R |
| Execution Time: | |
| In line: | code duration is 9 cycles maximum. |
| Subroutine: | code duration is 17 cycles maximum |
| Resource Usage: | |
| In line: | 9 program RAM locations<br>length + 2 data RAM locations |
| Subroutine: | (3 * #_of_instances) + 14 program RAM locations<br>((length + 4) * #_of_instances) data RAM locations |
| Icon: | SOURCE?<br>■ —1—<br>SOURCE |

Other cells in the function library include: ACOMPRES, AEXPAND, AGC, AMP, ANTILN, BILINEAR, BIQUAD, DECIM, DIFFAMP, DIFFCOMP, DIFF_LDI, FIR, FWG_NEG, FWR_POS, GP_IN, GP_OUT, HARDLIM, HWR_NEG, HWR_POS, INTERP, INT_LDI, INT_RECT, INTR_LDI, INT_Z, MINUS, MULT, NOISE, PLL_SQR, PULSE, QUAD_OSC, RTS_IN, RTS_OUT, SCALER, SER_IN, SER_OUT, SINE, SINE_OSC, STEO_IN, STEO_OUT, SUM2 through SUM10, TRANS-FNC, UCOMPRES, UEXPAND, VCO_SQR, and VOLTREF.

B.2 Entering a Diagram

The SPROClink microprocessor interface (SMI) provides software components necessary to develop microprocessor applications in ANSI C that include the SPROC chip as a memory-mapped device.

Using the development system the designer captures the signal processing subsystem design by creating a signal flow block diagram that represents it. The diagram is created by using a schematic capture package to arrange and connect signal processing functions, or cells, in an order representing the signal flow of the subsystem.

A cell is a design primitive corresponding to a specific block of SPROC description language (SDL) code. The SPROCcells function library includes many commonly used cells, and the designer can create additional cells in SDL to meet special needs. Each cell has a graphical symbol, or icon, that represents the cell and illustrates the number of inputs and outputs the cell uses. A function is inserted into the signal processing flow by placing the icon for that cell into the signal flow diagram and connecting, or wiring, the icon to other icons in the diagram.

In addition, each cell has a set of characteristics, called parameters, that identify the cell and allow its detailed operational specifications to be defined. Most cells have parameters that specify simple operational values, but some cells are more complex. For example, filter and transfer function cells require entire data files to completely define their operations. In such cases, the cell's parameter does not define a simple operational value, it specifies the name of a data file containing the complex definition.

When the icon for a cell is inserted into a signal flow diagram, the inputs and outputs are connected, and parameters for that occurrence of the cell are specified, the designer must create an instance of the cell. A cell instance includes the function, identification, connection, and parameter definition for a single occurrence of a cell within a diagram. Each instance of a cell in a signal flow diagram is identified by a specific and unique instance name. For example, if the signal processing subsystem requires four (4) amplifiers, the diagram that represents that subsystem must include four amplifier cells (and their parameters and connections) with four different cell instance names.

A netlist is a listing of all cell instances (functions, instance names, parameters, and connections) included in a signal flow block diagram. It is a textual description corresponding to the graphical representation of a signal processing design. The development system uses the netlist to generate code and a chip configuration file for the design represented on the signal flow block diagram.

OrCAD software requires that icons for function cells be grouped into structures called libraries. The software uses these structures to organize the cells and create menus through which the designer can access them. A library contains all of the icons for a specific grouping of functions. The functions in the SPROCcells function library are organized into a single OrCAD library. In OrCAD, parameter specifications, including cell instance names, are recorded in part fields. All cell instances have at least one part field containing the instance name. If an instance name is not specified, a default name is created.

Parameter values are specified using the parameter names. As parameters are defined, the part fields containing those parameters are organized sequentially according to the order in which definitions are entered. (The instance name always occupies a special unnumbered part field.) To edit the contents of a part field once it has been defined, the part field's sequence number must be specified.

For example, inserting the icon for an amplifier cell into a diagram and specifying a value for the gain parameter, the default instance name for the cell occupies an unnumbered part field, and the gain specification occupies the first numbered part field. To edit the gain parameter after it is defined, part field number 1 must be accessed.

B.3 Defining a Filter

If a signal processing design includes one or more filters, the designer must create a data file, called a filter datafile, that defines the detailed specifications and coefficient data for each filter. A parameter in each filter cell instance entered on the signal flow block diagram identifies the name of the filter data file to use with that filter.

The SPROCbuild utility is used to convert the Signal flow block diagram into code and generate a chip configuration file, the utility reads the filter data file for each filter cell instance and generates the appropriate code to implement the filter as specified. The generated code uses the coefficients from the filter data file and a cascade of special filter cells to implement the filter. The special cells are provided in the SPROCcells function library, but reserved for internal use by the SPROCbuild utility.

The SPROCfil filter design interface helps the designer create filter data files that specify the coefficients and processing order to use in implementing a filter design. The filter design interface provides an interactive design environment that lets the designer define a filter using a graphical representation of the filter shape. Other tools in the filter design interface automatically generate the coefficients corresponding to the filter design, and write these coefficients to the filter data file.

The filter design interface supports design of the following major categories of digital filters: Infinite Impulse Response (IIR) or recursive filters, and Finite Impulse Response (FIR) or nonrecursive filters. In the IIR category, four familiar analog types of filters are available: Butterworth, Chebyshev I, Chebyshev II (or inverse Chebyshev), and Elliptic function (or Cauer parameter). In the FIR category, two filter types are available: Optimal Chebyshev approximation, commonly referred to as the Equiripple or Parks-McClellan-Remez (PMR) design, and Kaiser window design.

The designer can use these types to design lowpass (LP), highpass (HP), bandpass (BP), and bandstop (BS) filters.

All filter data files created using the filter design interface are in ASCII format with the data clearly labeled; any file can thus be viewed using the DOS command type filename, or any word processor or editor.

The coefficients calculated by the filter design interface are written to the filter data file in floating point precision. Quantizing to the 24-bit word length of the SPROC chip is done automatically by the SPROCbuild utility.

The frequency-domain properties of a filter may be evaluated for any wordlength. Computation of a frequency response using quantized coefficients serves to illustrate the degree of sensitivity of the filter performance to the use of finite precision coefficients, i.e., the degree to which the poles of IIR filters, and the zeros of IIR and FIR filters, are modified by the finite-precision coefficient values.

The following limitations apply to filters designed using the filter design interface: Maximum order for IIR filters is 20. Maximum length for PMR (Equiripple) FIR filters is 200. Maximum length for Kaiser window FIR filters is 511. Frequency response for IIR and FIR filters is limited to up to 500 spectrum values covering any desired segment of the frequency range between d-c and one-half of the sampling frequency. The response computation may be specified either by the number of points in a frequency range or by the spacing between points on the frequency axis.

As an additional option for FIR filters, up to 512 spectrum values between d-c and one-half of the sampling frequency may be efficiently computed with up to a 1024-point FFI.

After the initial specifications are entered, modification of the design to meet certain program limitations may be performed by an interactive process.

For example, if the design is an IIR filter, it may be necessary to modify the design to produce a filter order that is an even integer, relax some specification to produce a filter order that is 20 or less, or modify the design to make transition ratios in BP and BS filters equal.

If the design is a PMR FIR filter, it may be necessary to relax some specification to produce a shorter filter length, or to modify the design to make the transition bands of BP or BS filters of equal width.

When the design has been modified to meet program limitations, the following steps are required to complete the design and write the filter data file:

For IIR filters, completing the design involves determining the sequence of biquad sections and scaling the design to avoid overflow.

For PMR FTR filters, completing the design involves computing the actual filter length. The estimated filter length can be increased or decreased.

All IIR designs are given by sets of coefficients of cascaded second order (or biquad) sections, with a first order section for odd-order filters (LP and HP only). When an IIR filter is designed the coefficients for each biquad section are displayed/printed as the set A, B, C, D, and E. The coefficients D and B can be as large as 2 in magnitude. For all four IIR filter types—Butterworth, Chebyshev I, Chebyshev 11, and Elliptic—the same user interface applies. Hence the discussion here applies equally well to any IIR filter design activity.

Several categories of IIR filters may be designed: lowpass, highpass, bandpass, or bandstop. Although all digital filters are properly characterized on a normalized frequency basis, for the user's convenience, the filter design interface allows specification of all critical frequencies in Hz, KHz, MHz, or GHz.

Values must be provided for the passband and stopband edge frequencies, and for the attenuations in the passbands and stopbands. The filter response has a maximum value of unity (0 dB) in the passband.

It is not unusual to approach the design of a filter without specific values for all of the critical frequencies, having only a general idea of passband and stopband locations. To aid in the design process, the filter design interface provides full capability for adjusting all parameters of the filter to achieve a best compromise between performance and complexity (as measured by filter order). The procedure is fully interactive; all computations are done by the filter design interface.

Before discussing this interactive process it may prove helpful to review the way in which the order of IIR digital (and analog) filters depends upon the filter specifications.

Filter order is proportional to Amin and inversely proportional to Amax; i.e., small passband ripple and large stopband attenuation mean high order. In addition, the filter order is inversely proportional to the transition ratio, which measures the relative narrowness of the transition band—the region between passband and stopband.

Because the filter design interface uses the technique of bilinear-z mapping to convert analog prototypes to digital designs, the transition ratio is not FP/FA (for lowpass), or FA/FP (for highpass). Instead, one must use the ratio of the pre-warped critical frequencies: $\tan(\pi FP/Fs)$ and $\tan(\pi FA/Fs)$ where Fs is the sampling frequency.

For bandpass and bandstop filters the critical frequencies for the pass- and stopbands are denoted by FP1, FP2, FA1, FA2. Here there are two possible transition ratios. The values for a bandpass filter are: Lower transition ratio= $\tan(\pi FA1/Fs)/\tan(\pi FP1/Fs)$; Upper transition ratio= $\tan(\pi FP2/Fs)/\tan(\pi FA2/Fs)$.

The filter design interface uses the standard lowpass-to-bandpass transformation method which requires that these two ratios—using pre-warped values—be equal. This is called the geometric symmetry constraint. It is not necessary to precompute these ratios; the filter design interface will perform all necessary adjustments.

After the initial specifications are entered there follows an interactive process which has the goal of modifying the design to meet program limitations. It may be necessary to find an integer-valued filter order which satisfies the design specifications. It may be necessary to adjust transition ratios to meet the requirements for geometrical symmetry in transition ratios.

After developing an acceptable set of specifications and value for filter order there follows another module for the purpose of completing the design by establishing a sequence for the biquad sections, optionally scaling for 0 dB transmissions, and creating a filter data file which will hold the specifications and floating-point precision coefficients. The sequencing and scaling steps are intended to guard against overflow in fixed-point arithmetic.

Before the order for bandpass and bandstop filters is computed it is necessary that the geometric symmetry constraint be satisfied. If the values of FP1, FP2, FA1, and FA2 do not yield equal upper and lower transition ratios, the transition ratios (IIR) or transition bands (FIR) are unequal. They can be easily adjusted in the selected design module. The filter order/length values shown below are for the smaller transition ratio, or band width, value.

This indicates that the input band edge values do not exactly satisfy the equal transition ratio requirement for IIR, but these values can be adjusted in a number of ways. It is almost impossible to enter values which do satisfy the IIR filter requirement unless the values are calculated beforehand.

The designer has three choices: use the upper transition ratio; use the lower transition ratio; use the mean of the upper and lower transition ratios.

These choices are presented in terms of new values for certain of the critical frequencies, and the computed filter order associated with each choice. For a bandpass filter the passband edge frequencies are preserved as originally specified, and the stopband edge frequencies are adjusted in value. The adjusted values for the bandstop filter will be the passband edge frequencies, with the stopband edges remaining as specified.

If the stopband edges are to be adjusted to obtain equal transition ratios, then the set of choices may look something like the following: 1. End of lower stopband (Hz)=255.702 (Order=14.6); 2. Beginning of upper stopband (Order=11.1) (Hz)=3.52793E+03; 3. End of lower stopband (Hz)=227.878 (Order=12.6), Beginning of upper stopband (Hz)= 3.46362E+03.

The designer has the choice of adjusting either the lower or upper transition ratio—choices 1 and 2—or using the mean of the transition ratios—choice 3. In some cases the difference in filter order is substantial. In most software for filter design the highest order filter is automatically chosen—the designer has no control. Here, all trade-offs between filter order and specifications are under the designer's control.

If the filter order determined by the initial filter specifications is not an integer, select an order that is an integer. The designer will have the opportunity to improve the filter performance if a higher filter order is chosen, some performance specification is relaxed in order to obtain a lower filter order.

The choice of a value for filter order sets the stage for adjusting filter specifications in conformity with the selected order. For each choice of filter order there are three possibilities for parameter adjustment, relating to stopband and passband attenuations and to band edge frequencies.

The operating rule is that passband frequencies should not be adjusted for lowpass and bandpass filters, and that stopband frequencies should not be modified for highpass and bandstop filters. The designer may decide to do otherwise—the choice of adjusting either the passband or stopband is always available. Either of the attenuation values can be adjusted. The designer may try all three parameter adjustments, for any choice of filter order.

If none of these adjustments results in a satisfactory set of specifications the designer may try another value for filter order, or can go back to the beginning and modify the set of initial specifications. This intuitive process of iteration should give the designer a good idea of the quantitative range of trade-offs between filter performance and order that is available.

Realization of high performance filters—by which is usually meant sharp cutoff—is restricted in the analog domain by component precision and tolerance. For digital filters, precision refers to the wordlength of the computation used in implementing the filter. There is no direct counterpart to component tolerance; clock stability is a possible analogy. The SPROC chip uses a 24-bit computational word, which is equivalent to a resolution of better than 1 part in 106. The development system's crystal controlled clock provides superior stability. All of this gives digital filters on the SPROC chip a performance level that is far better than any analog implementation. Because this high performance is so seemingly easy to achieve, the designer is often seduced into overspecifying filter performance, with the penalty being increased computational load and increased memory usage. In some cases there will be additional signal-to-noise ratio degradation due to an accumulation of quantization noise originating in the arithmetic rounding process; this effect is significant only for IIR filters, because it is their inherent feedback operation which can lead to an amplification of quantization noise.

If a filter on the SPROC chip is overdriven there may be an arithmetic overflow internal to the filter cell. This is most likely with IIR filters. Although all IIR filters designed by the filter design interface can be scaled so as to protect against overflow, the scaling process is based upon a sine wave input signal. For almost all designs, the filter design interface can achieve a maximum level of 0 dB for all internal signals based upon an input sine wave at a 0 dB level. In actual operation with real input signals it is possible for phase distortion in the IIR filter to cause "signal pile-up" so that an internal signal, or even the filter output, can slightly exceed the 0 dB level. In such cases one will have to scale down the input to the filter. Experience has shown a 2 to 3 dB decrease in signal level (a gain of 0.8 to 0.7) is all that is needed should an overflow problem occur.

Each IIR filter is first designed as a normalized lowpass analog prototype. The appropriate band transformation, incorporating bilinear-z mapping, is performed in order to get a initial set of digital filter coefficients from which the poles and zeros of the filter are determined. As a first step in the process of minimizing overflow problems in fixed-point, or integer, arithmetic these poles and zeros are automatically grouped so as to minimize the peak gain of each biquad section. The next steps are to establish a sequence for cascading the biquads, and then to select the multiplier coefficient for each biquad so that the transmissions from the input of the filter to the output of each biquad have a peak that is less than ore equal to 0 dB. When these steps have been performed satisfactorily then the filter data file name is created and the filter specifications and coefficients are written to the file. More than one ordering and/or scaling may be performed and each set of coefficients saved to a different filter data file. (Note that different orderings and scalings affect only the A coefficient the numerator and denominator coefficients are determined by the filter's poles and zeros which do not change.)

The pairing of poles and zeros, and the establishing of a sequence for the biquad sections in an IIR filter realization, are of great importance in fixed-point arithmetic. The filter design interface uses a standard procedure for pairing poles and zeros to form the biquad sections, and allows the user complete freedom in choosing the sequence for the cascaded biquad sections.

Problems associated with roundoff noise buildup and accumulator overflow can be substantially reduced by ensuring that the peak gain for each biquad is as small as possible. The greatest peak is associated with the complex-conjugate pole pair having the highest Q (i.e., greatest magnitude, or closest to the unit circle). In fact this is a resonance peak. As the first step in reducing the peak of each biquad frequency response as much as possible one begins with the largest magnitude pole pair and groups it with the complex zero pair that is closest in frequency—which is angle in the z-plane. One then successively applies the same rule of combination—largest magnitude pole pair with closest-in-frequency zero pair—to the remaining poles and zeros until all assignments are done. Although this procedure reduces the largest peaks as much as possible, the gains of biquads with large magnitude poles may still reach levels as high as 10 to 12 dB.

If the cascade of biquads is sequenced with the largest magnitude poles first then the roundoff noise which is generated and amplified in these biquads will be substantially filtered by the lower gain biquads which follow. This reduction in roundoff noise accumulation (and zero-input limit cycle amplitude) at the output of the filter may, however, be accompanied by severe overflow problems at the input stages of the filter. This overflow problem is due to placing the largest magnitude pole pairs (and thus the highest-Q resonances) in the first biquads. If one elects to scale for 0 dB transmissions from the input to each biquad's output then the A coefficients will generally be small for the initial biquads in the cascade. In effect the input signal is scaled down in order to avoid overflow; this can degrade signal-to-noise ratio.

As an alternative one can sequence the cascade of biquads so that the smallest magnitude pole pairs are first. This will result in less scaling down of the initial A coefficients, and thus the signal, but it is often not possible for the scaling algorithm in the filter design interface to achieve 0 dB transmission for each biquad. Another problem with this sequence is that the roundoff noise in the output is greater, and the ZILC amplitude can be greater. If either of these biquad sequences is unacceptable the designer is free to establish any biquad sequence. Note that for odd-order filters the first-order section is always placed after all of the biquad sections.

A new filter data file can be created for each biquad ordering specified. Thus, if three orderings are specified for a fifth-order Butterworth filter then the default file names are buttrO5a.fdf, buttrO5b.fdf, and buttrO5c.fdf.

The incidence of accumulator overflow in IIR filter operation may be reduced through the proper ordering of the cascade of biquad sections. For relatively high order filters there are many possible orderings that can be tried; low order filters give fewer opportunities for ordering of biquads, but usually do not present serious overflow problems anyway.

When the filter is designed one is given the option of specifying the order in which the biquads are placed. In addition one has the option of scaling the A coefficients so that the transmission from the filter input to the output of each biquad is less than or equal to 0 dB. Experience shows that the algorithm implemented in the filter design interface achieves this 0 dB transmission goal most often when the biquad sequence has the largest magnitude poles first. If this is not true for a particular design then one can try the reverse sequence—smallest magnitude poles first or specify one's own sequence.

If one elects to specify an arbitrary biquad sequence, then to strike a balance between overflow problems, roundoff noise accumulation, and ZILC oscillation amplitude, it may be desirable to have the largest magnitude poles in the middle of the cascade, with lower magnitude poles at the beginning and end of the cascade. Obviously this is possible only if the filter is of order 6 or greater, so that there are at least three biquad sections. This sequence can reduce the probability of overflow in the first stages, and often reduces the magnitude of signal frequency components that fall at the peaks of the responses of the biquads with large magnitude poles. Also, if the one of the biquads with large magnitude poles does exhibit a ZILC oscillation, there will be some attenuation of the oscillation by the lower gain biquads which are at the end of the cascade. Nevertheless, there are filter designs for which no ordering of biquads alone is sufficient to prevent overflow, and for which the scaling of A coefficients between sections does not achieve 0 dB transmission for all biquads. Because the filter design interface displays the actual peak responses after the "scaling for 0 dB transmissions" message one can see the effectiveness of alternative biquad sequences and choose the best.

From the standpoint of having the filter perform the function that it was designed for, overflow should never be permitted. IIR filter behavior after a 2's-complement overflow is totally erratic, and can degenerate into an overflow-induced oscillation; should this occur the filter must be reset in order to stop the oscillation. The best design is that in which scaling of data and gain coefficients guarantees that overflow will not occur.

B.4. Defining a Transfer Function

Although the SPROClab development system does not provide a tool for defining transfer functions, the SPROCbuild utility can implement user-defined transfer functions of two types: s-domain transfer functions and z-domain transfer functions when generating code and creating a SPROC chip configuration file.

The SPROCcells function library includes a transfer function cell so that the designer can include transfer functions in the signal processing designs. When placing this cell in a diagram, one must specify a parameter that names the file defining the transfer function.

The SPROCbuild utility uses z-domain transfer functions directly, and automatically converts s-domain transfer functions into z-domain transfer functions. It implements the transfer function as a cascade of 1st-order or 2nd-order sections using the coefficients you define.

When creating transfer function files, one must not mix 2nd-order and 1st-order sections in one file. To implement a 5th-order transfer function, one must use two transfer function cells in cascade in the signal flow block diagram—one with two 2nd-order sections, and the other with a single 1st-order section—and define separate transfer function files for each cell. If all the poles and zeroes are real-valued, one can use a single transfer function cell with five 1st-order sections.)

An s-plane transfer function file may be composed of either a number of 2nd-order sections in cascade, or a number of 1st-order sections in cascade.

One must use a text editor to create an ASCII file containing the definitions for the coefficients for the transfer function. In addition to the coefficient values, one must specify the number of 1st- or 2nd-order sections, and also supply the sampling frequency and a critical frequency. These two parameters are needed for the bilinear-z mapping procedure which converts the s-plane transfer function to a z-plane transfer function.

The bilinear-z conversion method is used because it eliminates spectrum aliasing. However, in accordance with the well known principle of conservation of difficulty, it introduces a warping of the frequency axis. With F denoting frequency in the s-plane, Fs the sampling frequency, Fc the critical frequency, and f representing frequency in the z-plane, the relationship between s-plane and z-plane frequencies is $2\pi f = K\tan(\pi F/Fs)$ where $K=2\pi Fc/\tan(\pi Fc/Fs)$.

Clearly, when F=Fc, f=Fc. Thus, the role of the critical frequency is to serve as a fixed point in the mapping of the F axis into the f axis.

Experience has shown that picking a critical frequency which is near the center of the frequency region of interest is a good choice. The difference between the magnitude response of the s-plane transfer function and the z-plane transfer function is usually negligible, except near the Nyquist frequency, Fs/2. The bilinear-z mapping tends to add one or more zeroes at Fs/2 in order to restrict the signal spectrum, and thus avoid aliasing distortion.

B.5 Converting a Block Diagram

The SPROCbuild utility provides a set of software modules that automatically converts one's design into SPROC description language (SDL) code, then uses that code to generate a configuration file for the SPROC chip and a table of symbolic references to chip memory locations. To create these files, the utility uses files produced by the SPROCview graphical design interface, the SPROCcells function library, and the SPROCfil filter design interface in the development system, and user-defined cells and transfer functions of the proper form created outside the development system.

The SPROCbuild utility includes three modules: MakeSDL, Schedule, and MakeLoad. Each module performs a unique function in the process of convening the signal flow block diagram and associated files into SDL code and then into a SPROC chip configuration file and a symbol file for the design.

The development system shell begins the conversion process by issuing an invocation command to the MakeSDL module. When that module is complete, the shell invokes the next module in the process, until all modules have been called and completed or an error occurs. The invocation command for each module has a set of command line switches that determines how the module functions.

The conversion process comprises the sequential execution of all modules of the SPROCbuild utility. Each module performs its specific function in the process and produces an output file (or files) required by the next module. The general process is as follows:

1. The MakeSDL module integrates the output from the graphical design interface with data files from the filter design interface and user-defined transfer functions to produce a partial code package containing SDL code and data files. The module also generates instances of certain special cells to implement filter and transfer function cells. These cells are included in the SPROCcells function library but reserved for internal use.

2. The Schedule module takes the files produced by MakeSDL and adds the code blocks for the cells used in the design (from the function library or user-defined cells) and any data files required in addition to those included in the partial code package obtained from MakeSDL. Then the Schedule module schedules the code according to on-chip resource availability and adds special "glue" cells called phantoms that provide control and synchronization functions for the general signal processors (GSPs) on the chip. These cells are included in the SPROCcells function library, but reserved for internal use. The Schedule module produces binary program and data files for the design. It also produces a file of symbolic references to chip memory locations.

3. The MakeLoad module takes the binary program and data files produced by Schedule and packages them into a configuration file for downloading to the chip.

B.6 The MakeSDL Module

The MakeSDL module takes the basic files that capture and define the signal processing design and converts them into a format that the Schedule module can use. The MakeSDL module takes the following input files:

The netlist, mydesign.net, created from the signal flow block diagram in the graphical design interface (where mydesign is the design name). This input is required.

The filter data file (or files), filtname.fdf, produced by the filter design interface (where filtname identifies the filter and matches the name specified in a parameter of the filter cell instance on the block diagram). This input is conditional, depending on the design.

The transfer function file (or files), transname.tff, created using a text editor (where transname identifies the transfer function and matches the name specified in a parameter of the transfer function cell instance on the block diagram). This input is conditional, depending on the design.

Internal reserved cells included in the function library and used for special functions (i.e., to implement filters and transfer functions). This input is required.

and produces the following output files:

mydesign.sdl, a partial SDL code package that corresponds to the functions noted in the netlist and filter and transfer function definitions. This output is always produced.

data files containing the parameters and coefficients noted in the netlist and filter and transfer function definitions. This output is conditional, depending on the design.

In addition, the MakeSDL module produces a dependency check file, mydesign.spf, that the development system shell uses to determine which files must be created or updated by the SPROCbuild utility.

For some signal processing functions, like filters and transfer functions, the MakeSDL module internally inserts instances of special function cells into a design to implement the function defined by the designer. Thus, a filter cell instance on a signal flow diagram might be implemented as several automatically generated internal filter cells. All internally inserted cells that implement filters and transfer functions are integrated into the SDL code package and converted into the file, mydesign.sdl.

B.7 The Schedule Module

The Schedule module takes the partial SDL code package produced by the MakeSDL module and integrates the code blocks for all necessary functions to form a complete SDL code package. It also collects all necessary data files. Then the module determines the appropriate order in which to run the code, calculates the chip resources required, and inserts the necessary phantom cells to glue the design together. Then the module converts the code package into a binary program file containing executable instructions, and an associated data file.

The Schedule module takes the following files as input: mydesign.sdl, produced by the MakeSDL module; the data files produced by the MakeSDL module; any additional data files; the SDL code blocks for function cells, function.sdl, supplied in the function library or created by the user (where function is the name of an individual signal processing function cell) and produces the following files as outputs: mydesign.spp, the binary program file and mydesign.spd, the associated data file. In addition, the Schedule module produces the symbol file (mydesign.sps) containing a table of symbolic references to SPROC chip memory locations.

B.8 The MakeLoad Module

The MakeLoad module packages the program and data files produced by the Schedule module into a configuration file for the SPROC chip. Depending on how the MakeLoad module is invoked, it can produce a configuration file in any of the following formats: a load file in modified Motorola s-record format for downloading to the chip via the SPROCdrive interface software and the SPROCbox interface unit; a PROM file in Motorola s-record format for burning into an EPROM; a blockfile containing an initialized array of data for downloading to the chip via a microprocessor.

The MakeLoad module takes the following files as input: mydesign.spp, produced by the Schedule module mydesign.spd, produced by the Schedule module and produces the following types of configuration files (depending on command line switch settings): a load file, mydesign.lod; a PROM file, mydesign.pro; and a block file, mydesign.blk.

B.9 Loading and Running a Design

The SDI software uses a command-driven user interface with a prompt line to enter SDI commands. The SDI user interface supports the entry of multiple commands on one command line, the use of command files, and the use of function keys as shortcuts for entering some commands. One can specify definitions for most function keys, and some function key definitions are provided with the SDI software. Certain function keys are reserved and may not be user-defined.

SDI uses the load file produced by the MakeLoad module of the SPROCbuild utility. This file includes the program that will execute on the SPROC chip and the data associated with that program. The load file represents the signal processing design specified by the designer using the graphical design interface and filter and transfer function definitions, all packaged in a format that can be downloaded to the chip by the SDI software through the SPROCbox interface unit.

The symbol file produced by the Schedule module of the SPROCbuild utility includes symbolic references to on-chip memory addresses that correspond to specific nodes and wires in the signal processing design. When the symbol file is loaded into host memory, the SDI software allows the user to monitor and modify the values stored at various on-chip memory locations by accessing their symbolic names. SDI also supports access to on-chip memory locations using direct memory references to addresses.

The SDI software provides two operating modes: normal and expert. Both modes support interactive modification and debugging of a design while it runs on the chip, but they provide different levels of debug functionality. In normal mode, the user has access to the design's data space only and can modify signal and parameter values, but cannot modify the actual program. In expert mode, the user has access to program and control space in addition to data space, enabling halt and restart design execution, set breakpoints, and modification of the design running on the chip at assembly level.

The symbol file contains a specification of data type for each symbol. Data types may be integer, fixed point, hexadecimal, or undefined. SDI commands are sensitive to the data types of symbols when accessing memory values using symbolic names. In general, SDI commands display values for addresses accessed by their symbolic names using the data type defined in the symbol file. However, some SDI commands allow the user to specify a display format (integer, hexadecimal, etc.) that may differ from the symbols data type. In addition, the mode command allows the user to specify a display format for values accessed by direct memory reference, and for symbolically accessed values for which the symbol file data type is undefined.

SDI provides several methods to access the values stored in SPROC chip memory locations. The commands read and probe allow the user to view the value of a given memory location, either by accessing it directly by address or symbolically by symbol name. The read command displays the value on the screen, and the probe command directs the value to the software-directed probe for display on an oscilloscope. The write command allows the user to modify the value of a given memory location.

Depending on the SDI operating mode, the user can access data memory locations corresponding to inputs, outputs, and parameters for cells included in your signal flow block diagram, program memory space, and control memory space.

The symbol file includes symbolic names for all SPROC memory addresses. The symbol file provides a hierarchical structure that uniquely identifies nodes and attributes of all cell instances in a signal processing design. In addition, the address for a node or attribute is saved in the symbol file along with its symbol name, so that the symbol file comprises an address map of the symbol names for all nodes and attributes in the design. Levels of hierarchy in symbol names are separated by a dot (.) character. For example, in the symbol name amp1.gain, amp1 is the amplifier cell that contains the specific attribute (gain) named by the symbol.

Some nodes and attributes can be referenced by multiple symbols (or aliases). For example, a wire that connects two cells is both the output of the first cell and the input of the second. In addition, a label may be specified for the wire. All three symbols, for the output of the first cell, the input of the second cell, and the label for the wire, refer to the same node on the design and to the same location in SPROC chip memory. When such aliases are translated, the symbol translator ensures that all aliases for a symbol refer to the same location in SPROC chip memory.

The probe command probes any signal corresponding to a location in the SPROC chip data RAM. The user can examine the values of the inputs and/or outputs for each cell in the signal flow block diagram. In addition, the user can probe all of the internal signals for any cell in the diagram that the SPROCbuild utility implements as a combination of cells.

For example, if the signal processing design includes a filter that is sixth order, the SPROCbuild utility will have cascaded three biquad sections; if eighth order, then four biquad sections. The user can use the probe command to access the outputs—and hence the inputs—of each biquad section even though the individual biquad sections were internally generated cells that do not appear on the signal flow block diagram. In fact, the user could view all of the signals that are internal to each biquad.

In the current hardware implementation of the software-directed probe, values accessed using the probe command are made available as output from an on-chip, 8-bit, digital-to-analog converter (DAC). Note that there is a discrepancy between the 24-bit wordlength of SPROC chip memory values and the 8-bit wordlength of the probing DAC. To counter this disparity in wordlength, the probe command supports specification of a scale factor to scale up the input to the probing DAC by as much as 15 bits (215). This provides probe access to low-level signals.

B.10 Using the Micro Keyword

When using the SPROC chip as a memory-mapped device in a microprocessor application, the microprocessor can only access cells that include a micro keyword in the cell definition code block. This keyword identifies the variables in the cell that are available for microprocessor access. Cells that do not include this keyword cannot be accessed by a microprocessor.

The following definition code block for a sink cell illustrates the use of the micro keyword:

```
asmblock msink {%subr=default, %length=128] (in;)
verify (%length>0 && %length<=512), 'Specify length in range
1 to 512.';
variable integer ptr=outvector
micro variable outvector[%length];
begin
                //code here
end
```

The definition of outvector is micro variable outvector [%length]. The micro keyword identifies the variable, outvector[%length], as available for access from a microprocessor.

The micro keyword can also be used for inputs and outputs. For example, in a sink cell with the following reset and done inputs: asmblock msinkrd {%subr=default, %length=128} (in, micro reset; micro done)

The micro keyword defines the interface between the microprocessor and the reset and done inputs of the msinkrd cell and is used to identify only those variables that must be available to the microprocessor.

B.11 Using a Listing File

A listing file can be used to verify cells. It consists of a listing of the source input and the hexadecimal codes for corresponding data and program locations. The user can produce a listing file by invoking the SPROCbuild utility's Schedule module directly from DOS, using the invocation command line switch −1 and specifying the input source file.

Because the listing file is generated at compile time, outside the context of a particular instantiation of an assembly language block, it cannot include any data that is not known before the block is instantiated, i.e., any data that must come from a parameter value of a cell instance. For example, if a parameter used in the calculation of an operand value has no default value, then it cannot be known until the block is instantiated. For such operands, the operand field of the instruction is left zero, and a question mark (?) is placed immediately after. The question mark indicates that the operand value is unknown at this time. On the other hand, if a default for the parameter value has been specified, then this value is used for the instruction, and no question mark is added. Similarly, absolute addresses for instruction jumps and relocatable data references cannot be known at compile time. Whenever such an address is encountered as an operand, its absolute address with respect to the start of the block is used, and an apostrophe (') is placed immediately after. The apostrophe indicates that the address operand will be relocated.

B.12 Using Subroutines

Most cells in the SPROCcells function library include both in-line and a subroutine form code. When a cell instance occurs with the in-line form specified, the instructions for the function are instantiated as one piece of code, along with associated variable allocations. When a cell instance occurs with the subroutine form specified, the instructions for the function are instantiated as two pieces of code: one as a call block, and one as a subroutine body block. (Each piece of code may have associated variable allocations.) When subsequent instances of the same cell are specified with the subroutine form, only the call block, i.e., the piece of code necessary to call the subroutine body block, is instantiated. Only one instance of the subroutine body block is instantiated, no matter how may times the subroutine version of the cell appears in a design. For example, if five subroutine versions of a particular cell are used in one design, the design will include five call blocks for that function, and one subroutine body block.

The subroutine form of a cell performs a function identical to the corresponding in-line form, but includes overhead instructions that make the code in the subroutine body block re-entrant. The use of subroutine versions of cells provides a savings in the number of lines of code used in a design, but requires increased execution overhead. This overhead causes an increase in cell duration. In general, use of subroutines requires a trade-off of program speed for a savings in program and data memory space.

For example, consider five instances of a sine oscillator function (sine_osc cell) in a design. The in-line form of this cell includes 47 lines of code. Five instantiations of the in-line form require a minimum of 5×47=235 locations in program memory space, and 5×9=45 locations of data (variable) memory space. Duration for each instance of the in-line form is 45 cycles, for 5×45=225 total cycles. By contrast, five instantiations of the subroutine form require five call block segments (3 lines each), one subroutine body block (47 lines), for (5×3)+47=62 locations of program memory space. Each call block uses five locations of data space, and the subroutine body block uses five locations of data space, for (5×5)+5=30 locations of data memory space. Duration for each instance of the subroutine form is 48 cycles, for 5×48=240 total cycles. Use of the subroutine form in this example consumes only 26 percent of the program space and 67 percent of the data space required for the in-line form. However, use of the subroutine form creams a 7 percent increase in code duration.

The Schedule module of the SPROCbuild utility determines whether to use the in-line or subroutine form for each cell instance in a design when it instantiates the cell instance. This determination is based on two factors: The command line switch settings used in the Schedule module invocation command, and the specification of parameters in individual cell instances. As an default, the Schedule module uses the subroutine form of a cell if three or more instances of that cell are used in the design. Under this condition, if a design includes four sine oscillator cell instances, all four are instantiated in subroutine form.

A command line switch in the Schedule module invocation command allows the user to specify a threshold, subrcount, that triggers the module to use the subroutine form of default cells.

The subr=parameter allows the user to specify whether the subroutine form should be used for a specific cell instance. If the parameter is specified as subr=ON for a cell instance, the Schedule module uses the subroutine form when instantiating that cell instance. If the parameter is specified as subr=OFF for a cell instance, the Schedule module uses the in-line form when instantiating that cell instance. The Schedule module does not count cell instances with the subr=parameter set when it evaluates whether the number of default cell instances has passed the threshold.

Although most cells include code in both in-line and subroutine forms, some cells include only the in-line form. If the subr=parameter is specified for a cell that does not include subroutine form code, the cell is instantiated in in-line form.

B.13 Using Time Zones

A time zone is a slice of time particular to a logical partition of operations on the SPROC chip. A time zone can contain any number of operations, up to the bandwidth limitations of the chip. A design may contain any number of independent time zones, up to the bandwidth limitations of the chip. Sets of operations that occur along the same logical wire (serial data path) in a design occupy the same time zone. This is analogous to the physical notion of time division multiplexing, where within a particular slice of time, anything can be accomplished so long as it does not take longer than the length of the time slice. In time division multiplexing, specific time slices are allotted to specific operations, so that a given operation can only be performed in its assigned time slice or number of time slices. Operations that require longer than the length of one time slice must be completed over multiple time slices allotted to that operation.

In the same way that time slices are allotted to operations performed under a time division multiplexing scheme, several operations in cascade are related to a particular time zone on the SPROC chip. Only during the time allotted to a particular time zone can operations associated with that time zone be performed.

The SPROC chip and the development system tools are very flexible in the structuring of time zones. Essentially, the user can specify time zones using any combination of alphanumeric characters. There is no logical limit to the number of time zones specified for operations. The only restriction on the number of independent time channels through which operations can be performed is determined by the bandwidth limitations of the chip.

Consider a design in which four filters, each on an independent channel, must operate on a SPROC chip with four GSPs, and each filter uses one complete GSP. Such a design requires four time zones. To determine the maximum sample rate for each of the time zones, consider a 20 Mhz SPROC chip operating each GSP at 4 MIPS. The two serial ports on the chip have access to memory every 70 clock cycles, meaning that each channel can get samples at a rate of $70/20\times10^6 = 3.5$ µs. Therefore, each time zone has the capacity of $2\times4$ MIPS$\times3.5$ µs$=28$ GSP instructions, because each time zone has an entire GSP allocated to it. (The factor of two at the front of the last equation is due to the fact that one channel will service two GSPs in an equal fashion for this example.) Considering all of the above figures, we see that each channel (or time zone) will be a total of 7 µs in length.

B.14 Summary

Figure 10:
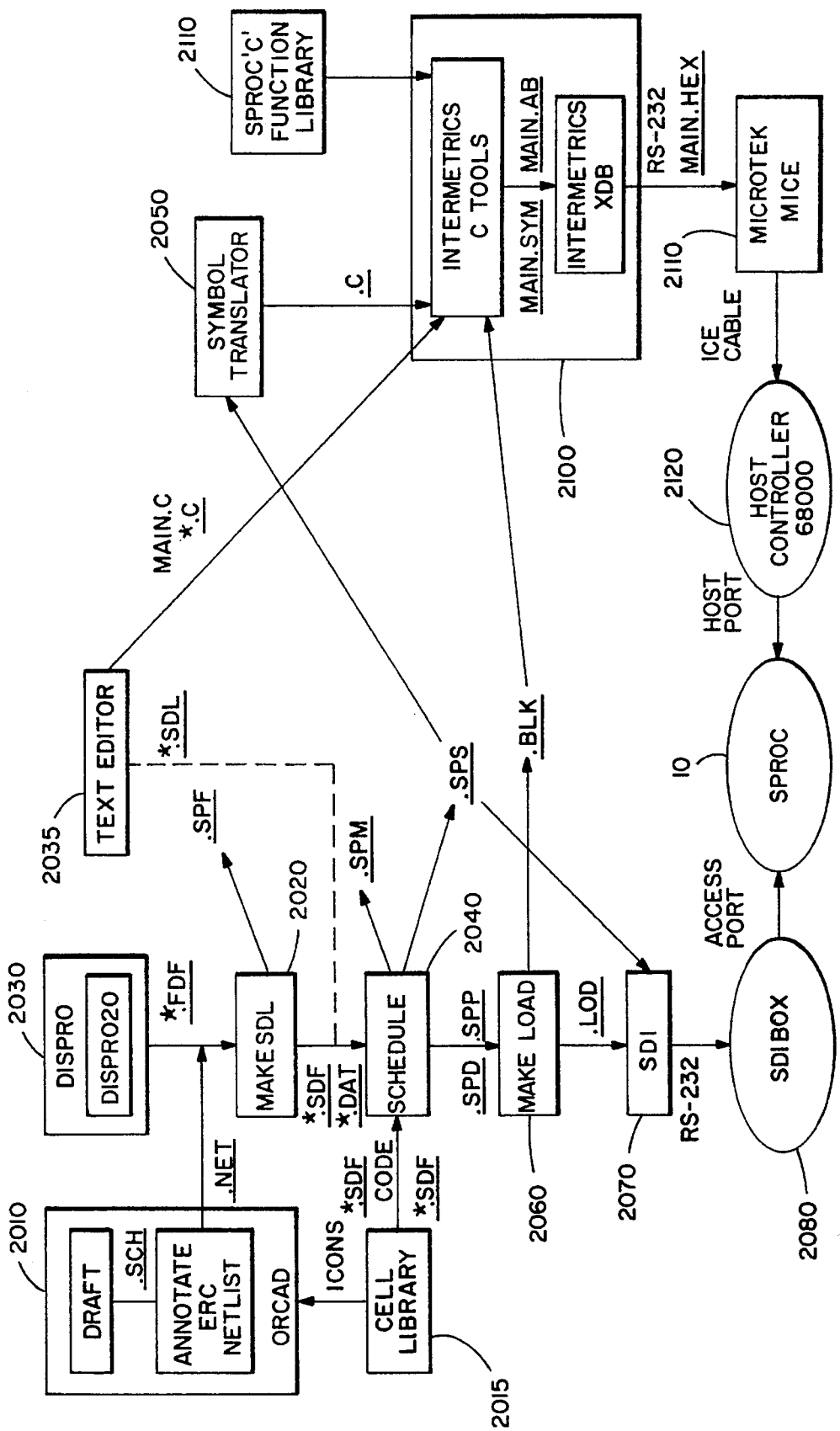
FIG. 10 is a flow diagram of the development system of the invention where the SPROC code and microprocessor code are compiled separately.
Figure 11:
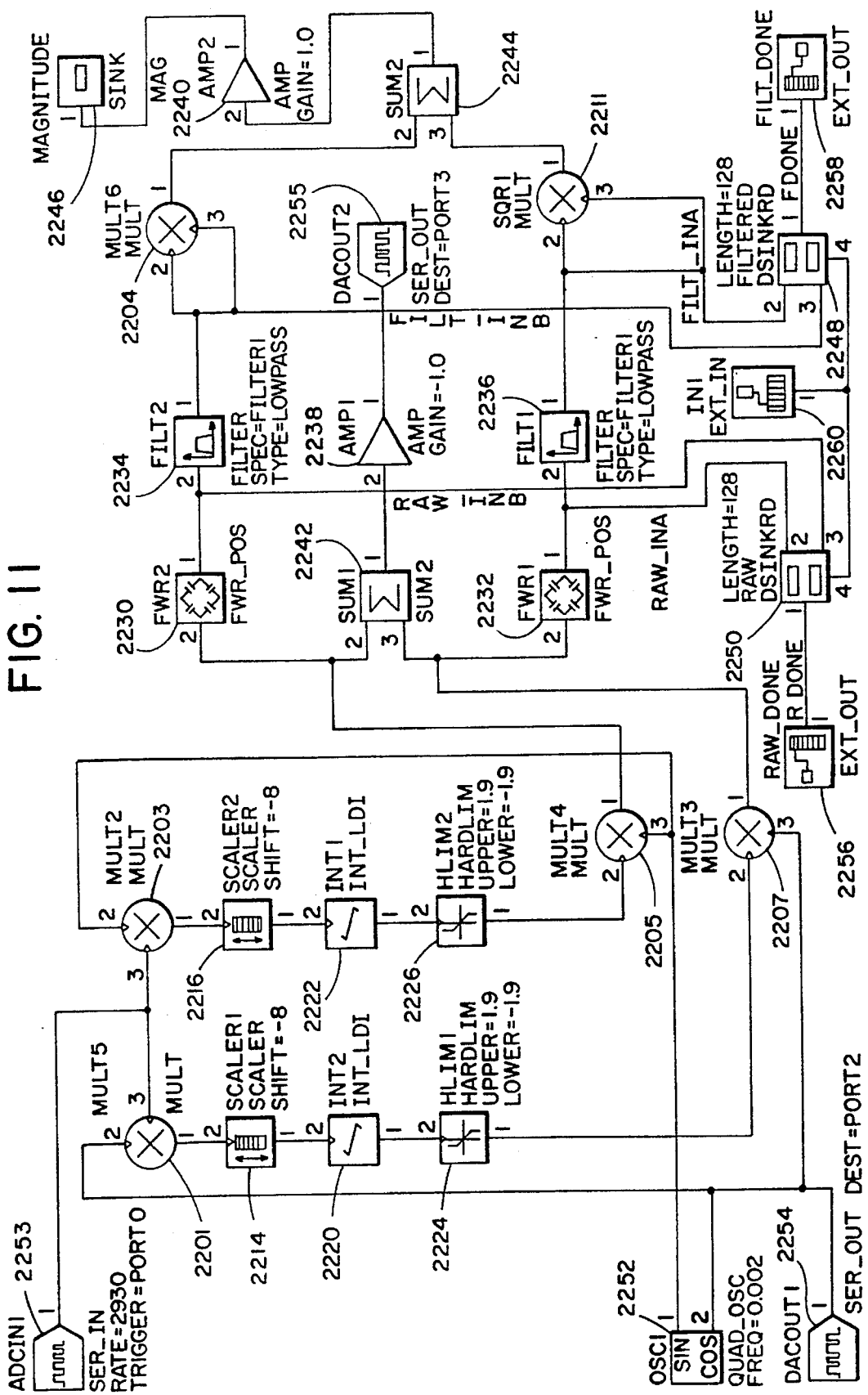
FIG. 11 is a block diagram of a low frequency impedance analyzer example entered into a graphic user entry system and programmed onto a SPROC for use in conjunction with a microprocessor.

Turning to FIG. 10, a flow diagram of the SPROC and microprocessor development environment is seen. At 2010, using graphic entry packages such as "Draft", "Annotate", "ERC" and "Netlist" which are available from OrCad in conjunction with cell library icons such are provided from a cell library 2015, a block diagram such as FIG. 11 is produced by the user to represent a desired system to be implemented. The OrCad programs permit the user to draw boxes, describe instance names (e.g., multiplier 1, multiplier 2, etc. such as seen in FIG. 11 as MULT1, MULT2, . . .), describe parameters of the boxes (e.g., spec=filter 1; or upper limit=1.9, lower limit=−1.9 such as seen in FIG. 11) and provide topology (line) connections. The output of the OrCad programs is a netlist (a text file which describes the instantiation, interconnnect and parameterization of the blocks) which is fed to a program MakeSDL 2020 which converts or translates the netlist output from OrCad into a netlist format more suitable and appropriate for the scheduling and programming of the SPROC. Source code for MakeSDL is attached to the disclosure of U.S. Pat. No. 5,287,511 as Appendix A. It will be appreciated that a program such as MakeSDL is not required, and that the netlist obtained from the OrCad programs (or any other schematic package program) can be used directly.

As seen in FIG. 10, a complex filter design package program such as is available from DisPro is preferably provided at 2030. The filter design package permits high level entry of filter parameters and automatically generates coefficients for the provided design. The output of the filter design package is a filter definition file which is also sent to MakeSDL. MakeSDL effectively merges the information being provided by the filter design package with instances of filters contained in the netlist to provide a more complete netlist. In addition, MakeSDL further merges transfer function files provided by the user to parameterize a block into the netlist.

MakeSDL outputs SDL (SPROC description language) netlist files and data files. The data files represent data values which are intended for the SPROC data RAM and which essentially provide initial values for, e.g., filter coefficients and source blocks. For functions not located in the cell library, a text editor 2035 can be used to generate appropriate SDL and data files. Those skilled in the art will appreciate that any text editor can be used. What is required is that the output of the text editor be compatible with the format of what the scheduler/compiler 2040 expects to see.

Both the netlist and data files output by the MakeSDL program are input to a scheduling/compiling program as indicated at 2040. In addition, a cell library 2015 containing other SDL files are provided to enable the scheduler/compiler to generate desired code. Among the signal processing functions provided in the cell library are a multiplier a summing junction, an amplifier, an integrator, a phase locked loop, an IIR filter, a FIR filter, an FFF, rectifiers, comparators, limiters, oscillators, waveform generators, etc. Details of the scheduler/compiler are described in more detail hereinafter, and source code for the scheduler/compiler is attached to the disclosure of U.S. Pat. No. 5,287,511 as Appendix M.

The output of the scheduler/compiler contains at least three files: the .spd (SPROC data) file; the .spp (SPROC program) file; and the .sps (SPROC symbol) file. The SPROC data file contains initialization values for the data locations of the SPROC (e.g., 0400 through ffff), which data locations can relate to specific aspects of the SPROC as discussed above with reference to the SPROC hardware. The SPROC program file contains the program code for the SPROC which is held in SPROC program RAM (addresses 0000 to 03ff) and which is described in detail above with reference to the SPROC hardware. The SPROC symbol file is a correspondence map between SPROC addresses and variable names, and is used as hereinafter described by the microprocessor for establishing the ability of the microprocessor to control and/or communicate with the SPROC. If desired, the scheduler/compiler can produce other files as shown in FIG. 10. One example is a .spm file which lists the full file names of all included files.

As aforementioned, the scheduler/compiler produces a symbol file (.sps) for use by the microprocessor. Depending upon the type of microprocessor which will act as a host for the SPROC, the symbol file will be translated into appropriate file formats. Thus, as shown in FIG. 10, symbol translation is accomplished at 2050. Source code in accord with the preferred embodiment of the invention is provided in Appendix C which is attached to the disclosure of U.S. Pat. No. 5,287,511, for a symbol translator which translates the .sps file generated by the scheduler/compiler 2040 to files which can be compiled for use by a Motorola 68000 microprocessor. In accord with the preferred embodiment, the symbol translator 2050 generates to files: a .c (code) file, and a .h (header) file. The code file contains functions which can be called by a C program language application. The header file contains prototypes and symbol definitions for the microprocessor compiler hereinafter described.

Returning to the outputs of the scheduler/compiler 2040, the data and program files are preferably fed to a program MakeLoad 2060 (the source code of which is provided as Appendix D hereto. The MakeLoad program merges the .spp and .spd into a file (.blk) which is in a format for the microprocessor compiler and which can be used to initialize (boot) the SPROC. Of course, if desired, the .blk file can be loaded directly into a microprocessor if the microprocessor is provided with specific memory for that purpose and a program which will access that memory for the purpose of booting the SPROC.

The Makeload program also preferably outputs another file .lod (load) which contains the same information as the .blk (block) code, but which is used by the SPROCdrive interface 2070 to boot the SPROC in stand-alone and development applications. Details regarding the SPROCdrive interface are discussed below. Another input into the SPROCdrive program is the symbol file (.sps) generated by the scheduler/compiler 2040. This allows the SPROCdrive program to configure the SPROC and control the SPROC symbolically. In particular, if it was desired to read the output of a particular block, a command "mad blockname.out" can be used. The .sps file then provides the SPROC address corresponding to the symbol blockname.out, and the SPROCdrive interface then sends a read and return value command to the SPROC 10 via the SPROCbox 2080. The function of the SPROCbox is to provide an RS232 to SPROC access port protocol conversion, as would be evident to one skilled in the art.

C. SPROC Description Language

C.1 Overview of SDL

SPROC description language (SDL) is the language used to create high-level descriptions of arbitrarily complex signal processing systems to be implemented on the SPROC programmable signal processor.

SDL is a block-oriented language that supports heixarchical designs. Blocks may be either primitive or heirarchical.

Primitive blocks also called asmblocks contain hardware-specific coding analogous to the firmware in a microprocessor system. Primitive blocks are written in assembly language. They may not contain references to other blocks.

Code for signal processing functions is written at the primitive level. These primitive blocks comprise the SPROCcells function library. They are optimized for the hardware and efficiently implemented to extract maximum performance from the SPROC chip. Other primitive blocks include the glue blocks or phantoms required to provide control and synchronization functions for the multiple general signal processors (GSPs) on the SPROC chip.

Hierarchical blocks contain references to other blocks, either primitive or hierarchical. The sequence (i.e., firing order) and partitioning (i.e., allocation over the GSPs and insertion of phantom blocks) of the referenced blocks in a hierarchical block is automatically determined.

A hierarchical block that is not referenced by any other block is a top-level block. There must be one and only one top-level block in a design.

Two types of special-purpose hierarchical blocks are also available: sequence blocks and manual blocks.

A sequence block is a hierarchical block that is not automatically sequenced. The order of the references contained in a sequence block specifies the firing order of the referenced blocks.

A manual block is a hierarchical block that is neither automatically sequenced nor partitioned. As with the sequence block, the order of block references in a manual block specifies the firing order of referenced blocks. In addition, referenced blocks are not partitioned, and no phantom blocks are inserted.

A block contains a block name, block definition, and block body. The block name identifies the block for reference by hierarchical blocks. The block definition contains an optional list of parameters; a port list declaring the block's input and output signals; optional general declarations for wires, variables, symbols, aliases, time zones, compute lines, and ports; optional verify statements; and optional duration statements (primitive blocks only)

The block body contains references to other blocks (hierarchical blocks only) or assembly lines (primitive blocks and manual blocks only).

C.2 Compiling SDL Files

SDL files are compiled by the SPROCbuild utility in the SPROClab development system. The utility includes three modules: the MakeSDL module, the Schedule module, and the MakeLoad module.

The MakeSDL module prepares a top-level SDL file that completely describes the signal processing design using the netlist of the signal flow block diagram, primitive blocks from the function library, and other code and data files The Schedule module takes the top-level SDL file and breaks the file apart based on the resource and synchronization requirements of the blocks within the file. Resource requirements include program memory usage, data memory usage, and GSP cycles. Synchronization requirements include the determination of how and when blocks communicate data, and whether a block is asynchronous and independent of other blocks in the design.

After breaking up the file to accommodate resource and synchronization requirements, the Schedule module partitions the file by blocks and locates the blocks to execute on the multiple GSPs on the SPROC chip using a proprietary partitioning algorithm. The module inserts phantom blocks as necessary to control the synchronization of the GSPs as they execute the design.

Then the Schedule module generates a symbol table file that lists the physical RAM addresses on the SPROC chip for all the parameters, variables, and other elements in the design.

The MakeLoad module converts the partitioned SDL file into a binary configuration file to run on the chip.

C.3 Concepts and Definitions

This subsection provides an alphabetical listing of various concepts and definitions used in SDL.

Aliases: An alias maps a new identifier to another existing identifier. Aliases are declared using alias statements. These are more restrictive than symbol declarations, since the translation must be an identifier, not an arbitrary expression. Alias translation is done before any other translation.

Data Types: The type of a variable or wire may be FIXED (fixed point), INTEGER (integer), and HEX (hexadecimal). FIXED type specifies a fixed-point representation of a number in the range of −2 to 1.999999762. FIXED type is the data type native to signals in the SPROC chip.

Expressions: An expression is a statement of a numerical value. An expression can be simply a number or identifier (like a register name), or a combination of numbers, symbols, and operators that evaluates to a numerical value. Expressions in a block are evaluated when the block is instantiated. Expressions may be used wherever a number is required. The operand field of most instructions may contain an expression. Initial values for variables may be declared as expressions. The table below lists the valid operators that may be used in expressions.

| OPERATOR | DESCRIPTION |
|---|---|
| + | plus |
| − | minus |
| * | multiply |
| / | divide |
| ~ | one's complement |
| & | bitwise AND |
| \| | bitwise OR |

-continued

| OPERATOR | DESCRIPTION |
|---|---|
| ^ | bitwise exclusive OR |
| int | convert to INTEGER type |
| log | use base |
| | Ex. a log b identifies a as a base b number |
| exp | raise to the power of |
| | Ex. a exp b is a to the b power |
| fix | convert to FIXED type |
| && | logical AND |
| \|\| | logical OR |
| ! | logical NOT |
| == | EQUAL TO |
| != | NOT EQUAL TO |
| < | less than |
| > | greater than |
| <= | less than or equal to |
| >= | greater than or equal to |
| >> | right shift |
| | Ex. a >> b is "right shift a by b bits" |
| << | left shift |
| | Ex. a << b is "left shift a by b bits" |

Expressions may include identifiers, like parameter names, symbols, and variable, wire, or port names. When translating identifiers to evaluate an expression, if the identifier cannot be found in the current block instance, block instances in successively higher levels are searched until the identifier is found. The identifier is evaluated in the context of the block instance in which it is found.

Numbers used in expressions may be real, integer, hex, or binary numbers. An expression containing a real number evaluates to a real number and may be assigned to the FIXED data type. An expression containing no real numbers (only integer, hex, or binary numbers) evaluates to an integer number and may be assigned to an INTEGER data type.

An expression must evaluate to a value within the range allowed for the data type of the variable or operand to which it is being applied.

Identifiers: An identifier is any series of characters chosen from the following sets: first character—A-Z, a-z, $, %, _, and subsequent characters—A-Z, a-z, $, %, period (.), 0–9

Labels: A label is a special identifier used for a line of assembly code (asmline). An asmline may begin with a label followed by a colon; this specifies the label as the identifier for the asmline. Another asmline may use a jump instruction with the label as an operand to cause the GSP to jump to the memory location associated with the labeled instruction. A label for an asmline is optional and must start with an alphabetic character and be followed by a colon. Labels are case sensitive, so that XXX and Xxx are two unique labels.

Numbers: Numbers may be integer, real, hexadecimal, or binary. Numbers must begin with a digit (0 through 9) or a negative sign (–). Numbers containing a decimal point (.) are real, and may optionally include an exponent, using e or E optionally followed by a signed integer. Hexadecimal number must begin with a digit (0 through 9) and end with a letter H (capital or lower case). Binary numbers must begin with a digit (0 or 1) and end with a letter B (capital or lower case).

Opcodes: An opcode is an alphanumeric code that specifies an assembly instruction from the GSP instruction set. Opcodes entered in asmlines must be in lower case.

Operands: An operand is an expression that specifies the source or destination of an instruction. An operand is present only when required by the specified instruction. An operand can be a simple register identifier, a label, or an expression that evaluates to a specific address.

Parameters: A parameter is an identifier or string that provides a means of customizing an occurrence, or instance, of a block. Parameter values may be passed by a hierarchical block to a lower level hierarchical block. They can also provide immediate values and array sizes for primitive blocks. Parameters are declared in the optional parameter listing for a block. A default value for a parameter may be declared. When a block is instantiated, any parameter values supplied for the instance override the default values. Parameters reserve no storage. Parameter names should begin with a percent sign (%).

Registers: Registers can serve as source or destination operands for instructions. Registers that may only be read by an instruction are source only registers. Registers that may be read or written by an instruction are source/destination registers. Register names used in operand fields must be all upper case.

Strings: A string is a series of characters enclosed within single or double quotes. If the string is enclosed within single quotes, the single quote character is illegal within the string. If the string is enclosed within double quotes, the double quote character is illegal within the string.

Symbols: A symbol is a series of characters (an identifier or a string) that names an expression. The symbol for an expression may be used in other expressions. Appropriately chosen symbol names may be used to make SDL code more readable. Symbols are declared using symbol statements. Symbols may be used within blocks as an initial value for a variable or wire, for example. A symbol may also be passed via a parameter value assignment to an instance within a hierarchical block.

Time Zones: A time zone declaration is required for every signal source block, like the primitive block for a signal generator function, or a serial input port function. The time zone statement declares a time zone name for the block, and optionally, a sample rate for that zone, in samples per second. A sample rate need only be given in one such time zone statement of multiple blocks that declare the same time zone name. The time zone name is used to determine synchronization requirements of blocks. Time zones which have different names are taken to be asynchronous, even if they have the same sample rate.

Variables: Variables are declared using variable statements. Variables may be declared for hierarchical or primitive blocks. A variable may be declared, and an initial value for the variable may also be declared the value may be a number (or expression) or a string (or an expression with no value assigned to it) that identifies a file containing the initial values for, the variable. If the string (file name) entered as the value for a variable includes a period (.), it must be enclosed in single or double quotes. Numbers in the file must be delimited by spaces, tabs, or new lines, and may be real, hexadecimal, integer, or binary numbers. If the file contains fewer values than are required by the variable, any missing values are zero filled. Variables may be scalar or dimensioned as single-dimension arrays. If an initial value is declared as a number (or expression) that value is duplicated for array variables.

Wires: A wire is a signal between primitive blocks in a design. Wires are declared using the wire statement. Wires may be declared in hierarchical blocks only. A wire may be declared, and an initial value for the wire may also be declared. The value may be a number (or expression) or a string (or an expression with no value assigned to it) that identifies a file containing the initial value for the wire. The wire value is by default type FIXED. Wire values are scalar only.

C.4 Rules for Creating Asmblocks

1. Keep state information for asmblocks in variables, not in outputs. Output values are not necessarily maintained between successive calls of an asmblock.

2. Place the assembly code for each asmblock in a separate file unless the asmblock is purely local to another block and is only called by that block. The file name must be the same as the asmblock name defined in the asmblock header, and it must have the extension, .sdl.

3. System identifiers begin with the prefix _% (underscore percent sign). Do not begin identifiers with these characters.

4. Begin parameter names with a percent symbol (%).

5. Write the output of a block to memory each time the block is executed. The software-directed probe used for debug is triggered by writing block output to memory, and will not function properly if blocks are executed without their outputs being written to memory.

6. Enter opcodes in assembly lines in lower case.

7. Enter register names used as operands in assembly lines in upper case.

C.5 Asmblock Structure

Each asmblock includes a header called an asmblock_header, optional declaration statements, and the body of the asmblock containing assembly instructions, or asmlines, as follows:

```
asmblock_header
    optional declaration statements chosen from:
        Duration
        Variable
        Verify
        Symbol
begin
    body, composed of zero or more asmlines
end
```

The asmblock header (asmblock_header) marks the start of an asmblock definition. It identifies the name of the asmblock and includes optional listings for the parameter characteristics and I/O of the asmblock. An asmblock header must have the following format:

```
asmblock name
[{[%parameter[=expression] [, %parameter[=expression]. . .]]}]
[{[in [, in . . . ]]; [out [, out , , . ]]}]
``` where the name identifies the asmblock. (An asmblock name must be included in the asmblock header.) The parameter listing defines characteristics such as initial values that can be referenced by the assembly code appearing later in the body. When an asmblock is instantiated, any parameter values supplied for the instance override the default values set in the parameter listing.

The parameter listing is optional and must be included between braces ({}) if present. Zero or more parameters may be included between the braces; multiple parameters must be separated by commas. A parameter may be an identifier or string. A parameter can be followed by an equals sign and a default value expression. Parameter names should begin with a percent sign (%).

The I/O listing defines the input and output arguments of the asmblock. The I/O listing is optional and must be enclosed in parentheses if present. Inputs are type INPUT and identify starting values. Outputs are type OUTPUT and identify results. (No type INPUT is allowed.) Both the input and output sections are made up of zero or more identifiers separated by commas. The input section must be separated from the output section by a semicolon.

An output section may have an expression declared for it to provide an initial value. This is useful when the initial state of a signal is important.

The keyword micro may be added to the declaration for any input or output of an asmblock. The keyword must precede the identifier in the appropriate section of the I/O listing.

This keyword makes the tagged input or output available for access from a microprocessor for applications using the SPROClink microprocessor interface (SMI) software.

After the asmblock header, the asmblock may include any combination of zero or more of the following optional declaration statements: Duration, Symbol, Variable, Verify.

The duration statement has the format:

duration integer_expression;

A duration statement declares the maximum number of cycles required to execute the asmblock code. A duration statement is required for all asmblocks that have backward branches, and therefore may loop. If no duration statement is present, a duration for the asmblock is computed assuming that every instruction in the asmblock code will be executed.

An integer_expression is an expression that must evaluate to an integer value.

The symbol statement has the format:

```
        symbol [micro] identifier=expression [, [micro]
                identifier=expression . . .];
or
        symbol [micro] string=expression [, [micro]
                string=expression . . . ];
```

A symbol statement defines a symbol name for use in expressions. The optional micro keyword makes the symbol available for access from a microprocessor for applications using SMI.

The variable statement has the format:

```
variable [micro] [type] identifier [[size]] [=expression] [,
    [micro] [type] identifier [[size]] [=expression] . . . ];
```

The variable statement defines storage locations which may optionally be initialized. The micro keyword makes the variable available for access from a microprocessor in applications using SMI. A type specifier defines the type of the variable and must be compatible with the expression, if present. Type can be FIXED, INTEGER, or HEX. FIXED indicates SPROC chip fixed point; INTEGER indicates a base 10 value; and HEX indicates a base 16 value. A size qualifier is used to declare vectors. If present, it must be an integer expression enclosed in square brackets ([]).

The verify statement has the format:
verify expression;
or
verify expression string The verify statement defines a check to be performed by the Schedule module of the SPROCbuild utility. The expression is evaluated and compared to zero. If non-zero, an error message will be generated. If string is present, it will be output as the error message. If no string is present, the failed expression will be expanded into English and presented. Verify statements should be used to check that parameter values lie within an acceptable range. Parameter values may come from the parameter list in the asmblock, or from a hierarchical block that references the asmblock.

The asmblock body contains the code that specifics operating instructions. The asmblock body includes the begin keyword, the asmlines, and the end keyword. An asmline includes a single assembly instruction for the SPROC chip's general signal processor (GSP). This instruction may be in the form of an opcode, a label, or a label and an opcode. An asmline must have the following format:

[LABEL:] [OPCODE] [OPERAND] where

LABEL followed by a colon is an identifier for the asmline. A label is optional and must start with an alphabetic character and be followed by a colon. Labels are case sensitive, so that XXX and Xxx are two unique labels. OPCODE is an alphanumeric code that specifies an assembly instruction from the GSP instruction set. An opcode is optional. Opcodes entered in asmlines must be lower case. OPERAND is an expression that specifies the source or destination of the instruction specified by an opcode. An operand is present only when required by the specified instruction.

Any asmline can be terminated by a semicolon. The semicolon is optional and has no meaning; it is purely stylistic.

Comments may be included in any asmblock as separate comment lines, or they may be included within any other line in the asmblock. When comments are included as separate lines in an asmblock, each comment line must be introduced by the comment characters (//). When comments are included within another line in the asmblock, they must either be enclosed between delimiting characters (/* and */), as in the C language, or appear at the end of the line and be preceded by the comment characters (//).

C.6 SPROC Chip Architecture, Instructions and Registers

The instruction format for program ram is shown in the table below:

| | |
|---|---|
| Total Width | 24 bits |
| Opcode | 6 bits |
| Operand | 15 bits |
| Address mode | 3 bits, eight modes |

The data format is shown in the table below:

| | |
|---|---|
| Total Width | 24 bits |
| Range fractional | −2 to +1.999999762 |
| Code | OQ.22, 2's complement with 22 bit fraction |

The multiplier format is as follows:

| | |
|---|---|
| Input registers | 24 bits |
| Output register | 56 bits including 8 bits of overflow protection |

The basic GSP instruction set is listed in the table below:

| OPCODE | OPERAND TYPE | DESCRIPTION |
|---|---|---|
| add | source | Add without carry. Load operand into ALU and sum with contents of accumulator. Result is stored in the accumulator |
| adc | source | Add with carry. |
| and | source | AND contents of accumulator with operand. Result is stored in accumulator. |
| asl | none | Arithmetically shift the accumulator contents 1 bit to the left and store the result in the accumulator. The most significant bit (msb) is shifted into the carry bit C and a zero is shifted in the least significant bit (lsb) of the accumulator. |
| asr | none | Arithmetically shift the accumulator contents 1 bit to the right and store the result in the accumulator. The lsb is shifted into the carry bit C, and the msb is held constant, (sign extended). |
| clc | none | Clear carry bit of status register. |
| cmp | source | Compare operand with accumulator contents and update the status register. Accumulator is unmodified by a compare instruction. |
| djne | source | Test loop flag, jump not equal to zero to specified operand address, then post decrement loop register. |
| jmp | source | Unconditional jump to operand address in the program RAM. Execution continues from the operand address. |
| jxx | source | Jump on condition code true.<br>xx CONDITION   TRUE CONDITION<br>cc Carry Clear   ~CF<br>cs Carry Set   CF<br>lf Loop Flag Set   LF<br>mf Multiplier Overflow Flag Set   MF<br>ne ZF Clear   ~ZF<br>ov Overflow   OF<br>si Sign   SF<br>eq same as ZE   ZF<br>ge >=   (OF & SF) I (~OF & ~SF)<br>ze Zero/Equal   ZF<br>le <=   (~OF & SF) I (OF & ~SF) I ZF<br>gt >   ~ZF & ((OF & SF) I (~OF & ~SF))<br>lt <   (~OF & SF) I (OF & ~SF)<br>wf Wait Flag Set   WF |
| ldr | source | Load destination register (r) with operand. |

| OPCODE | OPERAND TYPE | DESCRIPTION |
| --- | --- | --- |
| ldy | source | Alias for mpy |
| mac | source | Load Y register of multiplier with operand value and execute the multiply/accumulate operation which adds the multiplication result to the contents of the M register. There is a two cycle latency before the result is available. The X register can be loaded with a new value during this two cycle period. |
| mpy | source | Load Y register of multiplier with operand value, and execute the multiplication operation, placing the result in the M register. There is a two cycle latency before the result is available. The X register can be loaded with a new value during this two cycle period. |
| nop | none | No operation. |
| not | none | Perform a one's complement of accumulator. Result is stored in the accumulator. |
| ora | source | OR contents of accumulator with operand. Result is stored in accumulator. |
| rol | none | Rotate accumulator contents left 1 bit through carry. |
| ror | none | Rotate accumulator contents right 1 bit through carry. |
| sec | none | Set carry bit of status register. |
| str | destination | Store contents of register (r) at destination address. |
| sub | source | Subtract without carry. Load operand into ALU register and subtract from accumulator. Result is stored in the accumulator register. |
| subc | source | Subtract with carry. |
| xor | source | Exclusive OR contents of accumulator with operand. Result is stored in accumulator. |

The following instructions have restrictions:

| INSTRUCTION | RESTRICTION |
| --- | --- |
| djne | If the starting value placed in the D register is odd, and the decrement is an even value, this instruction can result in an endless loop. |
| str | This instruction cannot use immediate addressing. This instruction cannot use register addressing. For register to register "storing", use ldr. |

Privileged instructions, reserved for special purposes, are listed below. These instructions are available but intended solely for use during debug via the SPROCdrive interface (SDI) software using the SPROCbox interface unit. Do not use these instructions in asmblocks.

| INSTRUCTION | OPERAND | DESCRIPTION |
| --- | --- | --- |
| lbsj | source | Load BS and jump. Load the program counter plus one and the condition codes into the BS register and jump to operand. |
| ldcc | source | Load condition codes. Replace 4 bits of condition code register with 4 bits of operand (CF, OF, SF, ZF). |
| xld | source | Load parallel port input register with contents of externally addressed memory location. The operand specifies an external address in the range of 0 through 64K. NOTE: This instruction alters the value in the A register. The state of the CF, SF, and ZF flags is unknown after this instruction. |

The following source/destination registers are provided:

| REGISTER NAME | FUNCTION | SIZE |
| --- | --- | --- |
| A | accumulator | 24 bits |
| B | base | 16 bits |
| BS | break status | 24 bits |
| D | decrement | 8 bits |
| F | frame pointer | 16 bits |
| L | loop | 12 bits |
| WS | wait status | 24 bits |
| X | multiplier input x | 24 bits |
| Y | multiplier input y | 24 bits |

The break status register is a special purpose source/destination register. It holds a copy of both the program counter incremented by 1, and the GSP condition code flags, after a break is executed. This register is used only by the SPROCbox interface unit for debug. The bits of the break status register are defined as follows:

| BIT | CONTENTS | DEFINITION |
| --- | --- | --- |
| 0 through 11 | PC+1 | copy of program counter + 1 at break event |
| 12 | 0 | unused |
| 13 | | current jump state |
| 14 and 15 | GSP | identity of GSP issuing the halt |
| 16 | CF | carry flag status |
| 17 | OF | overflow flag status |
| 18 | SF | sign flag status |
| 19 | ZF | zero flag status |
| 20 | LF | looping flag status |
| 21 | MF | multiplier overflow flag status |
| 22 | WF | wait flag status |
| 23 | 0 | unused |

The multiplier output register, M, is the sole source only register. The M register is a 56-bit register divided into three sections: guard; hi; and lo; that are assigned individual register identifiers. In addition, each of these three sections uses two different register identifiers to distinguish between integer and fixed point access modes.

The source only register identifiers for the sections of the multiplier output register are listed below:

| REGISTER NAME | FUNCTION | ACCESS MODE | SIZE |
|---|---|---|---|
| MG | multiplier guard bits | fixed point | 10 bits, sign extended to 24 bits |
| MH | multiplier hi | fixed point | 24 bits |
| ML | multiplier lo | fixed point | 24 bits |
| MGI | multiplier guard bits | integer | 8 bits, sign extended to 24 bits |
| MHI | multiplier hi | integer | 24 bits |
| MLI | multiplier lo | integer | 24 bits |

The result of an integer multiply will be found in the MLI register. The result of a fixed point multiply will be found in the MH register.

All flags are initially in an undefined state until affected by an instruction. The list below shows how each flag is affected by each instruction.

Although the GSPs in the SPROC chip use a 24-bit data word, an instruction opcode can only hold an immediate value of 15 bits. Immediate addressing modes facilitate left or right justification of these 15 bits when forming an immediate data word. The immediate addressing modes differ for data operands and address operands. Eight modes are supported for data operand addressing, and seven modes are supported for address operand addressing.

The eight immediate addressing modes for data operands are listed below:

| | OPCODE FLAG NAMES | | | | | | |
|---|---|---|---|---|---|---|---|
| | CARRY (CF) | LOOPING (LF) | MULTIPLIER OVERFLOW (MF) | OVERFLOW (OF) | SIGN (SF) | WAIT (WF) | ZERO (ZF) |
| adc | U | — | — | U | U | — | U |
| add | U | — | — | U | U | — | U |
| and | — | — | — | O | U | — | U |
| asl | U | — | — | O | U | — | U |
| asr | U | — | — | O | U | — | U |
| clc | O | — | — | — | — | — | — |
| cmp | U | — | — | U | U | — | U |
| djne | — | U | — | — | — | — | — |
| jxx | — | — | — | — | — | — | — |
| lbsj | — | — | — | — | — | — | — |
| lda | — | — | — | O | U | — | U |
| ldcc | U | — | — | U | U | — | U |
| ldl | — | U | — | — | — | — | — |
| ldr (other) | — | — | — | — | — | — | — |
| ldws | — | — | — | — | — | U | — |
| mac | — | — | U | — | — | — | — |
| mpy | — | — | U | — | — | — | — |
| nop | — | — | — | — | — | — | — |
| not | — | — | — | O | U | — | U |
| ora | — | — | — | O | U | — | U |
| rol | U | — | — | O | U | — | U |
| ror | U | — | — | O | U | — | U |
| sec | 1 | — | — | — | — | — | — |
| str | — | — | — | — | — | — | — |
| sub | U | — | — | U | U | — | U |
| subc | U | — | — | U | U | — | U |
| xor | — | — | — | O | U | — | U | where O means clear status flag; 1 means set status flag; U means update status flag; and — means do not change status flag

| MODE | FORMAT | DESCRIPTION |
|---|---|---|
| direct | xxx | Use the 15-bit operand as a data memory address. The address always accesses the data memory. |
| immediate left | # < xxx | Default for FIXED numbers. Take the 15-bit operand, left justify and zero fill low order bits to generate a 24-bit value for immediate use. This mode is used to represent fractional numbers. |
| immediate right | # > xxx | #xxx default. Take the 15-bit operand, right |

| MODE | FORMAT | DESCRIPTION |
|---|---|---|
| | | justify and sign extend high order bits to generate a 24-bit value for immediate use. This mode is used to represent immediate integer numbers. |
| register | sr | Source register. Use the 15-bit operand as a register identifier. |
| base indexed | [B + xxx] | Use the 15-bit operand as an offset to the base register (register B) to determine the data memory address. |
| base loop indexed | [B + L + xxx] | Use the 15-bit operand as an offset to the base register (register B) plus the loop register (register L) to determine the data memory address. |
| frame indexed | [F + xxx] | Use the 15-bit operand as an offset to the frame pointer register (register F) to determine the data memory address. |
| frame loop indexed | [F + L + xxx] | Use the 15-bit operand as an offset to the frame pointer register (register F) plus the loop register (register L) to determine the data memory address. |

If offset is zero, +0 is optional.

For jmp and conditional jxx instructions, the operand field specifies the address at which program execution must proceed, when required by the instruction. The immediate addressing modes for address operands are listed as follows:

| MODE | DESCRIPTION |
|---|---|
| direct | Use the 15-bit operand as the destination address. The operand must be a relocatable LABEL; no absolute expression is allowed as the destination address. |
| indirect | The 15-bit operand, enclosed in square brackets ([ ]) points to a data memory location containing the destination address. |
| register | The specified source register contains the address. |
| indirect base indexed | Use the 15-bit operand as an offset to the base register (register B) to determine the data memory address containing the jump destination. |
| indirect base loop indexed | Use the 15-bit operand as an offset to the base register (register B) plus the loop register (register L) to determine the data memory address containing the jump destination. |
| indirect frame indexed | Use the 15-bit operand as an offset to the frame pointer register (register F) to determine the data memory address containing the jump destination. |
| indirect frame loop indexed | Use the 15-bit operand as an offset to the frame pointer register (register F) plus the loop register (register L) to determine the data memory address containing the jump destination. |

The following table lists the keywords and other reserved words in SDL.

| A | eor | jmp | MG | seqblock | upsample |
|---|---|---|---|---|---|
| adc | exp | jne | MGI | sta | variable |
| add | F | jov | MH | stb | verify |
| alias | fix | jsi | MHI | stbs | virtual |
| and | fixed | jwf | micro | std | wire |
| asl | gpio | jze | ML | stf | WS |
| asmblock | hex | L | MLI | stl | X |
| asr | init | label | mpy | stmg | xld |
| B | input | lbsj | nop | stmgi | xor |
| begin | int | lda | not | stmh | Y |
| block | integ | ldb | ora | stmhi | |
| BS | integer | ldcc | org | stml | |
| callblock | jcc | ldd | output | stmli | |
| clc | jcs | ldf | param | stws | |
| cmp | jeq | ldl | phantom | stx | |
| computeline | jge | ldws | port | sty | |
| D | jgt | ldx | real | sub | |
| djne | jle | ldy | rol | subc | |
| downsample | jlf | log | ror | subrblock | |
| duration | jlt | mac | rts | symbol | |
| end | jmf | manblock | sec | timezone | |

D. The SPROC Compiler

Returning to details of the scheduler/compiler 2040, the basic function of the scheduler/compiler 2040 is to take the user's design which has been translated into a scheduler/compiler understandable format (e.g., SPROC Description Language), and to provide therefrom executable SPROC code (.spp), initial data values (.spd), and the symbol file (.sps). The preferred code for the scheduler/compiler is attached to the disclosure of U.S. Pat. No. 5,287,511 as Appendix M, and will be instructive to those skilled in the art.

The scheduler/compiler does automatic timing analysis of each design provided by the user, allocating the necessary SPROC resources to guarantee real-time execution at the required sample rate. In order to guarantee real-time execution, the scheduler/compiler preferably performs "temporal partitioning" (although other partitioning schemes can be used) which schedules processors in a round-robin fashion so as to evenly distribute the compute power of the multi-GSP SPROC. Each GSP picks up the next sample in turn, and executes the entirety of the code in a single time zone (i.e., that part of the user's design which runs at the same sample clock). Additional information regarding time zones can be obtained by reference to U.S. Pat. No. 4,796,179 to Lehman et at. which provides time zones for a microprocessor based system.

The scheduler/compiler 2040 also insert "phantom blocks" into the user's design which supply the necessary system "glue" to synchronize processors and input/output, and turn the user's design specification into executable code to effect a custom operating system for the design. Preferred code for the phantom blocks is found attached to the disclosure of U.S. Pat. No. 5,287,511 as Appendix E (Scheduler/Compiler Phantom Block Source Code) incorporated herein by reference.

Because it is possible for a block which the user has designated to have a varying execution time, the GSPs running common code under temporal partitioning could conceivably collide or get out of sequence. Phantom blocks called "turnstiles" are inserted at every sample period's worth of code to keep the GSPs properly staggered in time. By computing and using maximum and minimum durations rather than a maximum duration and an assumed minimum duration of zero, the turnstiles may be placed to optimize the code variability. The scheduler/compiler code provided in Appendix M attached to the disclosure of U.S. Pat. No. 5,287,511, however, does not optimize in this manner. Also, output FIFOs are created whose size depends on code execution time variability. These output FIFOs can also be optimized.

In temporal partitioning, a GSP can overwrite a signal memory location with its new value before the old value has been used by another GSP which requires that value. In order to prevent this overwriting problem, phantom blocks which create "phantom copies" of signal values are inserted. A different manner of solving this problem is to cause each GSP to maintain its own private copies of signal values, with phantom blocks automatically added, which for each signal, writes successive values to an additional single memory location so that it may be probed at a single memory address.

The scheduler/compiler supports asynchronous timing as well as decimation and interpolation. Decimation and interpolation are accomplished within temporal partitioning by "blocking" the signal values into arrays, and operating on these arrays of values rather than on single signal values. Thus, for example, in decimating by four, four input samples are buffered up by the input data flow manager. The code blocks before the decimator are looped through four times, along with any filtering associated with the decimation, and then the code after the decimator is run once.

Various design integrity checks are performed by the scheduler, such as determining if multiple inputs to a cell have incompatible sample rates, or if any inputs have been left "floating". The scheduler/compiler supports feedback loops within a design, and automatically detects them.

A powerful parameter-passing mechanism in the scheduler/compiler allows each instance of a cell to be customized with different parameters. Parameter values need not be absolute, but can be arbitrary expressions utilizing parameters of higher level cells. The scheduler/compiler provides for cells to verify that their parameter values are legal, and to issue compile-time error messages if not.

Arbitrary design hierarchy is supported by the scheduler/compiler, including multiple sample rates within hierarchical blocks. Using only a schematic editor (e.g., the OrCad system), users may build their own hierarchical composite cells made up of any combination of library primitive cells and their own composite cells. Details of component cells may be hidden, while providing any necessary SPROCdrive interface/SPROClink microprocessor interface access to selected internal memory locations. Composite cells may also be built which provide access to internal memory locations directly through the composite cell's input/output, allowing efficient, directly wire control of parameters.

Figure 12:
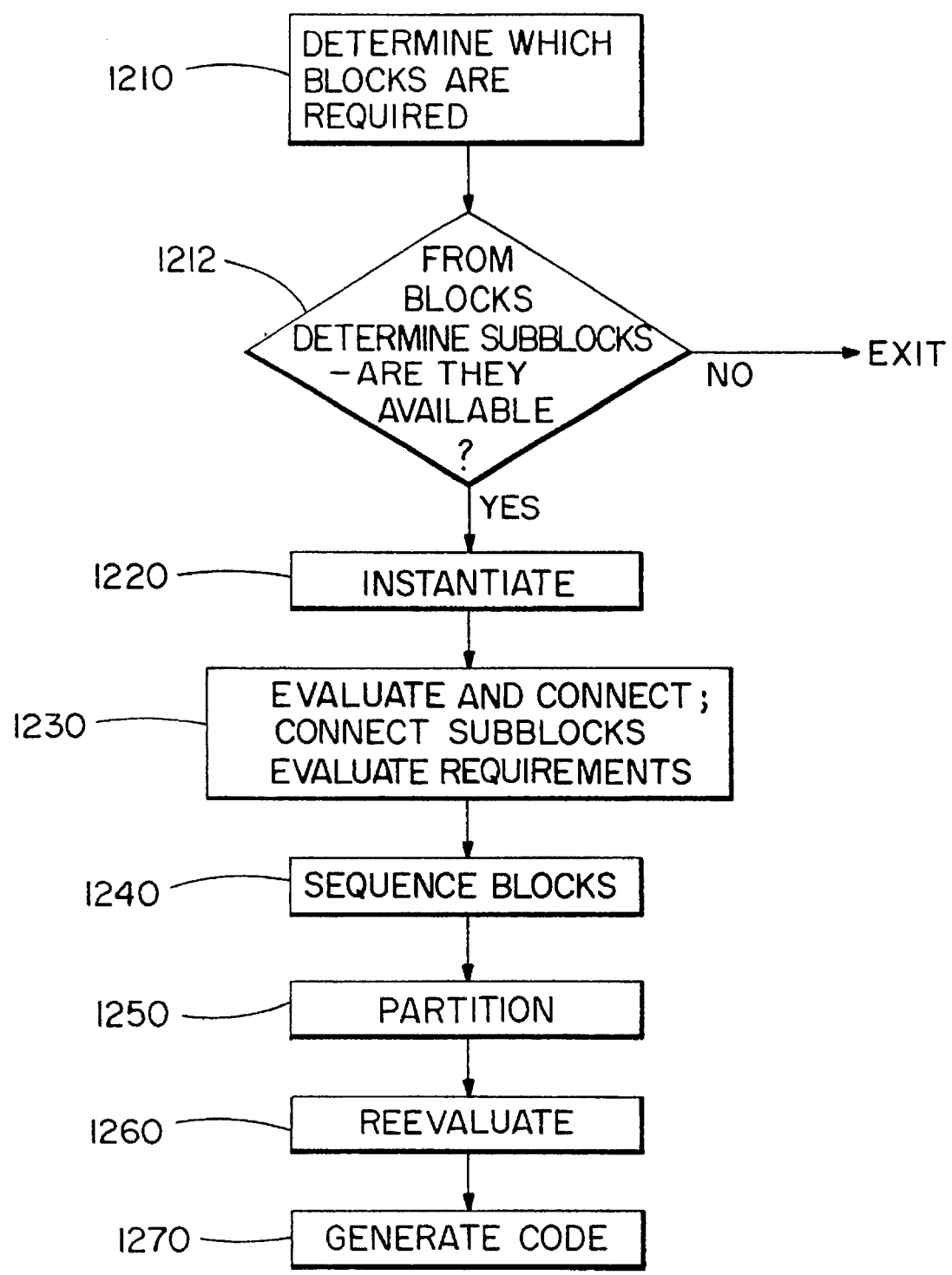
FIG. 12 is a high level flow chart of the compiler utilized in the development system of the invention.

A high level flow diagram of the compiler preferably used in conjunction with the SPROC 10 of the invention is seen in FIG. 12. When the user of the development system wishes to compile a design, the user runs the compiler with an input file containing the design. The compiler first determines at 1210 which of its various library blocks (cell library 2015) are needed. Because some of the library blocks will need sub-blocks, the compiler determines at 1212 which sub-blocks (also called child blocks) are required and whether all the necessary library block files can be read in. If they can, at 1220 the compiler creates individual instances of each block required, since the same block may be used more than once in a design. Such a block may be called with different parameters which would thereby create a different version of that block. The instances generated at step 1220 are represented within the compiler data structures as a tree, with the top level block of the user's design at the root of the tree. At 1230, the compiler evaluates the contents of each instance, and establishes logical connects between the inputs and outputs of child instances and storage locations in higher level instances. In evaluating an instance, the compiler determines code and data storage requirements of that instance, and assembles the assembly language instructions which comprise the lowest level child instances. At 1240, the compiler sequences the instances by reordering the list of child instances contained in each parent instance. This is the order in which the set of program instructions associated with each lowest level child instance will be placed in the program memory 150 of the SPROC 10. To do this, the compiler traces forward from the inputs of the top level instance at the root of the tree, descending through child blocks as they are encountered. When all inputs of an instance have been reached, the instance is set as the next child instance in the sequence of its parent instance. Feedback loops are detected and noted. At 1250, the compiler partitions the design over multiple GSPs. Successive child instances are assigned to a GSP until adding one more instance would require the GSP to take more than its allowed processing time; i.e. one sample period. Succeeding child instances are assigned to a new GSP, and the process continues until all the instances are assigned to respective GSPs. As part of the partitioning step 1250, the compiler inserts instances of phantom blocks at the correct points in a child sequence. Phantom blocks are blocks which are not designated by the user, but which are necessary for the correct functioning of the system; e.g. blocks to implement software FIFOs which pass signals form one GSP to the next GSP in the signal flow. At step 1260, the compiler re-evaluates the instances so that the phantom block instances added at step 1250 will be fully integrated into the instance tree data structure of the compiler. Then, at 1270, the compiler generates program code (.spp) by traversing the instance tree in the sequence determined at step 1240, and when each lowest level child instance is reached, by outputting to a file the sequence of SPROC instructions assembled for that instance. It also outputs to a second file desired initialization values (.spd) for the data storage required at each instance. It further outputs to a third file the program and data locations referenced by various symbolic names (.sps) which were either given by the user or generated automatically by the compiler to refer to particular aspects of the design. As aforementioned, additional details of the scheduler/compiler may be seen in the preferred code for the scheduler/compiler which is attached to the disclosure of U.S. Pat. No. 5,287,511 as Appendix M.

E. The Microprocessor

Referring now to the microprocessor side of FIG. 10, a C compiler and linker available from Intermetrics (including a debugger "XDB" and a compiler/linker "C Tools") is shown for a microprocessor (logic processor). The inputs to the C compiler include the symbol translation files (.c and .h) provided by the symbol translator 2050, the SPROC boot file (.blk) provided by the MakeLoad software 2060, functions provided by the SPROC C library 2110 hereto, and either manually generated text editor inputs from text editor 2035 or automatically generated code such as might be generated according to the teachings of U.S. Pat. No. 4,796,179 from a block diagram. Because of the code provided by the symbol translator 2050, source code from the text editor can refer symbolically to variables (e.g., fdt1.out) which have been compiled by the SPROClab system. This is critical for the ability of the microprocessor to interface with the SPROC; i.e., for the microprocessor to obtain information via the host or other port from various locations in the SPROC RAM.

The SPROC C function library routines are provided to convert SPROC data types to C compatible data types. The SPROC boot file provided to the C compiler and linker 2100 by the MakeLoad routine 2060 is not particularly processed by the compiler, but is fed into a memory block of the microprocessor's memory space.

The output of the compiler/linker 2100 can be used directly to program the microprocessor 2120, or as shown in FIG. 10 can be provided to a microprocessor emulator 2110. Microprocessor emulator 2110 available from Microtek helps in the debugging process of the microprocessor. As the emulator is not a required part of the system, additional details of the same are not provided herewith. As shown in FIG. 10, the programmed microprocessor 2120 interfaces with the SPROC 10 through the host (parallel) port of the SPROC, although information can be obtained in a serial fashion from a SPROC access port if desired.

As aforementioned, the compiler/linker 2100 for the microprocessor receives code from a text editor or an automatic code generating system. To read and write sample data values, icons are placed on the signal processor block diagram (an example of which is shown in FIG. 11), and the symbol names which might be read from or written to by the microprocessor are made known to the microprocessor compiler/linker by the symbol translator. If the user wishes to read or write signal processor block diagram parameter values (e.g., gain of amp1=x), the user references the symbol name in the microprocessor source code (i.e., the user uses the text editor).

In accord with another aspect of the invention, code for the microprocessor may be automatically generated rather than being generated by the user via the text editor. In automatically generating code for the microprocessor, a block diagram of the microprocessor functions can be entered in a manner similar to that described above with reference to the signal processor block diagram. Then, utilizing the teachings of U.S. Pat. No. 4,796,179, code may be generated automatically. Where automatic programming via block diagram entry of both the signal processor and microprocessor is utilized, reading and writing by the microprocessor of sample data values of the SPROC is accomplished as before (i.e., icons are placed on the signal processor block diagram and the symbol names which might be read from or written to by the microprocessor are made known to the microprocessor compiler/linker by the symbol translator.) However, the reading or writing by the microprocessor of signal processor parameter values is preferably accomplished by providing "virtual" wires between the microprocessor and SPROC blocks. Because the virtual wires are not real wires, no storage is allocated to the virtual wires by either the SPROC or the microprocessor during compilation. However, the location (e.g., amp1 gain) to which the virtual wire refers is placed in the .sps file such that the symbol translator 2050 makes it known to the automatic microprocessor compiler. In this manner, the symbolic reference to the parameter is the same for both the SPROC and microprocessor compilers and this permits the microprocessor to read or write that parameter.

Where graphic entry and automatic programming are used for both the microprocessor and SPROC, some means for distinguishing what is to be processed by the microprocessor and what is to be processed by the SPROC is required. A simple manner of distinguishing between the two is to require user entry which will define a block as a block to be executed by the SPROC (e.g., block.spr) or a block to be executed by the microprocessor (e.g., block.mic). Where it is desired to provide blocks which will be executed by both the SPROC and the microprocessor (possibly also including virtual wires), a hierarchical block should be provided. The hierarchical block will contain child blocks which will be designated as .spr or .mic blocks as discussed above.

Another manner of distinguishing what is to be processed by the microprocessor and what is to be processed by the SPROC is to segment the tasks by the sample rate at which the block is functioning, with the relatively slow sampling rate tasks being handled by the microprocessor and the relatively fast sampling rate tasks being handled by the signal processor. Of course, if all blocks are predefined (i.e., are contained in a library), the precoded library code divides the code into code intended for the SPROC and code intended for the microprocessor. Regardless, where graphic entry for both signal processing and logic processing is permitted, the graphic entry eventually results in separate automatic compilation for both the SPROC and the microprocessor, with the SPROClab compiler again providing the necessary symbol table for incorporation during compilation of the microprocessor code.

E.1 SPROClink Microprocessor Interface

The SPROClink microprocessor interface (SMI) is a set of components used to develop microprocessor applications in ANSI C that include the SPROC chip as a memory mapped device. With the components of SMI, one can create microprocessor applications that separate the logic processing tasks that run best on a microprocessor from the real-time signal processing tasks that run best on the SPROC chip. Partitioning the design in this way increases the performance and efficiency of the application.

The SPROC chip communicates with the microprocessor at high speed via the SPROC chip parallel port and appears as a memory mapped device occupying 16K bytes of microprocessor memory space. SPROC chip memory is 4K of 24-bit words that map to the microprocessor as 32-bit words.

SMI supports applications using either Motorola-type (little endian) and Intel-type (big endian) byte ordering.

E.2 SMI Components

SMI includes a symbol translator (SymTran) and the SPROC C function library (sproclib.c).

The symbol translator converts the symbol file produced in the SPROClab development system into a data structure that mirrors the symbol file. This allows for external C references to SPROC chip memory addresses as if the SPROC chip's memory were a C structure.

The SPROC C function library contains the source code and header files for basic functions required to access the SPROC chip from a microprocessor. The library includes the SPROC chip load, reset, and start functions, as well as the data conversion functions required for the microprocessor to correctly access and interpret the 24-bit fixed-point data type native to the SPROC chip.

The components of SMI are not like other SPROClab software tools; they are not invoked from the development system environment. Instead, the components of SMI provide source code, in ANSI C, that is used outside of the SPROClab development system, in an embedded system development environment. By accessing these files using the tools in the embedded system development environment, one can create microprocessor applications in C that include the SPROC chip. Such applications require, however, that one hardware memory map the SPROC.

E.3 The Development Process

The process required to develop a microprocessor application that includes one or more SPROC chips as memory mapped devices requires work that must be done in the SPROClab development system, and work that must be done in the embedded system development environment.

In the SPROClab development system, one must create, debug, and tune the signal processing design using the SPROClab development system tools; and run the SPROCbuild utility to produce the configuration file that the microprocessor application will use to load the signal processing design onto the SPROC chip.

In the embedded system development environment, one must translate the symbol file produced by the SPROCbuild utility into the data structure needed to provide microprocessor access to SPROC chip memory addresses; copy the configuration file, the data structure, and all relevant file sections from the SPROC C function library into the applications work area; and create the microprocessor application. In addition, one must also map the SPROC chip(s) into the microprocessor's memory.

It should be noted that aspects of the microprocessor application depend on output from the signal processing design development process. If one develops the portion of the microprocessor application that deals with the SPROC chip in parallel with the signal processing design, it is important to understand the relationship between the two processes and the dependencies described herein. Otherwise, changes made to the signal processing design may require changes to the microprocessor application.

E.4 Input Requirements

Although SMI does not run under the SPROClab development system, it does require two input files from the development system: a configuration file, and a symbol file.

The configuration file is produced by MakeLoad, a module of the SPROCbuild utility in the SPROClab development system. It includes the program and data that comprise the signal processing design. As a default, the SPROCbuild utility produces a standard configuration file in Motorola S-record format that can be loaded to the SPROC chip from the SPROCdrive interface. This standard configuration file is called a load file and has the file extension .lod. Because the configuration file used by SMI will be compiled by a C compiler and loaded from a microprocessor, the standard S-record format configuration file cannot be used. A special configuration file, called a block file, is required. The block file contains the C code describing the SPROC chip load as an initialized array of data, and it has the file extension .blk. The SPROCbuild utility will produce the configuration file as a block file in addition to a load file if the invocation line switch for the MakeLoad module is entered when running the SPROCbuild utility.

The symbol file is produced by the Schedule module of the SPROCbuild utility. The standard symbol file has the file extension .sps. It provides access to memory addresses on the SPROC chip using symbolic names instead of direct memory references. Because the symbol file used by SMI must be included in C programs and compiled by a C compiler, the file must be in a different format than the standard symbol file. To create this special version of the symbol file, the symbol translator (SymTran) takes as input the symbol file generated by the SPROCbuild utility and produces C header and code files that create a data structure mirroring the symbol file and including all necessary variable declarations. The symbol translator produces one header file and one code file for each signal processing design.

E.5 Signal Processing Design Considerations

In order for a signal processing design created in the SPROClab development system to be usable in a microprocessor application, the microprocessor must have access to the values of variables in the design running on the SPROC chip. Special cells in the SPROCcells function library provide this access by flagging specific nodes in the design for microprocessor visibility. This "micro" keyword triggers the symbol translator to make external C references to the associated symbols available. Only symbols with this micro keyword are available to the microprocessor.

E.6 Embedded System Development Considerations

The signal processing design must be completed and debugged using the SPROClab development system software. The SPROCdrive interface software is the primary tool for interactively debugging and tuning designs for the SPROC chip. In general, the signal processing design should be completed to a stable interface level before development of the microprocessor application begins. If the signal processor design is modified later, the symbol file and block file generated from it must be updated, and the microprocessor application using the files must also be modified to accommodate the change. It is advisable to use a dependency file and make facility to track inter-related design modifications and ensure consistent creation and use of up-to-date files.

E.7 Using the SPROC Configuration File

The SPROC configuration file contains the program and data that executes on the SPROC chip. It is produced by the MakeLoad module of the SPROCbuild utility in the SPROClab development system. The configuration file is normally generated in Motorola S-record format for loading from the SPROCdrive interface. It must be generated as an initialized data array for loading from a microprocessor application. A switch setting in the invocation line of MakeLoad determines which format of the configuration file will be produced. The configuration file generated as an initialized array of data is called a block file, and has the file extension .blk. (The base of the file name matches the base of the signal flow diagram from which the configuration was generated.) This file includes the block-formatted data that comprises the load for the SPROC chip, and it declares a C variable that identifies that block of data. This C variable, the block variable, has the following form: mydesign_block where mydesign is the base name of the block file (the same base as the signal flow diagram of the design, and the same base as the symbol file input to the symbol translator).

In a microprocessor application, the block file is available as a block of data that can be downloaded to the memory mapped SPROC chip using a C function call and the block variable. The sproc_load function included in the SPROC C function library will download the block file to the SPROC chip.

E.8 Using the Symbol Translator

The symbol translator (SymTran) converts the symbol file produced by the SPROCbuild utility in the SPROClab development system into a data structure that declares C variables for SPROC memory addresses. Output from the symbol translator declares a global static variable that identifies the complete data structure. This data structure occupies 4K by 4 bytes of microprocessor memory. The variable declared to identify the structure is the sproc_id, and the variable name matches the base name of the symbol file. The symbol translator produces the header and code files needed to provide external C references for SPROC chip memory addresses. The header file makes the SPROC memory addresses available to the microprocessor for reference as C variables, and the code file locates the C variables at the appropriate places in the SPROC chip memory map.

The symbol file generated by the SPROCbuild utility in the development system has the file extension .sps. (The base of the file name matches the base of the signal flow diagram from which the symbol file was generated.) The symbol translator translates the symbol file into a header file (with extension .h) and a code file (with extension .c) that use the same base file name as the input symbol file. For example, the SPROCbuild utility uses a signal flow block diagram named mydesign.sch to produce a symbol file named mydesign.sps. The symbol translator uses this symbol file (mydesign.sps) to produce the header file mydesign.h and the code file mydesign.c.

Not all of the SPROC memory addresses represented by symbols in the symbol file are available to the microprocessor. Only symbols that include the micro keyword are made visible to the microprocessor. This keyword is set as a characteristic of the specific cells used in the signal flow block diagram of the design.

Due to difference in syntax, some of the characters used in symbol names for the SPROC chip environment cannot be used in C. Symbols that use characters that are illegal in C are altered during translation to make them legal. For example, all symbols that contain the % character are converted to contain a capital P character. Symbols of this form typically identify SPROC chip register addresses.

The symbol file includes symbolic names for all SPROC memory addresses. The symbol file provides a hierarchical structure that uniquely identifies nodes and attributes of all cell instances in a signal processing design. Levels of hierarchy in symbol names are separated by a dot (.) character. For example, in the symbol name amp1.gain, amp1 is the amplifier cell that contains the specific attribute (gain) named by the symbol. In addition to determining the hierarchy of nodes and attributes, the SPROCbuild utility also determines the order in which these elements will be processed on the chip, and it assigns chip memory locations (addresses) based on this order. The address for a node or attribute is saved in the symbol file along with its symbol name, so that the symbol file comprises an address map of the symbol names for all nodes and attributes in the design.

Some nodes and attributes can be referenced by multiple symbols (or aliases). For example, a wire that connects two cells is both the output of the first cell and the input of the second. In addition, a label may be specified for the wire. All three symbols, for the output of the first cell, the input of the second cell, and the label for the wire, refer to the same node on the design and to the same location in SPROC chip memory. When such aliases are translated, the symbol translator ensures that all aliases for a symbol refer to the same location in SPROC chip memory.

Only the SPROCbuild utility can manipulate the order of the nodes and attributes represented by the address structure. This structure may change any time the utility is invoked to convert a block diagram and generate a configuration file and a symbol file, depending on what changes have been made to the design. If the order of nodes and attributes changes, the address assignments that represent that order change. Therefore, one must always be sure to work with a current version of the symbol file, and never make assumptions about the addresses assigned to symbols or the order of nodes and attributes relative to each other.

E.9 Using the SPROC C Function Library

The SPROC C function library (sproclib.c) includes the basic functions necessary to allow the microprocessor to control the SPROC chip. The SPROC C function library includes source modules that determine the byte ordering supported by SMI, define SPROC data types, provide functions to convert C's data types to and from SPROC data types, and provide functions for the microprocessor to load the SPROC chip and start execution of the signal processing design. All modules are supplied as source and must be compiled and linked in the embedded system development environment. Not all modules are required for every application. The user may select the specific modules needed for a particular application and compile and link only those. If the embedded system design environment supports libraries, one may compile all modules and build them into a library from which one can reference selected modules for linking in a specific application.

Because the data type native to the SPROC chip is incompatible with C's intrinsic floating point data type, SMI defines specific SPROC data types for access from the microprocessor application. It also provides conversion functions to convert to and from the defined SPROC data types. The SPROC data types provided by SMI are:

FIX24_TYPE, the data type native to the SPROC chip, a fixed-point, 24-bit 2's compliment value in the range $-2 \leq x < 2$.

FIX 16_TYPE, supports applications where precision can be sacrificed for increased speed of data transfer. It is the most significant 16 bits of the FIX24_TYPE data.

INT24_TYPE is a 24-bit integer data type.

All symbols are declared to be sdata, a union of all SPROC data types. The header file sprocdef.h defines the SPROC data types and function prototypes. It must be included in each C module that references SPROC data values.

SMI supports applications using both Motorola-type (little endian) and Intel-type (big endian) byte ordering. The default byte ordering is Motorola-type. To change the byte ordering, one must edit the file sprocdef.h, or use the #define INTEL statement or the define switch on the C compiler. To edit the file sprocdef.h, comment out the lines relating to Motorola-type byte ordering, and uncomment the lines that provide support for Intel-type byte ordering.

SMI provides three basic functions required for the microprocessor application to load the SPROC chip and start signal processing design execution: sproc_load, sproc_reset, and sproc_start.

The sproc_load function downloads the signal processing design onto the target SPROC chip. It writes the chip's code, control, and data space with data from the block file. The sproc_load function has the form: sproc_load(sproc_id, block) where sproc_id is the name of the data structure created by the symbol translator (i.e., the base name of the input symbol file), and block is the block variable declared in the SPROC configuration file. The block variable has the form mydesign_block.

The sproc_reset function issues a software reset to the target SPROC chip. The sproc_reset function has the form: sproc_reset (sproc_id) where sproc_id is the name of the data structure created by the symbol translator (i.e., the base name of the input symbol file).

The sproc_start function initiates execution of the signal processing design loaded on the SPROC chip. The sproc_start function has the form sproc_start (sproc_id) where sproc_id is the name of the data structure created by the symbol translator (i.e., the base name of the input symbol file).

E.10 Accessing SPROC Chip Memory Values

In the microprocessor application, one can read and write the SPROC chip memory value for any node or parameter whose symbol is visible to the microprocessor. However, there are several issues one must consider when determining how to incorporate access to the available SPROC chip memory values into the application. First, most values in SPROC chip memory locations are driven by the activity of the chip's general signal processors (GSPs), at signal processing speeds. Memory values are modified at speeds much higher than the relatively slow speed of the interface to the values provided by the microprocessor bus. Second, some values are dynamic and change during execution of the particular cell that contains them. For example, the coefficients of adaptive filters are modified by the filter algorithm defined for the cell.

Given the issues noted above, reading SPROC chip memory values is less risky than writing values. However, because of the slow microprocessor interface speed, microprocessor reads of SPROC chip data can be problematic. Any SPROC chip memory value read by the microprocessor may be obsolete by the time the microprocessor obtains it due to the relatively slow speed of the microprocessor interface. In addition, consecutive microprocessor reads of SPROC chip memory addresses will obtain values that were computed at different times, but not necessarily consecutively. Other values may have been written by the GSPs between microprocessor read accesses. To ensure obtaining consecutively computed values for use by the microprocessor, a sink cell is used to collect values at the signal processing rate.

Writing values from the microprocessor presents specific problems. As noted above, the values of many parameters are modified by the GSPs or by the cells that contain them as the signal processing design executes. Other parameters, like the gain of an amplifier, are usually defined on the signal processing block diagram and their values generally remain constant during design execution. Depending upon the specific signal processing design and SPROC chip memory address, a destination address written by the microprocessor may be overwritten by a GSP during design execution if the microprocessor write is not coordinated with the signal processing activity in the design. One way to ensure that values written by the microprocessor will not be overwritten before they are used in the signal processing design is to use a source cell with reset. This cell allows the microprocessor to safely write into the cell's in vector, which cannot be written by any GSP, then write to the cell's reset line to pump out the values.

Writing a set of new filter coefficient parameters for a filter cell presents a difficult problem. Filter response may become unstable as the values are slowly changed from the old stable set to a new stable set. A workaround solution to allow filter coefficient changing is to instantiate two filters in the signal processing design and use a comparator cell functioning as a multiplexor to direct signal flow through one filter or the other. The microprocessor can change the coefficient set in the non-executing filter then switch the signal flow to that filter without producing an unstable filter response. This approach, however, results in "over allocation" of GSP resources. Resource requirements are calculated based on the existence of both filters, because the SPROCbuild utility has no information on the actual runtime signal flow.

F. Low Frequency Impedance Analyzer Example

Turning to FIG. 11, a block diagram is seen of a low frequency impedance analyzer. The analyzer includes several multipliers 2201, 2203, 2205, 2207, 2209, 2211, two scalers, 2214, 2216, two integrators 2220, 2222, two hard limiters 2224, 2226, two full wave rectifiers 2230, 2232, two filters 2234, 2236, two amplifiers 2238, 2240, two summers 2242, 2244, three arrays (sink blocks) 2246, 2248, 2250, an oscillator 2252, a serial input 2253, two serial outputs 2254, 2255 and two microprocessor software interface output cells 2256, 2258, and one microprocessor interface input cell 2260. Each block has a library name (e.g., SCALER, MULT, SUM2, FILER, etc.), an instance name (e.g., SCALER1, MULT2, etc.), and at least one terminal, and many of the blocks include parameters (e.g., shift =, upper =, spec =, freq =, etc.). The wires between terminals of different blocks carry data sample values (as no virtual wires are shown in FIG. 11). The serial input 2253 receives data from external the SPROC at a high frequency sample data rate, and the data is processed in real time in accord with the block diagram. The SPROC outputs two values external to the SPROC and microprocessor (i.e., out the serial ports) as a result of the SPROC processing. Information to be provided to or received from the microprocessor is sent or received via the microprocessor software interface cells 2256, 2258, and 2260. In particular, when the microprocessor writes to the location of cell 2260, cell 2260 causes the arrays 2246, 2248 to collect data and to provide a signal to microprocessor software interface output cells 2256 and 2258 when filled.

With the block diagram so provided on an OrCad graphic interface, and in accord with the above description, after translation by the MakeSDL file, the scheduler/compiler provides a program file (yhpdual.spp) and a data file (yhpdual.spd) for the SPROC, and a symbol file (yhpdual.sps) for the symbol translator and microprocessor and for the SPROCdrive interface. The program, data, and symbol files are attached to the disclosure of U.S. Pat. No. 5,287,511 as Appendices F, G, and H and incorporated herein by reference. In addition, the yhpdual.spp and yhpdual.spd files are processed by the MakeLoad program which generates the yhpdual.blk file which is attached to the disclosure of U.S. Pat. No. 5,287,511 as Appendix I incorporated herein by reference.

In order to completely implement the low frequency impedance analyzer such that it may be accessed by the microprocessor, the microprocessor is provided with C code. An example of C code (Maintest.C) for this purpose is attached hereto as Appendix J. Of course, similar code could be generated in an automatic fashion if an automatic microprocessor code generator were to be utilized. As provided, the C code attached to the disclosure of U.S. Pat. No. 5,287,511 as Appendix J calls yhpdual.c and yhpdual.h which are the translated files generated by the symbol translator from the yhpdual.spp file generated by the SPROC scheduler/compiler. Attached to the disclosure of U.S. Pat. No. 5,287,511 as Appendices K and L are the yhpdual.h and yhpdual.c files. Thus, the Maintest.C as well as the yhpdual.h and hypdual.c files are provided in a format which can be compiled by the microprocessor compiler.

There have been described and illustrated herein architectures and methods for dividing processing tasks into tasks for a programmable real time signal processor and tasks for a decision-making microprocessor interfacing with the real time signal processor. While particular embodiments of the invention have been described, it is not intended that the invention be limited thereto, as it is intended that the invention be as broad in scope as the art will allow and that the specification be read likewise. Thus, while particular hardware and software have been described, it will be appreciated that the hardware and software are by way of example and not by way of limitation. In particular, while a 68000 microprocessor and C compiler for the 68000 microprocessor have been described, other processors (i.e., not only "microprocessors"), and/or other types of code (e.g., FORTRAN, PASCAL, etc.) could be utilized. All that is required is that the symbol table code (.sps) generated by the SPROClab development system be in a format for compilation by the processor compiler, and that, where provided, the boot file (.blk) be in a format for compilation by the processor compiler or in a format for storage by the processor. Similarly, while a particular real time signal processor (the SPROC) has been described, it will be appreciated that other similar type signal processors can be utilized provided that the signal processor is directed to signal processing rather than logic processing; i.e., the signal processor should have a non-interrupt structure where data flow is through central memory. Further, while a system which provides the realization of a high level circuit in a silicon chip from simply a sketch on a graphic user interface has been described for at least the real time signal processor, it will be appreciated that the text editor could be used to replace the graphic entry, and that while the system would not be as convenient, the graphic entry is not absolutely required. Similarly, the text editor could be eliminated and the system could work only from the graphic entry interface. Other readily evident changes include: an expanded or a different cell library; different graphic user interfaces; the provision of a scheduler/compiler for the SPROC which is directly compatible with the graphic user interface (rather than using a translator such as MakeSDL); and the provision of different software packages. It will therefore be appreciated by those skilled in the art that yet other modifications could be made to the provided invention without deviating from its spirit and scope as so claimed.

We claim:

1. Apparatus for use in linking the object code of a host processor with memory locations in a memory of a programmable signal processor to permit the host processor to partially control the programmable signal processor, where the object codes of the host processor and the signal processor are produced by separate compilation, said apparatus comprising:

a) means for symbolically describing a processing task for said signal processor including means for symbolically indicating input to said processing task by said host processor; and b) means for producing by compilation signal processor object code representing said processing task for said signal processor, said means for producing by compilation being coupled to said means for symbolically describing and including means for producing a correspondence table in a format usable by a host processor code compiler, said correspondence table including a list of memory addresses in said programmable signal processor memory to be written to by said host processor in order to partially control said programmable signal processor.

2. Apparatus according to claim 1, wherein:

said means for symbolically describing includes a plurality of symbolic objects representing steps in said processing task and means for defining connections between symbolic objects, at least one of said symbolic objects indicating input by said host processor.

3. Apparatus according to claim 2, wherein:

said means for producing by compilation signal processor object code includes means for translating said symbolic objects and said connections between symbolic objects into object code for said signal processor, said object code being loaded into said signal processor memory, a portion of said code representing input by said host processor.

4. Apparatus according to claim 1, wherein:

said means for symbolically describing further includes means for indicating output from said processing task to said host processor; and said correspondence table further includes a list of memory addresses in said programmable signal processor memory to be read by said host processor in order to partially control said programmable signal processor.

5. Apparatus according to claim 1, wherein:

said processing task includes at least one function having a parameter and said input by said host processor supplies a value for said parameter.

6. Apparatus for defining host processor access to tasks of a programmable signal processor, signal processor having a memory, wherein programs for said signal processor and said host processor are separately compiled, said apparatus comprising:

a) high level programming means for defining said tasks for said signal processor as a plurality of functional blocks, each said functional block comprising at least one aspect selected from the group of aspects consisting of a parameter, a function, an input, and an output, said high level programming means including means for identifying at least one of said functional block aspects of at least one of said functional blocks to be accessed by said host processor;

b) signal processor program compiler means coupled to said high level programming means for generating program code implementing said tasks, and for generating a list of memory locations of said code implementing said functional block aspects identified as accessible by said host processor.

7. Apparatus according to claim 6, wherein:

access by said host processor is selected from the group consisting of reading a parameter value, writing a parameter value, reading a function definition, writing a function definition, reading an output value, reading an input value, writing an output value and writing an input value.

8. Apparatus according to claim 7, wherein:

one of said functional block aspects is read by said host processor and another one of said functional block aspects is written by said host processor.

* * * * *